United States Patent
Mizohata et al.

(10) Patent No.: US 6,958,113 B2
(45) Date of Patent: Oct. 25, 2005

(54) PLATING APPARATUS AND PLATING METHOD

(75) Inventors: Yasuhiro Mizohata, Kyoto (JP); Takeshi Yane, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 96 days.

(21) Appl. No.: 10/347,770

(22) Filed: Jan. 17, 2003

(65) Prior Publication Data

US 2004/0118676 A1 Jun. 24, 2004

(30) Foreign Application Priority Data

Dec. 19, 2002 (JP) ........................................ 2002-368581

(51) Int. Cl.[7] ............................................. C25D 17/00
(52) U.S. Cl. .................... 204/224 R; 204/232
(58) Field of Search ................................ 204/198, 232, 204/212, 224 R

(56) References Cited

U.S. PATENT DOCUMENTS

| | | | | |
|---|---|---|---|---|
| 4,132,605 A | | 1/1979 | Tench et al. ................. | 204/1 T |
| 4,326,940 A | * | 4/1982 | Eckles et al. ................ | 204/232 |
| 4,605,626 A | * | 8/1986 | Beck ...................... | 204/403.06 |
| 4,692,346 A | | 9/1987 | McBride et al. ............... | 427/8 |
| 4,917,774 A | * | 4/1990 | Fisher ........................ | 205/787 |
| 5,192,403 A | | 3/1993 | Chang et al. ............ | 204/153.1 |
| 5,192,509 A | * | 3/1993 | Surjaatmadja et al. ........ | 422/75 |
| 5,368,715 A | * | 11/1994 | Hurley et al. ................. | 205/82 |
| 6,254,760 B1 | | 7/2001 | Shen et al. .................. | 205/335 |
| 6,267,853 B1 | * | 7/2001 | Dordi et al. ................. | 204/232 |
| 6,270,635 B1 | * | 8/2001 | Woo .......................... | 204/237 |
| 6,350,362 B1 | * | 2/2002 | Geisler et al. ............. | 205/101 |
| 6,365,033 B1 | * | 4/2002 | Graham et al. ............. | 205/775 |
| 6,551,488 B1 | * | 4/2003 | Hey et al. ................... | 205/157 |
| 6,558,518 B1 | * | 5/2003 | Sendai et al. ........... | 204/224 R |
| 6,572,753 B2 | * | 6/2003 | Chalyt et al. ................. | 205/81 |
| 6,592,736 B2 | * | 7/2003 | Fulton et al. ................. | 205/81 |
| 6,627,066 B1 | | 9/2003 | Isayama et al. | |
| 2004/0016644 A1 | | 1/2004 | Isayama et al. | |

FOREIGN PATENT DOCUMENTS

| | | |
|---|---|---|
| JP | 5214594 | 8/1993 |
| JP | 820417 | 3/1996 |
| TW | 457544 A | 10/2001 |

* cited by examiner

*Primary Examiner*—Matthew Smith
*Assistant Examiner*—Lex H. Malsawma
(74) *Attorney, Agent, or Firm*—Ostrolenk, Faber, Gerb & Soffen, LLP

(57) ABSTRACT

A plating apparatus for plating a substrate. The apparatus is provided with a plating unit, a substrate cleaning unit, a substrate transport mechanism, a post-treatment agent supplying section, a minor constituent managing section for managing minor constituents (an accelerator, a retarder and chlorine) of a plating liquid being used in the plating unit, an enclosure which houses therein a substrate treating section including the plating unit, the cleaning unit and the substrate transport mechanism, and a system controller for controlling the entire apparatus.

23 Claims, 36 Drawing Sheets

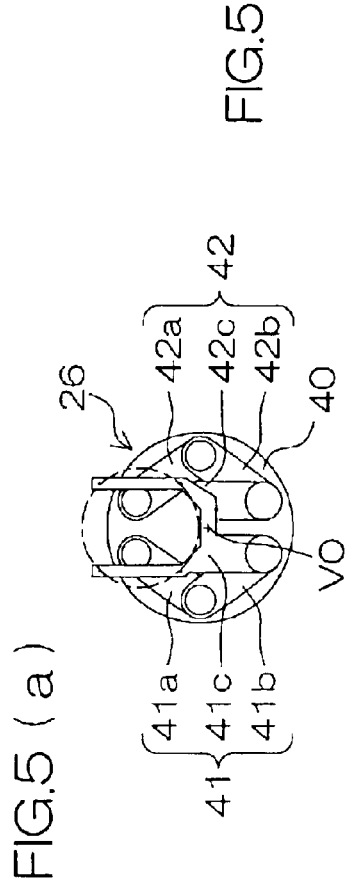
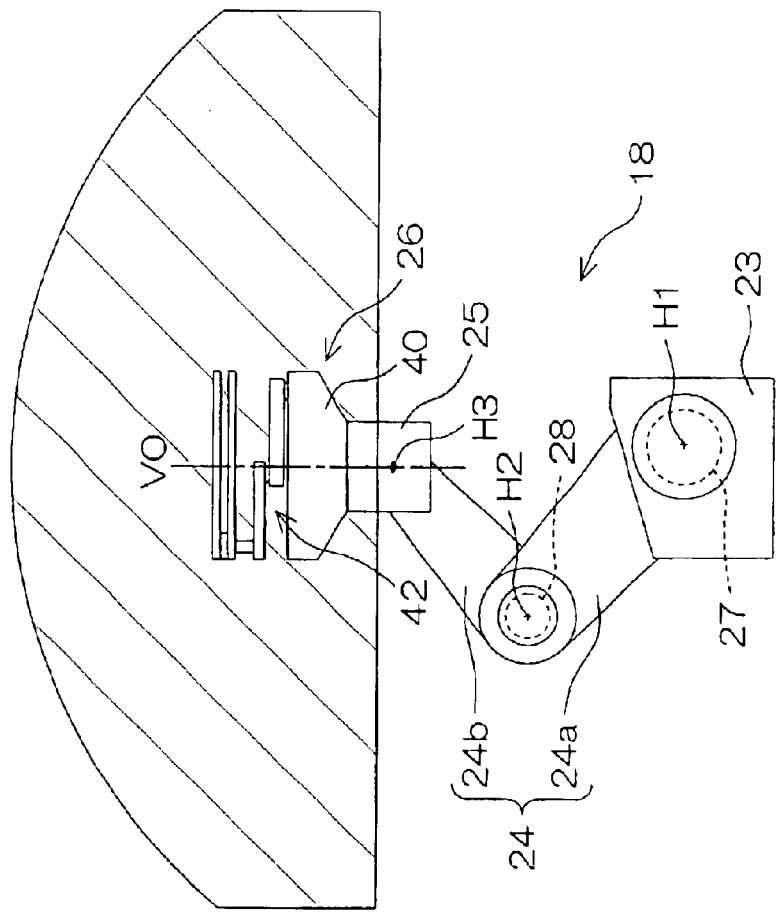
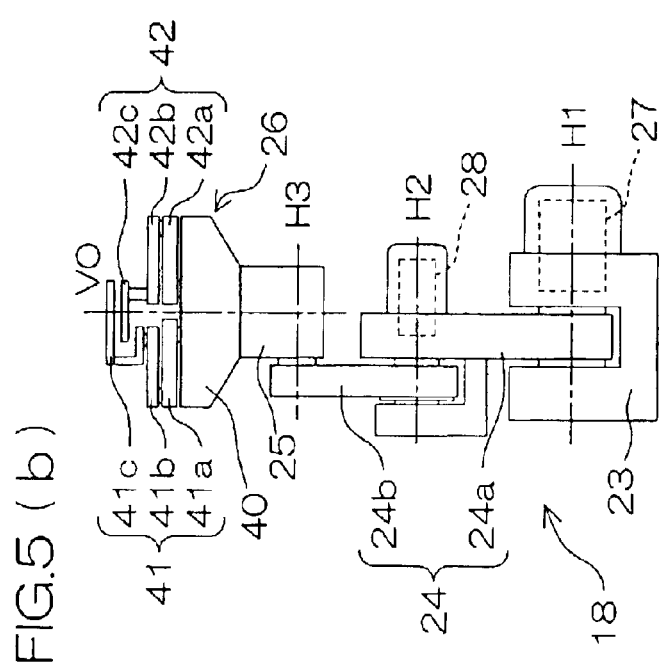
FIG.5 (a)
FIG.5 (b)
FIG.5 (c)

PLATING APPARATUS AND PLATING METHOD

BACKGROUND OF THE INVENTION

1. Field of the Invention

The present invention relates to a plating apparatus and a plating method for plating a substrate such as a semiconductor wafer with copper.

2. Description of Related Art

In the production of a semiconductor device, a plating process is often performed for plating one surface of a semiconductor wafer (hereinafter referred to simply as "wafer"). Plating apparatuses for the plating of the wafer are required to perform complicated process steps and to provide a high-quality metal film by the plating. Since the composition of a plating liquid changes during repetition of the plating process, the plating liquid should periodically be analyzed and adjusted so as to be kept in a predetermined composition on the basis of the results of the analysis. This requires a time-consuming and troublesome operation.

The plating liquid contains minor constituents such as a plating accelerating additive, a plating retarding additive, and chlorine which functions to retain the additives on the surface of the wafer. These minor constituents are consumed by the plating. Therefore, the plating process cannot properly be performed unless the minor constituents are added to the plating liquid so as to be kept at proper concentration levels.

However, none of the conventional plating apparatuses are satisfactory in the quality of a film formed by the plating, operability, productivity and the like. Particularly, the conventional plating apparatuses cannot easily and properly manage the minor constituents of the plating liquid, failing to properly perform the plating process.

SUMMARY OF THE INVENTION

It is an object of the present invention to provide a plating apparatus which is capable of properly performing a plating process.

It is another object of the present invention to provide a plating apparatus which features easier operation.

It is further another object of the present invention to provide a plating apparatus which features higher productivity.

It is still another object of the present invention to provide a plating method which is capable of properly performing a plating process.

It is further another object of the present invention to provide a plating method which features easier operation.

It is still another object of the present invention to provide a plating method which features higher productivity.

A plating apparatus according to the present invention is adapted to plate a substrate. The apparatus comprises: a cassette stage for receiving thereon a cassette which is capable of accommodating a substrate to be treated; a plating unit; a cleaning unit for cleaning the substrate; a substrate transport mechanism for transporting the substrate between the cassette placed on the cassette stage, the plating unit and the cleaning unit; a post-treatment agent supplying section for supplying a post-treatment agent to the cleaning unit; a minor constituent managing section having an analyzing section for quantitatively analyzing a plating accelerating additive, a plating retarding additive and chlorine in a plating liquid being used in the plating unit; an enclosure which houses a substrate treating section including the plating unit, the cleaning unit and the substrate transport mechanism; and a system controller for controlling the entire apparatus.

The plating unit comprises a cathode ring having a cathode to be brought into contact with the substrate and rotatable together with the substrate kept in contact with the cathode, and a plating cup having an anode disposed therein and capable of containing the plating liquid which contains the plating accelerating additive, the plating retarding additive and chlorine as minor constituents thereof.

The minor constituent managing section comprises a minor constituent management controller for controlling the minor constituent managing section. The analyzing section comprises an analyzing cup capable of containing a part of the plating liquid to be analyzed, a plurality of reagent supply nozzles for supplying analytic liquid reagents into the analyzing cup, a reference electrode and a silver/silver chloride electrode for titrimetric analysis, and a rotary electrode, a counter electrode and a reference electrode for a CVS analysis or a CPVS analysis.

According to the present invention, the plating process and the cleaning process can be performed by the plating unit and the cleaning unit, respectively, in the single plating apparatus. The cassette placed on the cassette stage can accommodate an untreated substrate as well as a substrate subjected to the plating process and the cleaning process.

Under the control of the system controller, the untreated substrate is unloaded from the cassette and transported, for example, to the plating unit and then to the cleaning unit by the substrate transport mechanism so as to be automatically subjected to the plating process and the cleaning process in sequence, and loaded again into the cassette.

The plating apparatus may further comprise a bevel etching unit for etching (bevel-etching) a peripheral edge of the substrate. In this case, the substrate can automatically sequentially be subjected, for example, to the plating process, a bevel etching process and the cleaning process. An etching liquid to be used in the bevel etching unit is contained in and supplied from the post-treatment agent supplying section.

Since the substrate treating section is housed in the enclosure, substrate treating processes including the plating process and the cleaning process can be performed in a clean atmosphere isolated from an external environment. The enclosure may be constructed so that outside air is introduced through a filter for removal of contaminants therefrom.

During repetitive use of the plating liquid in the plating unit, the concentrations of the minor constituents in the plating liquid change to be reduced below predetermined concentration levels (concentration ranges). According to the present invention, the plating accelerating additive (hereinafter referred to simply as "accelerator"), the plating retarding additive (hereinafter referred to simply as "retarder") and chlorine contained as the minor constituents in the plating liquid can quantitatively be analyzed by the minor constituent managing section.

Thus, the concentrations of the accelerator, the retarder and chlorine in the plating liquid can be determined, so that an operator can adjust the accelerator, retarder and chlorine concentrations of the plating liquid at the predetermined concentration levels by adding proper amounts of the accelerator, the retarder and chlorine to the plating liquid being used in the substrate treating section. Therefore, the plating apparatus can easily and properly perform the plating process on the substrate by employing the plating liquid containing the minor constituents at the predetermined concentration levels.

In the analyzing section of the minor constituent managing section, the reference electrode and the silver/silver chloride (Ag/AgCl) electrode for the titrimetric analysis, and the rotary electrode, the counter electrode and the reference electrode for the CVS (cyclic voltammetric stripping) analysis or the CPVS (cyclic pulse voltammetric stripping) analysis are provided in the single analyzing cup. Therefore, the titrimetric analysis and the CVS analysis or the CPVS analysis can be performed in the single analyzing cup.

The plating liquid to be analyzed is contained in the analyzing cup, and subjected to the CVS analysis or the CPVS analysis with the use of the rotary electrode, the counter electrode and the reference electrode. A common reference electrode may be used as the reference electrode for the titrimetric analysis and as the reference electrode for the CVS analysis or the CPVS analysis.

More specifically, an electric current flowing between the counter electrode and the rotary electrode is controlled so that a voltage between the rotary electrode (action electrode) and the reference electrode immersed in the plating liquid is equalized with a sweep voltage (command voltage) specified by the minor constituent management controller in the CVS analysis or the CPVS analysis. The command voltage is swept so as to fluctuate in a predetermined cycle. Thus, deposition and removal (stripping) of copper with respect to the action electrode cyclically occur. An electric current flowing through the action electrode when copper is stripped from the action electrode has a certain correlation with the concentrations of the accelerator and the retarder in the plating liquid. Therefore, the accelerator concentration and the retarder concentration can be determined by monitoring the electric current flowing through the action electrode.

The rotary electrode is composed of platinum (Pt) and attached to an insulative support rod as exposed at a distal end of the support rod. The rotary electrode is rotatable about the axis of the support rod together with the support rod. In the CVS analysis or the CPVS analysis, the accelerator and the retarder can be supplied as reagents from the reagent supply nozzles.

For the titrimetric analysis of chlorine, the plating liquid to be analyzed is contained in the analyzing cup, and a potential difference between the reference electrode and the silver/silver chloride electrode immersed in the plating liquid is measured while a silver nitrate aqueous solution is added dropwise to the plating liquid from the reagent supply nozzle. At this time, the support rod supporting the rotary electrode is rotated for stirring the plating liquid being analyzed.

The apparatus preferably further comprises a vertical mechanism for moving up and down the silver/silver chloride electrode between the inside and the outside of the analyzing cup.

During the titrimetric analysis of chlorine with the silver nitrate aqueous solution, silver chloride precipitates in the plating liquid being analyzed. Therefore, the silver chloride precipitate should be removed for cleaning the analyzing cup after the titrimetric analysis of chlorine. The removal of the silver chloride precipitate can be achieved, for example, by cleaning the cup with a cleaning liquid such as a sodium thiosulfate aqueous solution which is capable of dissolving silver chloride. Unfortunately, the silver/silver chloride electrode is also likely to be dissolved by the cleaning liquid capable of dissolving silver chloride.

With the aforesaid arrangement, however, the silver/silver chloride electrode can be moved out of the analyzing cup by the vertical mechanism when the analyzing cup is cleaned after the titrimetric analysis. Thus, the silver chloride precipitate in the analyzing cup can be removed without the dissolution of the silver/silver chloride electrode.

The analyzing cup has a drain port provided in a bottom thereof. The bottom of the analyzing cup is preferably inclined downward toward the drain port.

The plating liquid and the cleaning liquid can be drained from the drain port after the completion of the analysis and after the cleaning of the analyzing cup. Since the bottom of the analyzing cup is inclined downward toward the drain port, the plating liquid and the cleaning liquid can virtually completely be drained.

At least one of the plural reagent supply nozzles preferably has an opening having an open diameter of not greater than 1 mm.

In the titrimetric analysis, it is necessary to quantitatively supply a very small amount of the plating liquid dropwise into the analyzing cup, and add a very small amount of the reagent dropwise to the plating liquid. According to the present invention, the nozzle having an open diameter of not greater than 1 mm is employed for supplying the very small amount of the reagent dropwise into the analyzing cup.

The analyzing section preferably further comprises a plurality of syringe pumps for supplying the plating liquid and the analytic reagents into the analyzing cup, and the syringe pumps are preferably each controlled via a serial bus connected to the minor constituent management controller.

This arrangement makes it possible to supply the reagents exactly in predetermined amounts by means of the syringe pumps. The plurality of syringe pumps can each be controlled via the serial bus.

The analyzing section preferably comprises a reagent container which contains each of the analytic reagents, a buffer cup adapted to be virtually sealed, a liquid surface sensor connected to the minor constituent management controller for providing information on a liquid surface level in the buffer cup, a first liquid transport pipe extending from the vicinity of a bottom of the reagent container to the buffer cup, a second liquid transport pipe extending from the vicinity of a bottom of the buffer cup to the analyzing cup, and an air exhaustion mechanism for exhausting air from the buffer cup. The minor constituent management controller preferably controls the air exhaustion mechanism to exhaust air from the buffer cup in response to a judgment made on the basis of an output signal from the liquid surface sensor that liquid is not present at a first level higher than an open end of the second liquid transport pipe in the buffer cup.

With this arrangement, the reagent is supplied from the reagent container into the buffer cup, so that the reagent can constantly be contained in not smaller than a predetermined amount in the buffer cup and supplied in a required amount into the analyzing cup from the buffer cup. When the liquid surface sensor senses that the surface level of the reagent in the buffer cup is lowered below the first level, the minor constituent management controller controls the air exhaustion mechanism to exhaust air from the buffer cup for a predetermined period.

Since the buffer cup is virtually sealed, the internal pressure of the buffer cup is reduced by exhausting air from the buffer cup. Therefore, the reagent contained in the reagent container is sucked into the buffer cup. Where a sufficient amount of the reagent is contained in the reagent container, the internal pressure of the buffer cup is reduced for the predetermined period to supply a predetermined amount of the reagent from the reagent container into the buffer cup. Thus, the surface level of the reagent in the buffer cup is raised above the first level.

Therefore, the reagent can constantly be contained in not smaller than the predetermined amount in the buffer cup even if the reagent in the reagent container is used up. Thus, the reagent contained in the reagent container can be used up without waste. Further, the reagent can be supplied exactly in the required amount into the analyzing cup without entrapment of air in the second liquid transport pipe.

The second liquid transport pipe may extend from a level lower than the first level in the buffer cup. For example, a syringe pump may be provided in the second liquid transport pipe. In this case, the reagent can be transported from the buffer cup into the analyzing cup by means of the syringe pump.

The same arrangement can be employed for containing and supplying the plural types of reagents to be used in the analyzing section.

An audible alarm generator and a display are preferably connected to the minor constituent management controller. The liquid surface sensor preferably comprises a lower limit sensor for detecting the presence or absence of the liquid at the first level in the buffer cup, and an upper limit sensor for detecting the presence or absence of the liquid at a second level higher than the first level in the buffer cup. If the liquid is not detected at the second level in the buffer cup by the upper limit sensor after air is exhausted from the buffer cup for the predetermined period by the air exhaustion mechanism, the minor constituent management controller controls the audible alarm generator to give an audible alarm, and controls the display to display a message that the reagent container is empty.

With this arrangement, the lower limit sensor is capable of detecting the presence or absence of the reagent at the first level in the buffer cup, and the upper limit sensor is capable of detecting the presence or absence of the reagent at the second level in the buffer cup. Therefore, the minor constituent management controller judges on the basis of output signals of the lower limit sensor and the upper limit sensor whether or not the surface level of the reagent is lowered below the first level in the buffer cup and whether or not the surface level of the reagent is raised above the second level in the buffer cup.

When the surface level of the reagent in the buffer cup is at the first level, the predetermined amount of the reagent is supplied into the buffer cup by exhausting air from the buffer cup by means of the air exhaustion mechanism. Thus, the surface level of the reagent is raised above the second level.

If the internal pressure of the buffer cup is reduced for the predetermined period when the reagent is not contained in a sufficient amount in the reagent container, the predetermined amount of the reagent is not supplied into the buffer cup but the reagent container becomes empty. Therefore, the surface level of the reagent in the buffer cup does not reach the second level. In this case, the minor constituent management controller controls the audible alarm generator to give an audible alarm, and controls the display to display a message that the reagent container becomes empty to call operator's attention. In this case, the operator replaces the empty reagent container with another reagent container containing a sufficient amount of the reagent.

Thus, the predetermined amount of the reagent can be supplied from the reagent container to the buffer cup, so that the surface level of the reagent in the buffer cup is not lowered below the first level. Therefore, the reagent can be supplied exactly in the required amount into the analyzing cup without entrapment of air in the second liquid transport pipe.

The analyzing section preferably comprises a sampling vessel provided in the vicinity of the analyzing cup and adapted to be virtually sealed, a sampling pipe extending between the substrate treating section and the sampling vessel, a plating liquid transport pipe extending between the sampling vessel and the analyzing cup, and an air exhaustion mechanism connected in communication with the sampling vessel for exhausting air from the sampling vessel.

With this arrangement, air is exhausted from the sampling vessel by the air exhaustion mechanism with the sampling vessel being virtually sealed, whereby the internal pressure of the sampling vessel is reduced. Thus, a pressure difference occurs between the substrate treating section and the sampling vessel, so that the plating liquid can be transported from the substrate treating section into the sampling vessel through the sampling pipe. Then, the plating liquid is supplied from the sampling vessel into the analyzing cup for the analysis.

Where the plating liquid is transported through a long pipe, air is liable to be trapped in the pipe, making it impossible to guarantee the transportation of exactly a predetermined amount of the plating liquid. The titrimetric analysis and the CVS analysis or the CPVS analysis cannot accurately be performed unless the exact amount of the plating liquid to be analyzed is known. With the aforesaid arrangement, the sampling vessel is disposed in the vicinity of the analyzing cup, so that the plating liquid transport pipe for transporting the plating liquid from the sampling vessel into the analyzing cup has a reduced length. This assuredly prevents the entrapment of the air in the analyzing section. Therefore, the plating liquid can be transported exactly in the predetermined amount into the analyzing cup, so that the analysis can accurately be performed.

The sampling pipe preferably opens into an upper portion of the sampling vessel. In this case, the minor constituent managing section preferably further comprises an air supply mechanism for supplying air into the sampling vessel.

With this arrangement, the sampling pipe opens into the upper portion of the sampling vessel, so that an end (open end) of the sampling pipe is not submerged in the plating liquid in the sampling vessel after the plating liquid is transported into the sampling vessel through the sampling pipe. After the plating liquid is sampled from the substrate treating section into the sampling vessel through the sampling pipe, air may be supplied into the sampling vessel from the air supply mechanism with the sampling vessel being virtually sealed. Thus, the internal pressure of the sampling vessel is increased, so that the plating liquid present in the sampling pipe can be forced back into the substrate treating section.

Where the plating liquid can be transported only in one way from the substrate treating section into the sampling vessel, the plating liquid remaining in the sampling pipe should be transported into the sampling vessel and then drained to be discarded prior to the next analysis of the plating liquid. Therefore, the plating liquid is wasted. According to the present invention, however, the plating liquid present in the sampling pipe is forced back into the substrate treating section so as to be used in the substrate treating section without waste.

A common air pump, for example, may be employed as the air exhaustion mechanism and as the air supply mechanism. The exhaustion of air in the sampling vessel can be achieved by connecting an exhaustion port of the air pump in communication with the sampling vessel with an air supply port of the air pump being open. Further, the air supply into the sampling vessel can be achieved by connecting the air supply port of the air pump in communication with the sampling vessel with the exhaustion port of the air pump being open.

The minor constituent management controller comprises a storage device, and is connected to the display and an input device which allows the operator to input information. The minor constituent management controller is preferably adapted to store concentration levels of the plating retarder, the plating accelerator and chlorine in the plating liquid analyzed by the analyzing section in relation to the date and time of the analysis in the storage device, and controls the display so that the concentration levels of the plating retarder, the plating accelerator and chlorine stored in the storage device are displayed on the display in a chronological order in response to a command inputted via the input device by the operator.

With this arrangement, the concentration levels of the accelerator, the retarder and chlorine obtained through the analysis can be displayed in the chronological order, so that the operator can estimate the consumption rates of these minor constituents. When the concentration of any of these minor constituents is reduced below a predetermined level, the minor constituent can immediately be added to the plating liquid.

The relationship between the concentration levels of the accelerator, the retarder and chlorine obtained through the analysis and the date of the analysis may be displayed in a table form or in a graph form. All the concentration levels of the accelerator, the retarder and chlorine may be displayed at a time or, alternatively, any one or two of the concentration levels of the accelerator, the retarder and chlorine may be displayed in response to a command inputted via the input device by the operator.

The concentration levels and the like may be printed out by a printer rather than displayed on the display.

The display is preferably connected to the minor constituent management controller. The minor constituent management controller is preferably adapted to display a graph indicative of a relationship of the amount of the reagent supplied dropwise into the analyzing cup versus the potential difference between the reference electrode and the silver/silver chloride electrode in the titrimetric analysis on the display.

With this arrangement, the progress of the titrimetric analysis can visually be confirmed.

The minor constituent management controller and the system controller are connected to each other via a serial line. The system controller is adapted to acquire information on the total amount of the plating liquid being used in the substrate treating section. The minor constituent management controller is adapted to acquire the information on the total amount of the plating liquid from the system controller via the serial line. Further, the minor constituent management controller is preferably adapted to determine the amounts of a replenishment liquid containing the plating retarder, a replenishment liquid containing the plating accelerator and a replenishment liquid containing chlorine to be added to the plating liquid on the basis of the information on the total amount of the plating liquid and the concentration levels of the plating retarder, the plating accelerator and chlorine obtained through the analysis by the analyzing section, so that the concentrations of the plating retarder, the plating accelerator and chlorine in the plating liquid in the substrate treating section are adjusted to the predetermined concentration levels.

With this arrangement, the amounts of the accelerator, the retarder and chlorine to be added to the plating liquid can automatically be determined so as to adjust the concentrations of the accelerator, the retarder and chlorine to the predetermined concentration levels. Therefore, the plating apparatus can more easily manage the minor constituents of the plating liquid, whereby the plating process can more easily be performed with the use of the plating liquid adjusted in a proper composition.

The minor constituent managing section preferably further comprises a replenishment section including a preparation vessel adapted to be virtually sealed, a replenishment pipe extending from the vicinity of a bottom of the preparation vessel to the substrate treating section, a pressure increasing/reducing mechanism for increasing and reducing the internal pressure of the preparation vessel, and a replenishment liquid supply mechanism for supplying the plating accelerator replenishment liquid, the plating retarder replenishment liquid and the chlorine replenishment liquid in replenishment amounts determined by the minor constituent management controller into the preparation vessel.

With this arrangement, the internal pressure of the preparation vessel is increase or reduced by the pressure increasing/reducing mechanism with the preparation vessel being virtually sealed. Thus, the plating liquid can be transported from the substrate treating section into the preparation vessel and vice versa through the replenishment pipe by a pressure difference between the preparation vessel and the substrate treating section. The accelerator replenishment liquid, the retarder replenishment liquid and the chlorine replenishment liquid are added to the plating liquid transported into the preparation vessel, and then the resulting plating liquid is returned into the substrate treating section from the preparation vessel. Thus, the plating liquid in the substrate treating section can be replenished with the accelerator, the retarder and chlorine.

Since these operations are all automatically performed, the plating apparatus ensures easy operability and higher productivity.

The replenishment liquids are each supplied into the preparation vessel rather than added directly to the plating liquid in the substrate treating section. In this case, the replenishment liquids can once be dissolved (or dispersed) in the plating liquid in the preparation vessel, and then the resulting plating liquid is transported to the substrate treating section. Thus, even if any of the replenishment liquids is less soluble in the plating liquid, the replenishment liquid can be dissolved (or dispersed) in the plating liquid being used in the substrate treating section in a short time.

The replenishment liquid supply mechanism is capable of controlling the replenishment amounts of the accelerator replenishment liquid, the retarder replenishment liquid and the chlorine replenishment liquid independently. The replenishment liquid supply mechanism may comprise, for example, a replenishment liquid container which contains each of the replenishment liquids, and a replenishment liquid transport pipe for transporting the replenishment liquid from the replenishment liquid container to the preparation vessel. In this case, the replenishment liquid container is provided in the vicinity of the preparation vessel, so that the length of the replenishment liquid transport pipe can be reduced. In this case, there is virtually no temperature difference between the replenishment liquid container and the preparation vessel disposed adjacent each other. Therefore, deterioration in the accuracy of the replenishment amount can be prevented which may otherwise occur due to thermal expansion and contraction of the replenishment liquid transport pipe and the replenishment liquid present in the replenishment liquid transport pipe.

The minor constituent managing section is preferably housed in a minor constituent managing section enclosure having an air outlet port. An air outlet pipe for exhausting air from the minor constituent managing section enclosure is preferably connectable to the air outlet port. In this case, the minor constituent managing section preferably further comprises an air exhaustion pressure sensor attached to the air outlet pipe for measuring an air exhaustion pressure.

With this arrangement, gas in the minor constituent managing section enclosure can be exhausted through the air outlet pipe connected to the air outlet port. In the CVS analysis or the CPVS analysis, the rotary electrode is immersed in the to-be-analyzed plating liquid contained in the analyzing cup, and rotated, for example, at a rotation speed of 2500 rpm. Therefore, the plating liquid is stirred at a high speed by the support rod for the rotary electrode, so that mist is generated. The mist is exhausted from the minor constituent managing section enclosure through the air outlet pipe so as not to remain in the minor constituent managing section enclosure.

The air exhaustion pressure sensor is employed for checking whether or not air is exhausted from the minor constituent managing section enclosure at a proper air exhaustion pressure. An output of the air exhaustion pressure sensor may be inputted to the minor constituent management controller. In this case, an audible alarm may be given under the control of the minor constituent management controller to call operator's attention when air is not properly exhausted for some reason.

The air outlet pipe is preferably adapted to exhaust air locally from a portion of the minor constituent managing section enclosure adjacent to the analyzing cup. In addition to this air outlet pipe, another air outlet pipe may be provided for exhausting air from the entire minor constituent managing section enclosure.

A plating apparatus according to another aspect of the present invention is adapted to perform a plating process on a surface of a generally round semiconductor wafer having a plurality of fine holes or grooves formed in the surface thereof and a barrier layer and a seed layer sequentially provided on the surface as covering the holes or grooves. The apparatus comprises: a cassette stage for receiving thereon a cassette which is capable of accommodating a semiconductor wafer to be treated; a plating unit; a cleaning unit for cleaning the semiconductor wafer; a wafer transport mechanism for transporting the semiconductor wafer; a post-treatment agent supplying section for post-treatment of the semiconductor wafer; a minor constituent managing section for managing minor constituents of a plating liquid; an enclosure which houses a wafer treating section including the plating unit, the cleaning unit and the wafer transport mechanism; and a system controller for controlling the entire plating apparatus.

The plating unit comprises a cathode ring having a cathode to be brought into contact with the semiconductor wafer and rotatable together with the semiconductor wafer kept in contact with the cathode, and a plating cup having an anode provided therein and capable of containing the plating liquid which comprises sulfuric acid as a supporting electrolyte, copper sulfate as a metal salt containing a target metal, and a plating accelerating additive, a plating retarding additive and chlorine as the minor constituents.

The cleaning unit comprises a cup for cleaning the semiconductor wafer therein, the cup having a drain port, a wafer holding mechanism provided in the cup for holding the semiconductor wafer, a wafer rotating mechanism for rotating the semiconductor wafer held by the wafer holding mechanism, and a deionized water supply nozzle for supplying deionized water to opposite sides of the semiconductor wafer held by the wafer holding mechanism. The cleaning unit is connected to an air exhaustion mechanism for exhausting air from the cup.

The wafer transport mechanism comprises an extendible arm for holding the semiconductor wafer generally horizontally, a vertical movement mechanism for moving up and down the arm, and a horizontal rotation mechanism for rotating the semiconductor wafer held by the arm within a generally horizontal plane.

The post-treatment agent supplying section comprises a post-treatment agent tank which contains a post-treatment agent to be used in the cleaning unit, and a tank enclosure which houses the post-treatment agent tank therein.

The minor constituent managing section comprises an analyzing section for quantitatively analyzing the plating liquid being used in the plating unit, a minor constituent managing section enclosure which houses the analyzing section, and a minor constituent management controller for controlling the entire minor constituent managing section.

The enclosure comprises a barrier wall for isolating the inside thereof from an external environment, a frame which supports the wafer treating section, and a filter provided in an upper portion thereof. The enclosure has a loading/unloading port for loading and unloading the semiconductor wafer or the cassette capable of accommodating the semiconductor wafer, a deionized water pipe introduction port through which a deionized water pipe is introduced, a compressed air pipe introduction port through which a compressed air pipe is introduced, an air outlet opening provided in a bottom of the enclosure for exhausting air from the enclosure, and an air outlet pipe connection port connected to an air outlet pipe for exhausting air from the enclosure.

The system controller comprises a plurality of printed circuit boards, a central processing unit, a storage device having a semiconductor memory and a magnetic memory and storing therein a plating apparatus control program at least partly described in a high-level language, and a serial port. The system controller is connected to a keyboard having alphanumeric keys and to a display.

The minor constituent management controller of the minor constituent managing section comprises a plurality of printed circuit boards, a central processing unit, a semiconductor memory storing therein a minor constituent analyzing program at least partly described in a high-level language for analyzing the minor constituents of the plating liquid, and a serial port. The minor constituent management controller is connected to a keyboard having alphanumeric keys and to a display.

The analyzing section comprises an analyzing cup for containing a part of the plating liquid to be analyzed, a plurality of reagent containers which respectively contain analytic reagents, a plurality of syringe pumps for quantitatively dispensing the reagents from the respective reagent containers, a plurality of reagent supply nozzles for supplying the regents quantitatively dispensed by the respective syringe pumps into the analyzing cup, a reference electrode and a counter electrode adapted to be located in the analyzing cup, a rotary electrode of platinum supported at a distal end of an insulative support rod rotatable about an axis thereof and adapted to be located in the analyzing cup, and a potentiostat for controlling an electric current flowing between the counter electrode and the rotary electrode so that a voltage between the reference electrode and the rotary electrode is equalized with a sweep voltage specified by the minor constituent management controller.

The minor constituent managing section enclosure has an air outlet port to which an air outlet pipe is attached for exhausting air from the minor constituent managing section enclosure. A vat for receiving the reagents being used in the minor constituent managing section is provided in the minor constituent managing section enclosure.

According to the present invention, a plating process and a cleaning process can respectively be performed by the plating unit and the cleaning unit in the single plating apparatus.

The cassette placed on the cassette stage can accommodate an untreated wafer as well as a wafer subjected to the plating process and the cleaning process. In the plating unit, the wafer kept in contact with the cathode is brought into contact with the plating liquid contained in the plating cup, and the cathode and the anode are energized, whereby the wafer is plated with copper.

The cleaning unit is adapted to rinse off the plating liquid adhering on the wafer with deionized water for cleaning the wafer. At this time, the wafer held by the wafer holding mechanism can evenly be cleaned by supplying deionized water to the wafer from the deionized water supply nozzle while rotating the wafer by the wafer rotating mechanism.

The cleaning unit may further comprise a cleaning liquid supply nozzle for supplying a cleaning liquid as the post-treatment agent to the wafer held by the wafer holding mechanism. In this case, the cleaning liquid is contained in the post-treatment agent supplying section and supplied to the cleaning liquid nozzle from the post-treatment agent supplying section. The plating apparatus may further comprise a bevel etching unit for etching a peripheral edge of the wafer. In this case, the post-treatment agent supplying section may be adapted to contain and supply an etching liquid.

Under the control of the system controller, the untreated wafer is unloaded from the cassette and transported, for example, to the plating unit and then to the cleaning unit by the wafer transport mechanism so as to be automatically subjected to the plating process and the cleaning process in sequence, and loaded again into the cassette.

Since the wafer treating section is housed in the enclosure, treating processes including the plating process and the cleaning process can be performed in a clean atmosphere isolated from an external environment. Air is exhausted from the enclosure through the air outlet pipe to reduce the internal pressure of the enclosure to a negative level, and outside air is introduced into the enclosure through the filter for removal of contaminants therefrom. Further, outside air is forcibly introduced into the enclosure through the filter by a fan, and air is let out of the enclosure through the air outlet opening. Thus, the down-flow of clean air occurs in the enclosure.

Deionized water to be used in the cleaning unit can be supplied from the deionized water pipe introduced through the deionized water pipe introduction port formed in the enclosure. Some of the driving mechanisms employed in the plating unit and the cleaning unit may be adapted to be pneumatically driven. Compressed air for driving the driving mechanisms is supplied from the compressed air pipe introduced through the compressed air pipe introduction port formed in the enclosure.

During repetitive use of the plating liquid for the plating process, the concentrations of the minor constituents in the plating liquid change to be reduced below predetermined concentration levels (concentration ranges). According to the present invention, the minor constituent managing section is capable of quantitatively analyzing the plating accelerator, the plating retarder and chlorine as the minor constituents.

Thus, the concentration levels of the accelerator, the retarder and chlorine in the plating liquid can be determined, so that an operator can adjust the accelerator concentration, the retarder concentration and the chlorine concentration to the predetermined concentration levels by adding proper amounts of the accelerator, the retarder and chlorine to the plating liquid being used in the wafer treating section. Therefore, the plating apparatus can easily and properly perform the plating process on the wafer by employing the plating liquid containing the minor constituents at the predetermined concentration levels.

The analyzing section provided in the minor constituent managing section performs a CVS analysis or a CPVS analysis in the following manner. First, a predetermined amount of the plating liquid to be analyzed is contained in the analyzing cup, and then the electric current flowing between the counter electrode and the rotary electrode (action electrode) energized by the potentiostat is controlled so that the voltage between the rotary electrode and the counter electrode immersed in the plating liquid is equalized with the sweep voltage (command voltage) specified by the minor constituent management controller.

The command voltage is swept so as to fluctuate in a predetermined cycle. Thus, deposition and stripping of copper with respect to the action electrode cyclically occur. An electric current flowing through the action electrode when copper is stripped from the action electrode has a certain correlation with the concentration of the accelerator or the retarder in the plating liquid. Therefore, the concentration of the accelerator or the retarder can be determined by monitoring the electric current flowing through the action electrode.

In the CVS analysis or the CPVS analysis, proper reagents are supplied into the plating liquid from the reagent supply nozzles. For the analysis of the accelerator, for example, a reagent containing the retarder is supplied from the reagent supply nozzle into the plating liquid being analyzed. Thus, the concentration of the retarder is increased for saturation of an influence of the retarder. For the analysis of the retarder, a base liquid for diluting the accelerator is supplied from the reagent supply nozzle into the plating liquid being analyzed. Thus, an influence of the accelerator is nullified.

The analyzing section may further comprise a reference electrode and a silver/silver chloride (Ag/AgCl) electrode for a titrimetric analysis. In this case, a potential difference between the reference electrode and the silver/silver chloride electrode is monitored while a silver nitrate aqueous solution is added dropwise to the plating liquid from the reagent supply nozzle for the titrimetric analysis of chlorine in the plating liquid.

Gas can be exhausted from the minor constituent managing section enclosure through the air outlet pipe connected to the air outlet port. When the CVS analysis or the CPVS analysis is performed in the analyzing section of the minor constituent managing section, the rotary electrode is immersed in the plating liquid contained in the analyzing cup for the analysis, and rotated, for example, at a rotation speed of 2500 rpm. Therefore, the plating liquid is stirred at a high speed by the support rod for the rotary electrode, so that mist is generated. The mist is exhausted from the minor constituent managing section enclosure through the air outlet pipe so as not to remain in the minor constituent managing section enclosure. An air outlet pipe dedicated to this purpose is preferably provided as extending to the vicinity of the analyzing cup.

If any of chemical agents such as the analytic reagents and the to-be-analyzed plating liquid happens to leak out, the leaked chemical agent can be received in the vat for prevention of spread of chemical contamination of the apparatus. A sensor for detecting the leakage of the chemical agents is preferably provided in the vat.

A plating method according to further another inventive aspect comprises the steps of: plating a semiconductor wafer in a wafer treating section with the use of a plating liquid containing a plating accelerating additive, a plating retarding additive and chlorine; transporting a part of the plating liquid being used in the wafer treating section into an analyzing cup; analyzing the plating liquid in the analyzing cup after the plating liquid transporting step by performing, in a given order, at least two analyzing steps selected from a first analyzing step for quantitatively analyzing the plating accelerating additive through a CVS analysis or a CPVS analysis, a second analyzing step for quantitatively analyzing the plating retarding additive through a CVS analysis or a CPVS analysis, and a third analyzing step for quantitatively analyzing chlorine through a titrimetric analysis; and replenishing the plating liquid with the plating accelerating additive, the plating retarding additive and chlorine by adding replenishment liquids respectively containing the plating accelerating additive, the plating retarding additive and chlorine in amounts determined on the basis of results of the analysis performed in the analyzing step to the plating liquid being used in the wafer treating section.

The plating liquid transporting step preferably comprises the steps of: transporting a part of the plating liquid being used in the wafer treating section to a sampling vessel provided in the vicinity of the analyzing cup; and transporting the plating liquid from the sampling vessel to the analyzing cup.

The replenishing step may comprise the steps of: supplying a part of the plating liquid being used in the wafer treating section into a preparation vessel; preliminarily supplying the replenishment liquids into the plating liquid in the preparation vessel; and transporting the resulting plating liquid from the preparation vessel to the wafer treating section after the plating liquid supplying step and the preliminary replenishment liquid supplying step.

The third analyzing step may comprise the steps of: performing the titrimetric analysis with the use of a silver/silver chloride electrode; and retracting the silver/silver chloride electrode from the analyzing cup and cleaning the analyzing cup after the titrimetric analysis step.

The foregoing and other objects, features and effects of the present invention will become more apparent from the following description of the preferred embodiments with reference to the attached drawings.

BRIEF DESCRIPTION OF THE DRAWINGS

FIGS. 5(a), 5(b) and 5(c) are diagrams for explaining the construction of a robot body;

DESCRIPTION OF THE PREFERRED EMBODIMENTS

Figure 1:
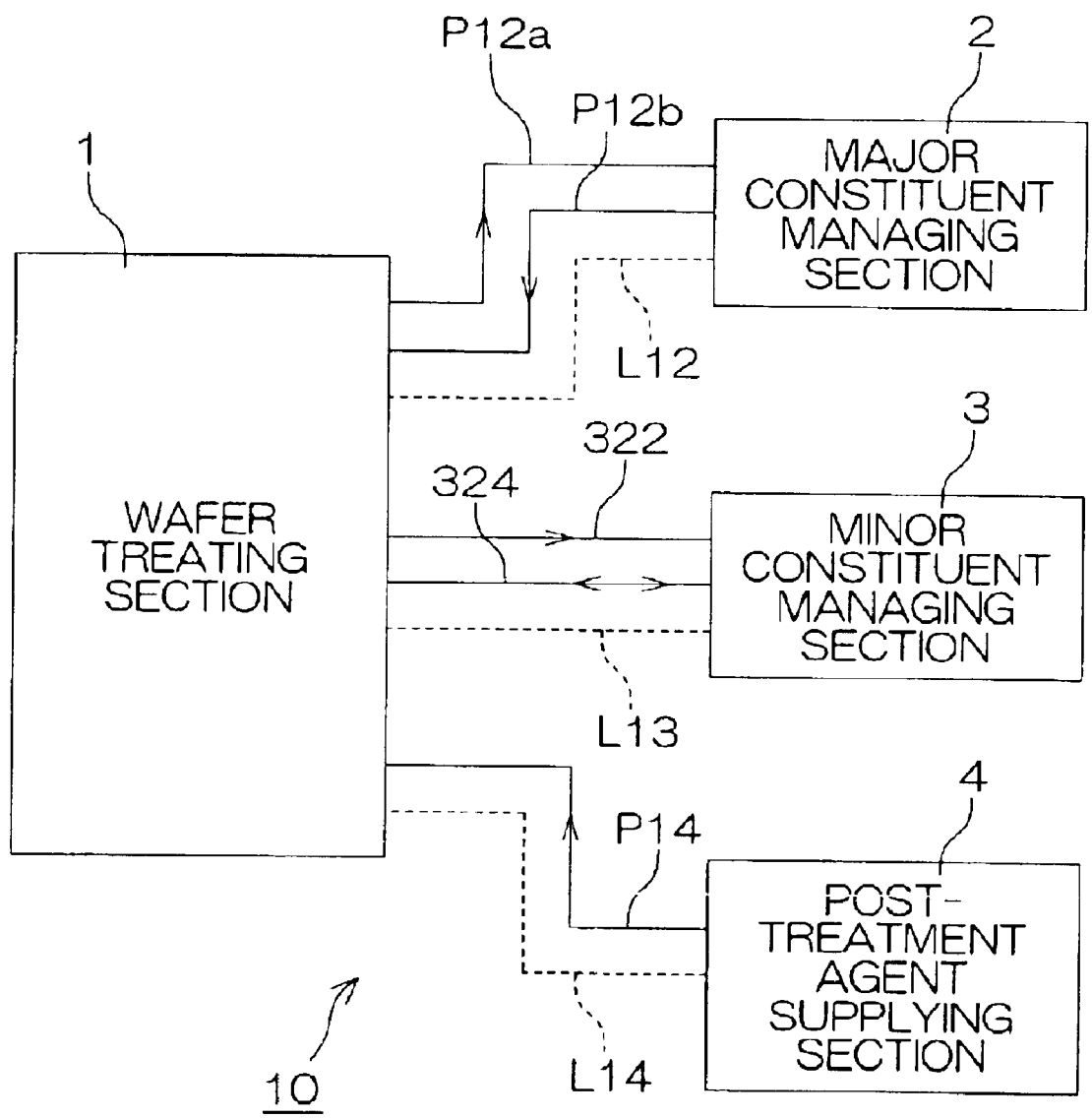
FIG. 1 is a block diagram illustrating the construction of a substrate treating apparatus according to one embodiment of the present invention.

FIG. 1 is a block diagram illustrating the construction of a plating apparatus 10 according to one embodiment of the present invention.

The plating apparatus 10 includes a wafer treating section 1 for plating a surface of a semiconductor wafer (hereinafter referred to simply as "wafer") with the use of a plating liquid and etching (bevel-etching) a peripheral edge of the wafer after the plating, a major constituent managing section 2 having a copper supply source for supplying copper ions to the plating liquid for management of the concentrations of major constituents of the plating liquid, a minor constituent managing section 3 for managing minor constituents of the plating liquid, and a post-treatment agent supplying section 4 for supplying a post-treatment agent to the wafer treating section 1 for post-treatment of the wafer after the plating. The plating apparatus 10 is disposed in a clean room.

The plating liquid for use in the wafer treating section 1 contains sulfuric acid (supporting electrolyte), copper ions (target metal), iron (oxidizing/reducing agent) and water as major constituents thereof. The plating liquid further contains a plating accelerating additive (brightener), a plating retarding additive (suppresser) and chlorine (which serves to retain these additives on a surface of the wafer) as minor constituents thereof.

Two plating liquid transport pipes P12a, P12b extend between the wafer treating section 1 and the major constituent managing section 2 for transporting the plating liquid between these sections in opposite directions. Similarly, a sampling pipe 322 and a replenishment pipe 324 extend between the wafer treating section 1 and the minor constituent managing section 3 for transporting the plating liquid between these sections in opposite directions. Further, a post-treatment agent pipe P14 extends between the wafer treating section 1 and the post-treatment agent supplying section 4 for supplying the post-treatment agent from the post-treatment agent supplying section 4 to the wafer treating section 1.

The wafer treating section 1 includes a system controller for controlling the entire plating apparatus 10. The wafer treating section 1 is connected to the major constituent managing section 2, the minor constituent managing section 3 and the post-treatment agent supplying section 4 via signal lines L12, L13 and L14, respectively. The operations of the major constituent managing section 2, the minor constituent managing section 3 and the post-treatment agent supplying section 4 are controlled by the system controller provided in the wafer treating section 1.

The plating liquid being used in the wafer treating section 1 is transported (sampled) into the minor constituent managing section 3 through the sampling pipe 322. The minor constituent managing section 3 is capable of analyzing at least one of the minor constituents through a CVS (cyclic voltammetric stripping) analysis. The minor constituent managing section 3 includes a minor constituent management controller, which is capable of calculating the amounts of the minor constituents to be added to the plating liquid in the wafer treating section 1 so as to adjust the concentrations of the minor constituents of the plating liquid within predetermined concentration ranges. Under the control of the minor constituent management controller, the minor constituents are supplied in the amounts thus calculated to the plating liquid in the wafer treating section 1 through the replenishment pipe 324.

The post-treatment agent supplying section 4 includes an agent tank containing the post-treatment agent, and an agent supply mechanism for supplying the post-treatment agent from the agent tank to the wafer treating section 1. Examples of the post-treatment agent include an etching liquid to be used for the bevel etching and a cleaning liquid.

Figure 2:
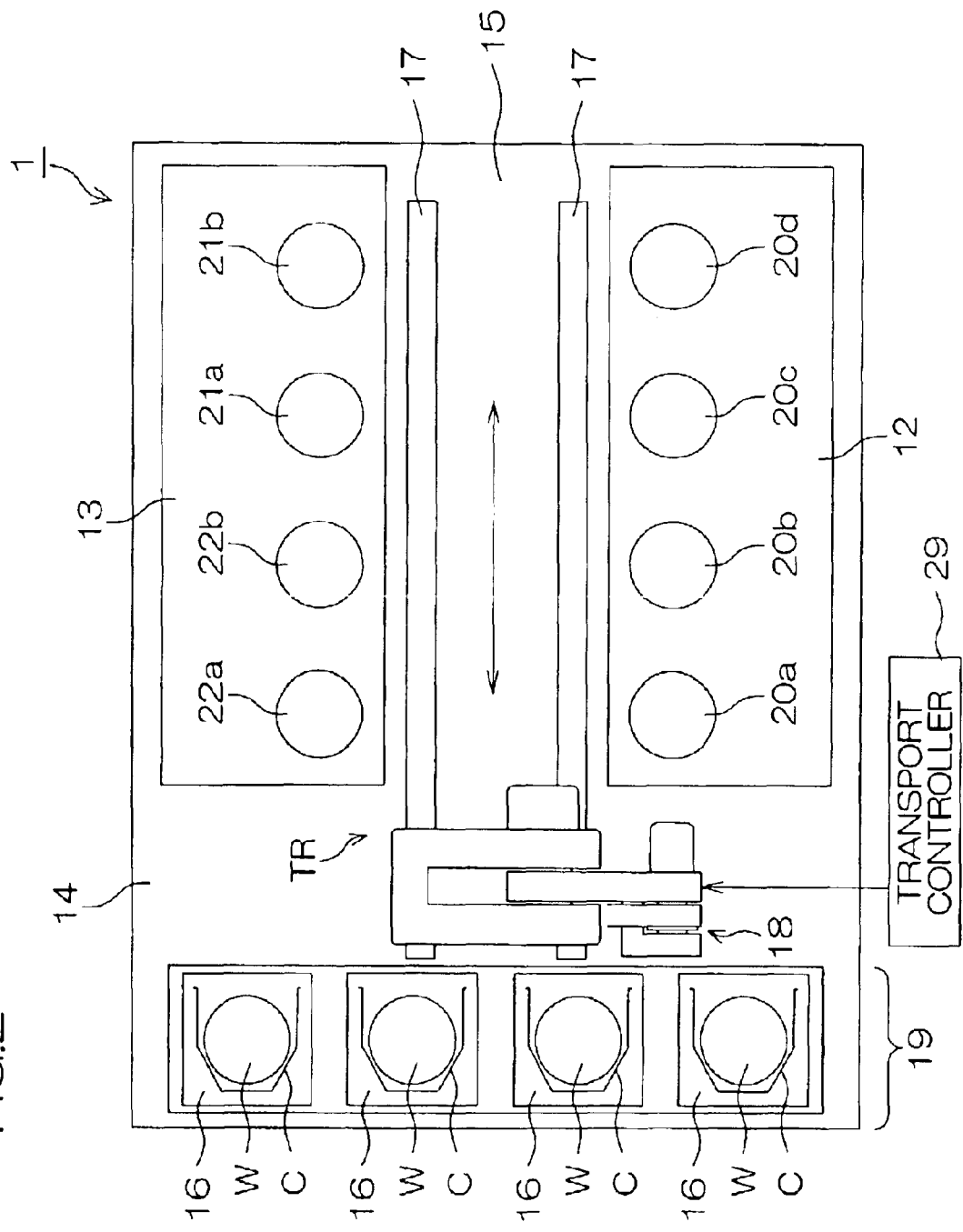
FIG. 2 is a schematic plan view of a wafer treating section.

FIG. 2 is a schematic plan view of the wafer treating section 1.

The wafer treating section 1 is adapted to perform a plating process for forming a thin copper film on the surface of the wafer W, then perform an etching process for etching the peripheral edge of the wafer W, and perform a cleaning process for cleaning the entire surfaces of the wafer W.

A wafer loading/unloading section 19 is disposed along a first transport path 14 extending linearly horizontally. In the wafer loading/unloading section 19, a plurality of cassette stages 16 (four cassette stages in this embodiment) which are each adapted to receive thereon one cassette C capable of accommodating a wafer W are arranged along the first transport path 14. The wafer W is of a generally round shape, and has a multiplicity of fine holes or grooves formed in the to-be-treated surface thereof and a barrier layer and a seed layer formed on the surface thereof.

A second linear transport path 15 is provided horizontally and perpendicularly to the first transport path 14. In this embodiment, the second transport path 15 extends from a middle portion of the first transport path 14. A plating section 12 including four plating units 20a to 20d arranged along the second transport path 15 is provided on one side of the second transport path 15. The plating units 20a to 20d are each adapted to plate the surface of the wafer W with copper.

A post-treatment section 13 including two bevel etching units 21a, 21b and two cleaning units (spin cleaning units) 22a, 22b arranged along the second transport path 15 is provided on the other side of the second transport path 15. The bevel etching units 21a, 21b are each adapted to etch the peripheral edge of the wafer W, while the cleaning units 22a, 22b are each adapted to clean opposite sides of the wafer W.

The first transport path 14 and the second transport path 15 constitute a T-shaped transport path, and a single transport robot TR is provided on the T-shaped transport path. The transport robot TR includes transport guide rails 17 disposed along the second transport path 15, and a robot body 18 movable along the transport guide rails 17. The operation of the transport robot TR is controlled by a transport controller 29.

The robot body 18 is capable of transporting the wafer W along the first transport path 14 and along the second transport path 15. Therefore, the robot body 18 can access any of the cassettes C placed on the cassette stages 16 to load and unload a wafer W, and access any of the plating units 20a to 20d, the bevel etching units 21a, 21b and the cleaning unit 22a, 22b to load and unload the wafer W.

A basic wafer transport route and a basic process sequence are as follows. First, an untreated wafer W is unloaded from one of the cassettes C, then transported to the front of one of the plating units 20a to 20d, and loaded into the plating unit 20a to 20d by the robot body 18 so as to be subjected to the plating process. In turn, the wafer W subjected to the plating process is unloaded from the plating unit 20a to 20d, and loaded into one of the bevel etching units 21a, 21b so as to be subjected to the bevel etching process.

Subsequently, the wafer W subjected to the bevel etching process is unloaded from the bevel etching unit 21a, 21b, then transported along the second transport path 15, and loaded into one of the cleaning units 22a, 22b by the robot body 18 so as to be subjected to the cleaning process.

Further, the wafer W subjected to the cleaning process is unloaded from the cleaning unit 22a, 22b and then transported along the second transport path 15 toward the first transport path 14 by the robot body 18. Upon reaching the first transport path 14, the robot body 18 starts moving along the first transport path 14 toward a cassette C placed on one of the cassette stages 16, and loads the wafer W on the cassette C.

Figure 3:
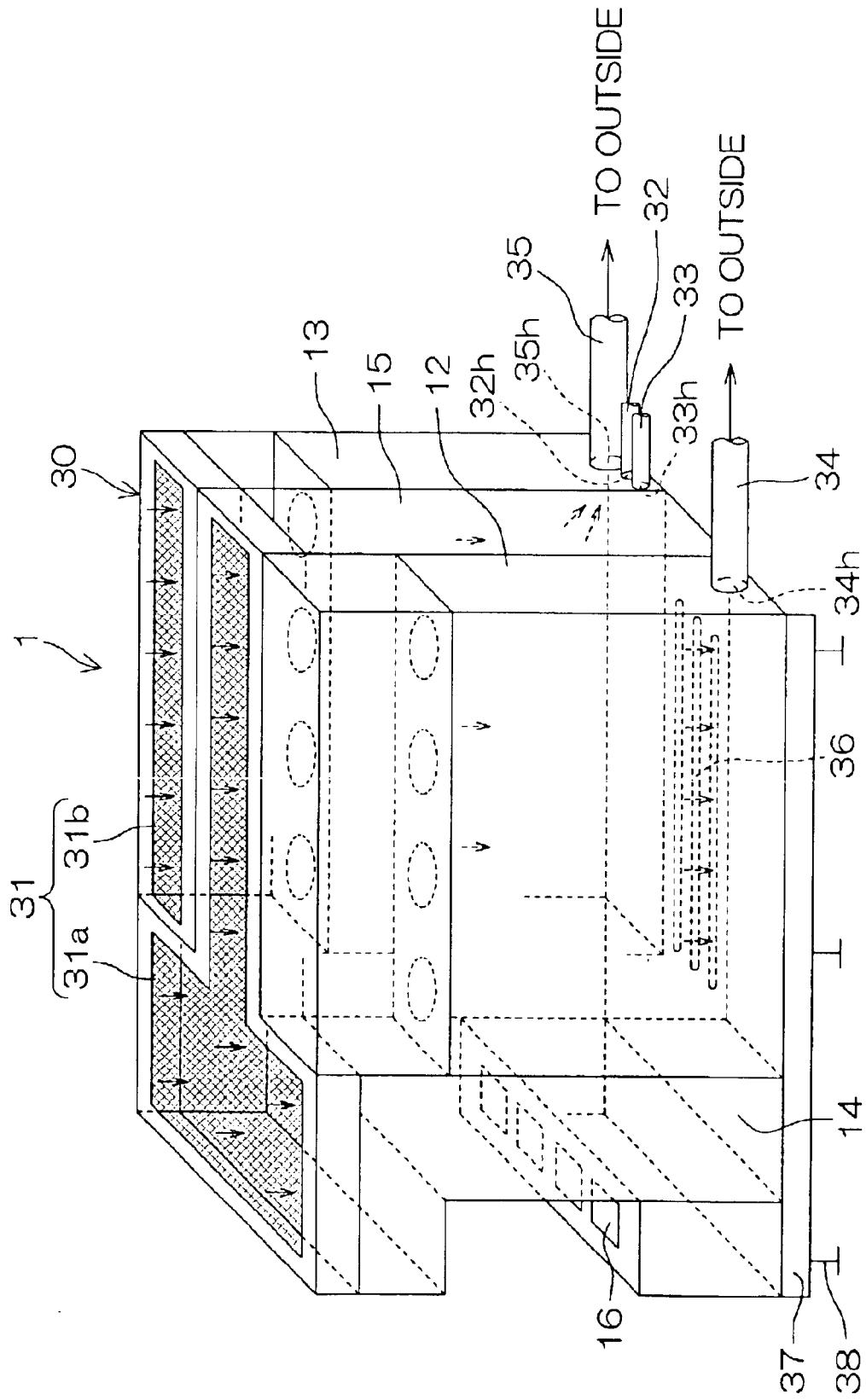
FIG. 3 is a schematic perspective view illustrating the construction of an enclosure of the wafer treating section.

FIG. 3 is a schematic perspective view illustrating the construction of an enclosure 30 of the wafer treating section 1.

The enclosure 30 has a generally rectangular box-like outer shape defined by a plurality of barrier walls (boundary walls). In the enclosure 30, partition walls are provided between the second transport path 15 and the plating section 12 and between the second transport path 15 and the post-treatment section 13. The space of the second transport path 15 is isolated from the space of the plating section 12 and from the space of the post-treatment section 13, except when the wafer W is loaded and unloaded with respect to these sections.

A filter 31 for filtering off contaminants in air is provided in a top barrier wall of the enclosure 30. The filter 31 includes a first filter 31a disposed above the cassette stages 16, the first transport path 14 and the second transport path 15, and a second filter 31b disposed above the post-treatment section 13. Fans not shown are provided above the first filter 31a for forcibly introducing external air into the enclosure 30.

A plurality of slit-like openings 36 are provided in a portion of the enclosure 30 below the second transport path 15 as extending longitudinally of the second transport path 15. Since the space of the second transport path 15 is isolated by the enclosure 30 and the internal partitions, the space of the second transport path 15 is kept at a positive pressure when air is forcibly introduced into the enclosure 30 through the first filter 31a. Therefore, internal air is exhausted from the enclosure 30 through the openings 36. Thus, air flows from the upper side toward the lower side (the down-flow of air occurs) in the space of the second transport path 15.

Since no reagent is used in the space of the second transport path 15, the air flowing through this space is not contaminated. Therefore, the air flowing through the space of the second transport path 15 is exhausted through the openings 36 around the enclosure 30.

Air outlet ports 34h, 35h are respectively provided in a lower portion of a barrier wall defining the plating section 12 and a lower portion of a barrier wall defining the post-treatment section 13 on a side of the enclosure 30 opposite from the cassette stages 16. The air outlet port 34h is connected to one end of an air outlet duct 34, while the air outlet port 35h is connected to one end of an air outlet duct 35. The other ends of the air outlet ducts 34, 35 are connected to an in-plant exhauster system line. Thus, air possibly exposed to the plating liquid and the post-treatment agent in the plating section 12 and the post-treatment section 13 can forcibly be exhausted outside the clean room.

By forcibly exhausting the air from the post-treatment section 13 through the air outlet port 35h, the internal pressure of the post-treatment section 13 is kept at a negative pressure, so that external air is sucked into the post-treatment section 13 through the second filter 31b. Thus, air flows downward in the space of the post-treatment section 13.

A deionized water pipe introduction port 32h and a compressed air pipe introduction port 33h are provided in the vicinity of the air outlet port 35h in the barrier wall formed with the air outlet port 35h. A deionized water pipe 32 and a compressed air pipe 33 for supplying deionized water and compressed air for use in the wafer treating section 1 are introduced into the wafer treating section 1 through the deionized water pipe introduction port 32h and the compressed air introduction port 33h, respectively.

A frame 37 formed by combining iron structural parts is attached to a lower peripheral edge of the enclosure 30 to support the entire wafer treating section 1. A plurality of jack bolts 38 are attached to the frame 37 as properly spaced longitudinally of the structural parts of the frame 37. The frame 37 is supported by the jack bolts 38 so as to be spaced a predetermined distance from the floor of the clean room in which the wafer treating section 1 is disposed.

Figure 4:
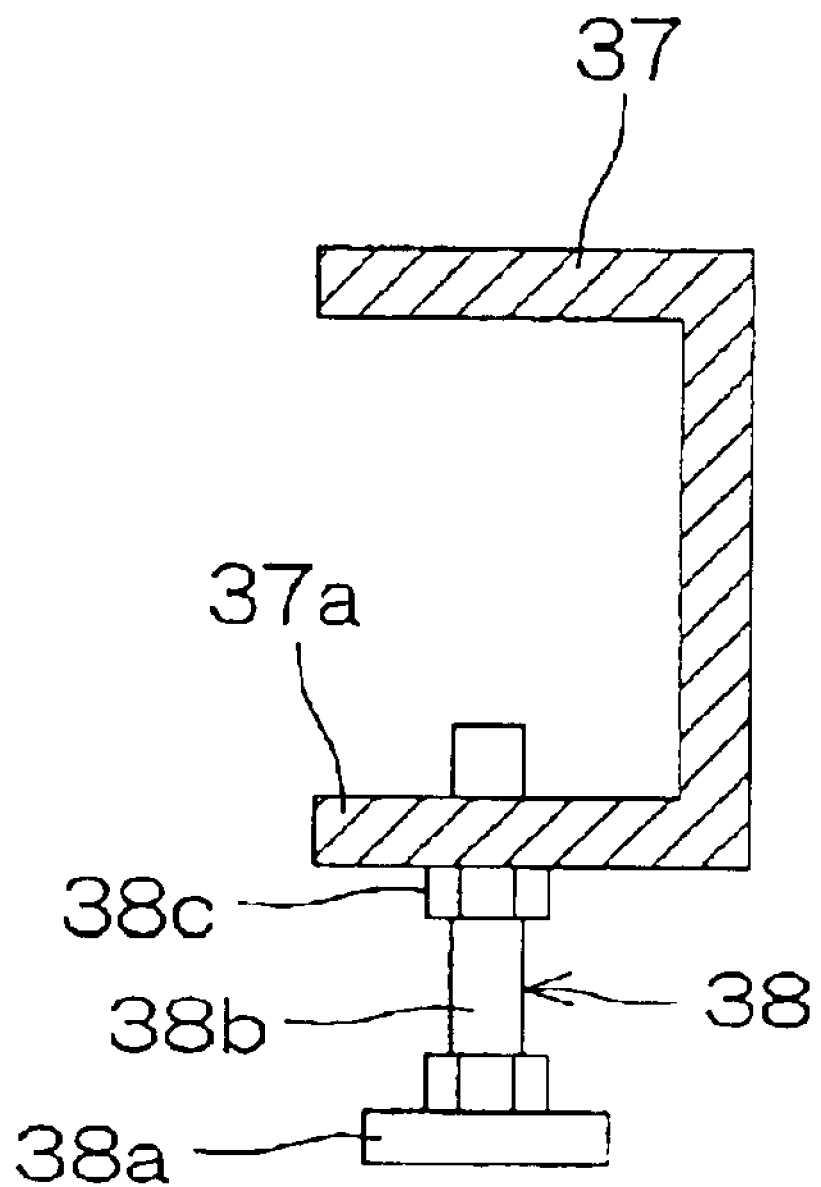
FIG. 4 is a schematic sectional view illustrating a jack bolt and a frame.

FIG. 4 is a schematic sectional view illustrating the jack bolt 38 and the frame 37.

The structural parts of the frame 37 each have a laterally open U-shaped cross section, and include two generally horizontal and parallel plate portions. A lower one of the plate portions serves as a support plate 37a which has an internal thread portion. The jack bolt 38 includes a bolt portion 38b having an external thread portion provided on its circumference, a generally round base disk 38a fixed generally perpendicularly to a lower end of the bolt portion 38b, and a lock nut 38c fitted around the bolt portion 38b.

The bolt portion 38b is engaged with the internal thread portion of the support plate 37a and extends generally vertically through the support plate 37a. The lock nut 38c is tightened toward the support plate 37a from the lower side of the support plate 37a. A distance between the base disk 38a and the support plate 37a, i.e., the height of the frame 37 from the floor of the clean room, is adjustable by variably positioning the support plate 37a with respect to the length of the bolt portion 38b.

For the adjustment of the height of the frame 37, the lock nut 38c is loosened (the lock nut 38c is rotated with respect to the bolt portion 38b so as to be moved apart from the support plate 37a), and then the base disk 38a is rotated in a proper direction. Thus, the bolt portion 38b is rotated together with the base disk 38a, so that the position of the support plate 37a with respect to the length of the bolt portion 38b is changed for the adjustment of the height of the frame 37 from the floor of the clean room. After the adjustment, the lock nut 38c is tightened toward the support plate 37a, whereby the bolt portion 38b is locked with respect to the support plate 37a.

The plurality of jack bolts 38 attached to the frame 37 have the same construction as shown in FIG. 4. Therefore, the leveling adjustment of the wafer treating section 1 can be achieved by attaching at least three jack bolts 38 to the frame 37 and adjusting the positions of the support plates 37a with respect to the lengths of the bolt portions 38b.

FIGS. 5(a), 5(b) and 5(c) are diagrams for explaining the construction of the robot body 18. Particularly, FIGS. 5(a), 5(b) and 5(c) are a schematic plan view, a schematic side view and a schematic front view, respectively, of the robot body 18.

The robot body 18 includes a base 23, a vertical articulated arm 24 attached to the base 23, a pivotal driving mechanism 25 attached to the vertical articulated arm 24, and a substrate holder 26 to be driven pivotally about a vertical pivot axis V0 by the pivotal driving mechanism 25 (only the substrate holder 26 is shown in FIG. 5(a) ).

The substrate holder 26 includes a body 40 having a flat top, and a pair of retractable arms 41, 42 provided on the flat top of the body 40. A retractable driving mechanism (not shown) for horizontally advancing and retracting the pair of retractable arms 41, 42 is incorporated in the body 40.

The retractable arms 41 and 42 respectively include first arm portions 41a and 42a, second arm portions 41b and 42b, and substrate holder hands (effecters) 41c and 42c. The body 40 has a generally round shape as seen in plan, and the first arm portions 41a, 42a are attached to a peripheral edge portion of the body 40 pivotally about vertical pivot axes thereof. The first arm portions 41a, 42a are driven pivotally about the pivot axes by the retractable driving mechanism provided in the body 40.

The retractable arms 41, 42 each constitute a so-called scholar robot, which is operative so that the second arm portion 41b, 42b is pivoted about a vertical pivot axis thereof in synchronization with the pivoting of the first arm portion 41a, 42a. Thus, the first arm portion 41a, 42a and the second arm portion 41b, 42b of the retractable arm 41, 42 are stretched and unstretched so as to advance and retract the substrate holder hand 41c, 42c.

When the retractable arms 41, 42 are in an unstretched state, the substrate holder hands 41c, 42c are kept in vertically overlapped relation (FIG. 5(a)). Therefore, the substrate holder hand 41c of the retractable arm 41 has a bent shape for prevention of interference with the substrate holder hand 42c of the retractable arm 42 (FIG. 5(b)).

The vertical articulated arm 24 includes a first arm 24a and a second arm 24b. The first arm 24a is attached to the base 23 pivotally about a horizontal pivot axis H1 at one end thereof. The second arm 24b is attached to the other end of the first arm 24a pivotally about a horizontal pivot axis H2 at one end thereof. The pivotal driving mechanism 25 is attached to the other end of the second arm 24b pivotally about a horizontal pivot axis H3. The pivot axes H1, H2 and H3 are parallel to each other.

A motor 27 for pivoting the first arm 24a is provided in the base 23, and a motor 28 for pivotally driving the second arm 24b is provided in a coupling between the first arm 24a and the second arm 24b. The motor 28 is rotatable in synchronization with the motor 27. A driving force transmission mechanism (not shown) for transmitting a driving force from the motor 28 to the pivotal driving mechanism 25 is incorporated in the second arm 24b. Thus, the pivotal driving mechanism 25 can constantly hold the substrate holder 26 in the same attitude (e.g., in such an attitude as to hold the wafer W horizontally), even if the first arm 24a and the second arm 24b are pivoted.

A motor (not shown) is incorporated in the pivotal driving mechanism 25. The pivotal driving mechanism 25 receives a driving force from this motor to pivotally drive the substrate holder 26 about the vertical pivot axis V0.

With this arrangement, the transport robot TR can move the substrate holder hands 41c, 42c horizontally and vertically within a range hatched in FIG. 5(c).

When the robot body 18 accesses the cassette C placed on the cassette stage 16 (see FIG. 2), the robot body 18 is moved to ends of the transport guide rails 17 on the side of the first transport path 14 by the transport controller 29. In this state, the substrate holder 26 is brought into opposed relation to the cassette C on the cassette stage 16 by the operation of the vertical articulated arm 24. That is, the substrate holder 26 can be moved along the first transport path 14, while the base 23 is kept located on the transport guide rails 17.

Then, the retractable arm 41, 42 is brought into opposed relation to the cassette C by the operation of the pivotal driving mechanism 25, and caused to access the cassette C by the retractable driving mechanism not shown for loading and unloading the wafer W with respect to the cassette C. When the wafer W is transferred between the cassette C and the retractable arm 41, 42, the substrate holder 26 is slightly moved up or down by the operation of the vertical articulated arm 24.

When the robot body 18 accesses any of the plating units 20a to 20d, the bevel etching units 21a, 21b and the cleaning units 22a, 22b (see FIG. 2), the robot body 18 is moved to the front of the corresponding unit on the transport guide rails 17 by a movement mechanism not shown. In this state, the substrate holder 26 is moved up or down to the height of a substrate loading/unloading port of the unit by the operation of the vertical articulated arm 24, and the retractable arm 41, 42 is brought into opposed relation to the unit by pivoting the substrate holder 26 by means of the pivotal driving mechanism 25.

In this state, the retractable arm 41, 42 is caused to access the unit by the retractable driving mechanism for the loading and unloading of the wafer W. When the wafer W is transferred between the unit and the retractable arm 41, 42, the substrate holder 26 is slightly moved up or down by the operation of the vertical articulated arm 24.

With this arrangement, the cassette C, the plating units 20a to 20d, the bevel etching units 21a, 21b and the cleaning units 22a, 22b can be accessed by the single robot body 18 for the loading and unloading of the wafer W.

The wafer W subjected to the plating process in the plating unit 20a to 20d (hereinafter referred to as "entire-surface-plated wafer") has a copper film formed on the entire surface thereof including the peripheral edge thereof by the plating, before the wafer W is subjected to the bevel etching process in the bevel etching unit 21a, 21b. Therefore, the substrate holder hand 41c, 42c which holds the entire-surface-plated wafer is contaminated with copper. Therefore, it is preferred that one of the substrate holder hands 41c, 42c is dedicated to holding the entire-surface-plated wafer. Thus, the contamination with copper is prevented from spreading via the substrate holder hand 41c or 42c.

Figure 6:
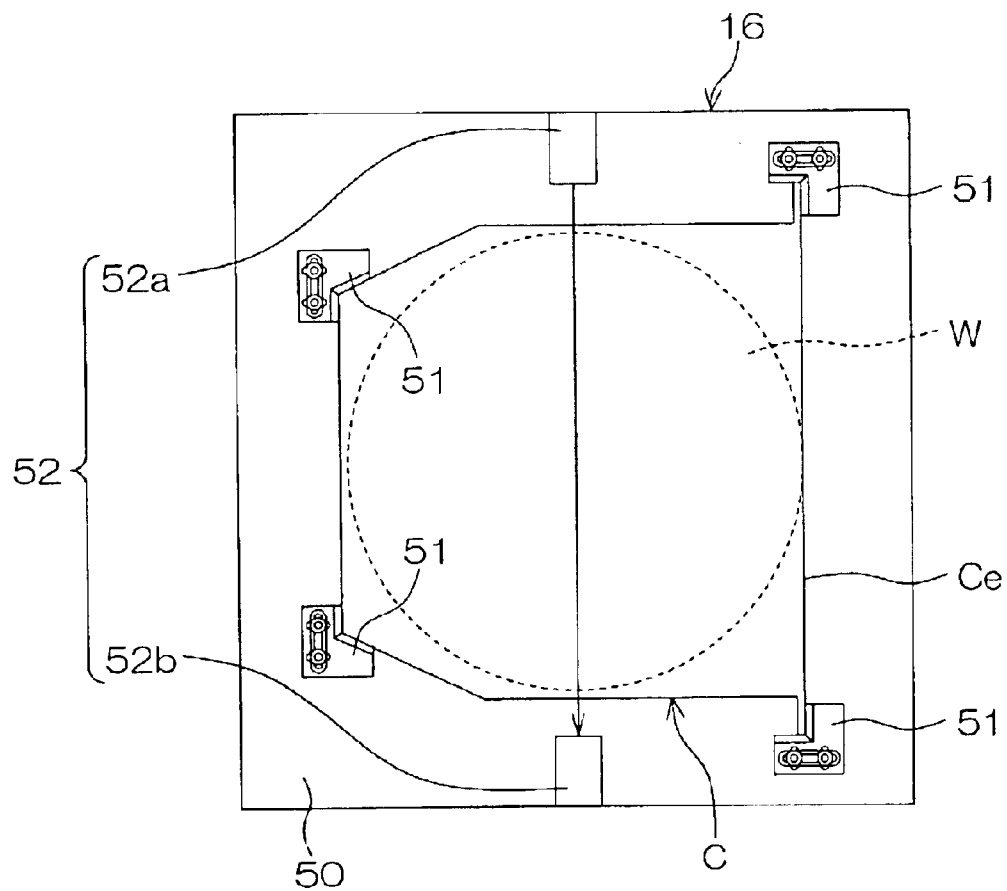
FIGS. 6(a) and 6(b) are a schematic plan view and a schematic side view, respectively, of a cassette stage on which a cassette is placed.
Figure 6:
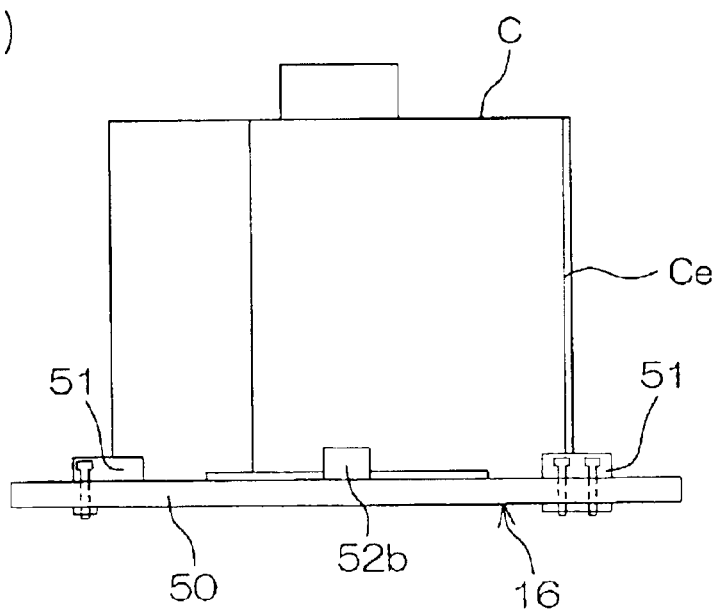

FIGS. 6(a) and 6(b) are a schematic plan view and a schematic side view, respectively, of the cassette stage 16 on which the cassette C is placed.

The cassette stage 16 includes a planar cassette base 50 for receiving thereon the cassette C. The cassette base 50 has a generally square shape as seen in plan. The cassette C has a generally square shape having a smaller size than the cassette base 50 as seen in plan, and has a wafer loading/unloading opening Ce provided on one lateral side thereof.

The cassette base 50 has cassette guides 51 provided on one surface thereof in association with four corners of the cassette C as seen in plan. Therefore, the cassette C can be located in position on the cassette base 50 with its corners in contact with the cassette guides 51. With the cassette C located in position on the cassette base 50, the wafer loading/unloading opening Ce faces toward the first transport path 14 (see FIG. 2).

A light emitting element 52*a* and a light receiving element 52*b* are respectively provided at generally middle points on opposite edges of the cassette base 50 (excluding an edge having the wafer loading/unloading opening Ce) on the surface of the cassette base 50. The light emitting element 52*a* and the light receiving element 52*b* constitute a transmissive photosensor 52. When no cassette C is present on the cassette base 50, light emitted from the light emitting element 52*a* is received by the light receiving element 52*b*. When the cassette C is present on the cassette base 50, the light emitted from the light emitting element 52*a* is blocked by the cassette C and does not reach the light receiving element 52*b*. Thus, a judgment can be made on the presence or absence of the cassette C on the cassette base 50.

Figure 7:
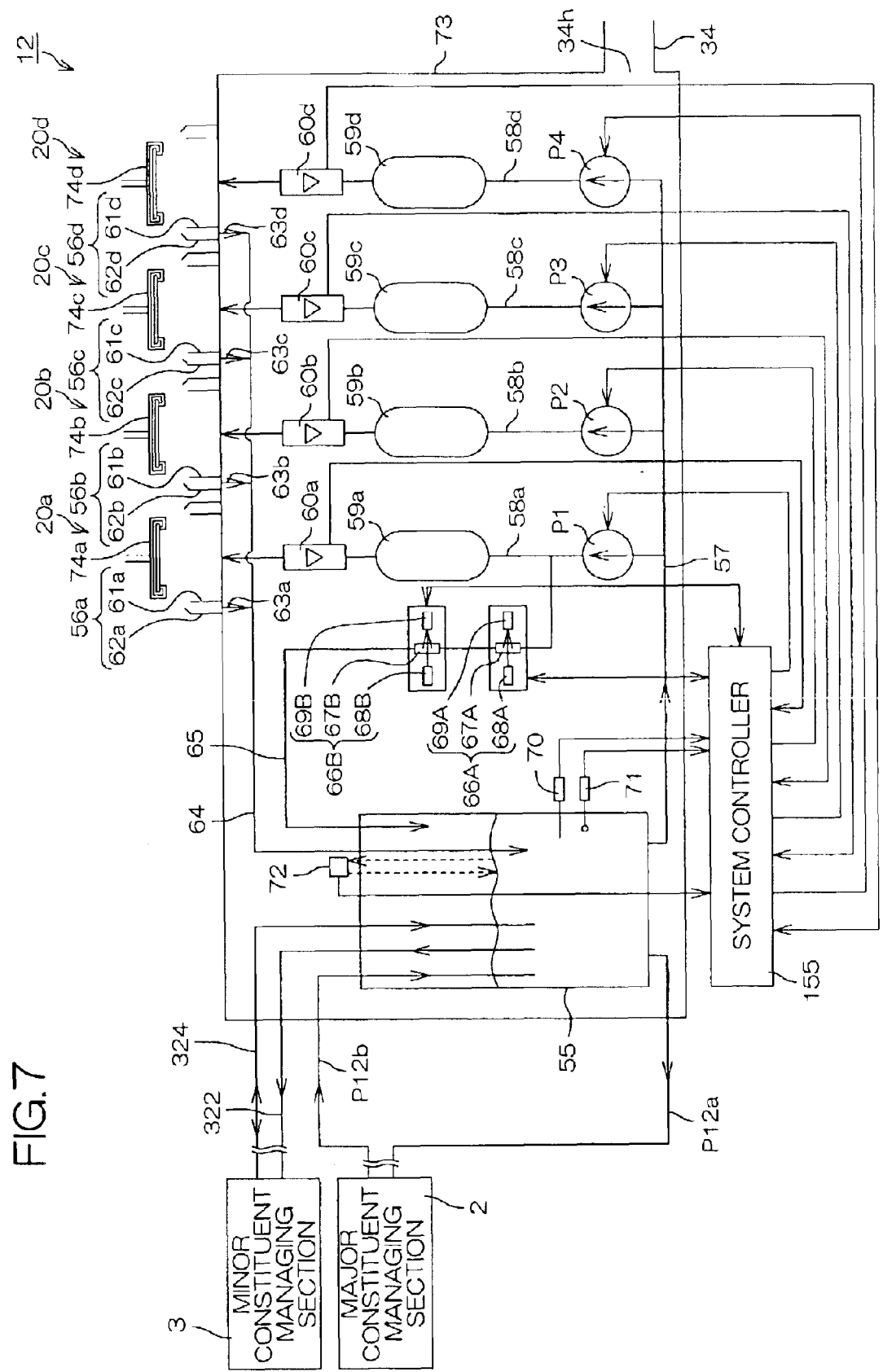
FIG. 7 is a schematic front view illustrating the construction of a plating section.

FIG. 7 is a schematic front view illustrating the construction of the plating section 12.

The plating section 12 includes a plurality of plating units (the four plating units 20*a* to 20*d* in this embodiment) for the plating of the wafer W, and a plating liquid container 55 for containing the plating liquid. The plating units 20*a* to 20*d* respectively include plating cups 56*a* to 56*d* for containing the plating liquid, and wafer holding/rotating mechanisms (treatment heads) 74*a* to 74*d* to be located above the plating cups 56*a* to 56*d*.

The plating liquid container 55 is capable of containing the plating liquid in a much greater amount than the plating cups 56*a* to 56*d* (e.g., 20 times the total volume of the plating cups 56*a* to 56*d*). Since a great amount of the plating liquid can be stored in the plating liquid container 55, the total amount of the plating liquid to be used in the plating section 12 can be increased. Thus, variations in the composition of the plating liquid can be reduced during the plating process.

The plating liquid transport pipe P12*a* for transporting the plating liquid to the major constituent managing section 2 is connected to the bottom of the plating liquid container 55 in communication with the plating liquid container 55. The plating liquid transport pipe P12*b* for introducing the plating liquid transported from the major constituent managing section 2 into the plating liquid container 55, the sampling pipe 322 for transporting the plating liquid to the minor constituent managing section 3, and the replenishment pipe 324 for transporting the plating liquid between the minor constituent managing section 3 and the plating liquid container 55 in opposite directions are introduced into the plating liquid container 55 from the top of the plating liquid container 55. The plating liquid transport pipe P12*b*, the sampling pipe 322 and the replenishment pipe 324 extend to a depth at which open ends thereof are submerged in the plating liquid in the plating liquid container 55.

The plating cups 56*a* to 56*d* are located at a higher position than the plating liquid container 55. A liquid supply pipe 57 extends from the bottom of the plating liquid container 55, and is branched into four branch liquid supply pipes 58*a* to 58*d*. The branch liquid supply pipes 58*a* to 58*d* extend upward to be respectively connected to bottom center portions of the plating cups 56*a* to 56*d* in communication with the plating cups 56*a* to 56*d*.

Pumps P1 to P4, filters 59*a* to 59*d* and flow meters 60*a* to 60*d* are provided in this order from a lower side to an upper side in the respective branch liquid supply pipes 58*a* to 58*d*. The pumps P1 to P4 are respectively capable of pumping the plating liquid from the plating liquid container 55 to the plating cups 56*a* to 56*d*. The operations of the pumps P1 to P4 are controlled by the system controller 155. The filters 59*a* to 59*d* are capable of removing particles (contaminants) from the plating liquid. Signals indicative of the flow rates of the plating liquid is outputted from the flow meters 60*a* to 60*d*, and inputted to the system controller 155.

The plating cups 56*a* to 56*d* respectively include cylindrical plating vessels (liquid containing portions) 61*a* to 61*d* provided inwardly thereof, and recovery vessels 62*a* to 62*d* surrounding the plating vessels 61*a* to 61*d*. The branch liquid supply pipes 58*a* to 58*d* are connected in communication with the plating vessels 61*a* to 61*d*. Branch return pipes 63*a* to 63*d* extend from bottom portions of the recovery vessels 62*a* to 62*d*. The branch return pipes 63*a* to 63*d* are connected in communication with a return pipe 64, which extends into the plating liquid container 55.

With the aforesaid arrangement, the plating liquid is supplied, for example, to the plating vessel 61*a* from the plating liquid container 55 through the liquid supply pipe 57 and the branch liquid supply pipe 58*a* by operating the pump P1. The plating liquid overflows from the top of the plating vessel 61*a*, and is fed back into the plating liquid container 55 from the recovery vessel 62*a* through the branch return pipe 63*a* and the return pipe 64 by gravity. That is, the plating liquid is circulated through the plating liquid container 55 and the plating cup 56*a*.

Similarly, the plating liquid is circulated through the plating liquid container 55 and the plating cup 56*b*, 56*c* or 56*d* by operating the pump P2, P3 or P4. When the plating process is performed in any of the plating units 20*a* to 20*d*, the plating liquid is circulated through the plating cup 56*a* to 56*d* of the corresponding plating unit 20*a* to 20*d* and the plating liquid container 55. Thus, the plating liquid container 55 is shared by the four plating units 20*a* to 20*d*.

One end of a bypass pipe 65 is connected to the branch liquid supply pipe 58*a* between the pump P1 and the filter 59*a*. The other end of the bypass pipe 65 is introduced into the plating liquid container 55. Absorptiometers 66A, 66B for measuring absorbances of the plating liquid at specific wavelengths of light are provided in the bypass pipe 65. The absorptiometer 66A is provided for determining the concentration of copper in the plating liquid, while the absorptiometer 66B is provided for determining the concentration of iron in the plating liquid.

When the pump P1 is operated to circulate the plating liquid through the plating liquid container 55 and the plating cup 56*a*, a part of the plating liquid flowing through the branch liquid supply pipe 58*a* flows into the bypass pipe 65 due to a pressure loss by the filter 59*a*. That is, the plating liquid can be introduced into the bypass pipe 65 without provision of a dedicated pump in the bypass pipe 65.

The absorptiometers 66A, 66B each include a cell 67A, 67B composed of a transparent material, and a light emitting section 68A, 68B and a light receiving section 69A, 69B disposed in opposed relation with the cell 67A, 67B interposed therebetween. The light emitting sections 68A and 68B are respectively capable of emitting light beams having specific wavelengths corresponding to absorption spectra of copper and iron (e.g., 780 nm for copper). The light receiving sections 69A and 69B are respectively capable of measuring the intensities of the light beams emitted from the light emitting sections 68A and 68B and transmitted through the plating liquid in the cells 67A and 67B. The absorbances of the plating liquid are determined on the basis of the light intensities. Signals indicative of the absorbances are outputted from the absorptiometers 66A, 66B, and inputted to the system controller 155.

A temperature sensor 70 and an electromagnetic conductivity meter 71 are attached to a side wall of the plating liquid container 55. The temperature sensor 70 and the electromagnetic conductivity meter 71 are located at a height lower than the surface level of the plating liquid contained in the plating liquid container 55. Detectors of the temperature sensor 70 and the electromagnetic conductivity meter 71 project into the plating liquid container 55, and are respectively adapted to measure the temperature and electrical conductivity of the plating liquid. Output signals of the temperature sensor 70 and the electromagnetic conductivity meter 71 are inputted to the system controller 155.

The concentrations of copper and iron in the plating liquid can be determined by measuring the absorbances of the plating liquid at the specific wavelengths of light. An explanation will be given to how to determine the copper concentration on the basis of the absorbance of the plating liquid.

Figure 8:
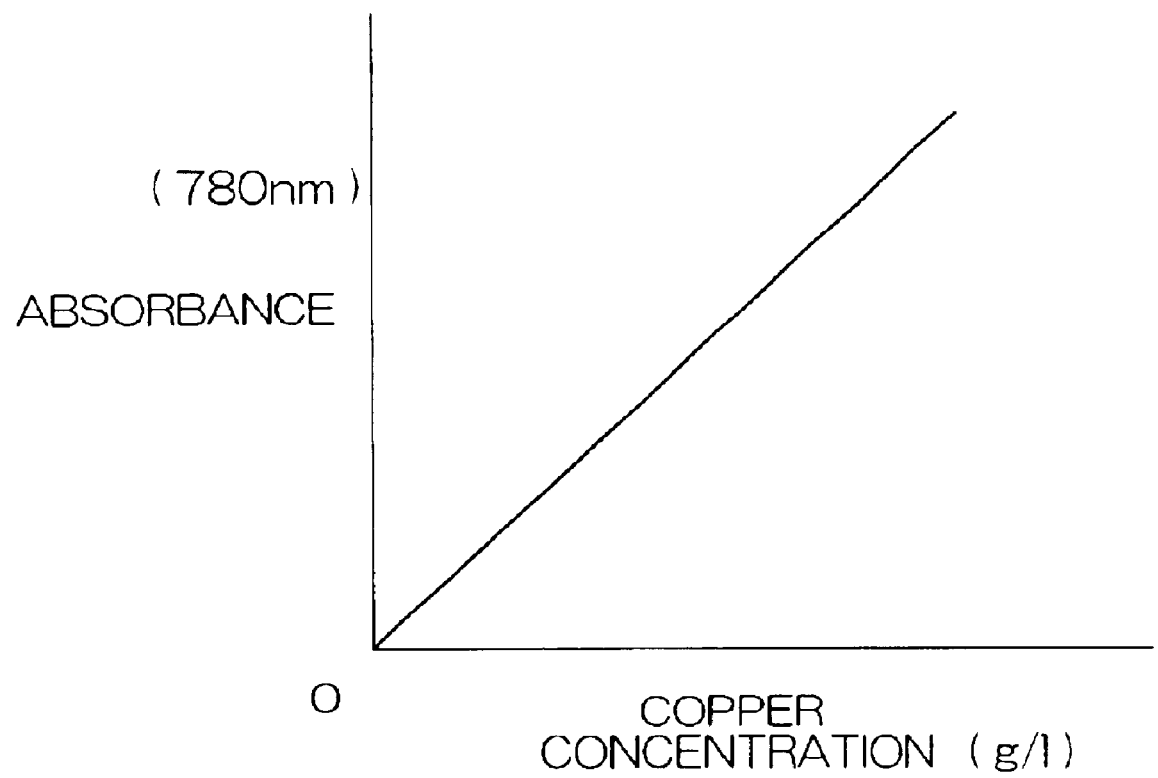
FIG. 8 is a diagram illustrating a relationship between the concentration of copper in a plating liquid samples and a measured absorbance.

For the determination of the copper concentration of the plating liquid, a relationship between the copper concentration and the absorbance is preliminarily determined. First, plural plating liquid samples having different copper concentrations are prepared. Copper sulfate is added as a copper source for the preparation of the plating liquid samples. The plating liquid samples each have substantially the same composition as the plating liquid actually used for the plating process, except that the copper concentrations thereof are different. The absorbances of the plating liquid samples are measured by the absorptiometer 66A. Thus, the relationship between the copper concentration and the absorbance (copper calibration line) is determined on the basis of the known copper concentrations and the measured absorbances of the plating liquid samples as shown in FIG. 8.

For the determination of an unknown copper concentration of the plating liquid, the absorbance of the plating liquid is measured by the absorptiometer 66A. Then, the copper concentration is determined on the basis of the measured absorbance and the copper calibration line.

Similarly, a relationship between the iron concentration and the absorbance (iron calibration line) is preliminarily determined on the basis of known iron concentrations and measured absorbances of plating liquid samples, and the concentration of iron in the plating liquid is determined on the basis of the absorbance of the plating liquid measured by the absorptiometer 66B and the iron calibration line.

The system controller 155 includes a storage device storing therein data of the copper calibration line and the iron calibration line. The system controller 155 is capable of determining the copper concentration on the basis of the output signal of the absorptiometer 66A and the data of the copper calibration line, and determining the iron concentration on the basis of the output signal of the absorptiometer 66B and the data of the iron calibration line.

An ultrasonic level meter 72 is provided above the plating liquid container 55. The ultrasonic level meter 72 is capable of detecting the surface level of the plating liquid in the plating liquid container 55. An output signal of the ultrasonic level meter 72 is inputted to the system controller 155. A capacitive level meter may be employed instead of the ultrasonic level meter 72.

The plating liquid container 55, the liquid supply pipe 57, the branch liquid supply pipes 58a to 58d, the branch return pipes 63a to 63d and the return pipe 64 are disposed in a pipe chamber 73 virtually air-tightly enclosed by the enclosure 30 and partition walls of the wafer treating section 1. The pipe chamber 73 has the air outlet port 34h, which is connected to the air outlet duct 34. The other end of the air outlet duct 34 is connected to the in-plant exhauster system line. Air possibly exposed to the plating liquid and the like in the plating section 12 is forcibly exhausted out of the clean room. During the forcible air exhaustion, the internal pressure of the pipe chamber 73 is kept at a negative pressure.

Figure 9:
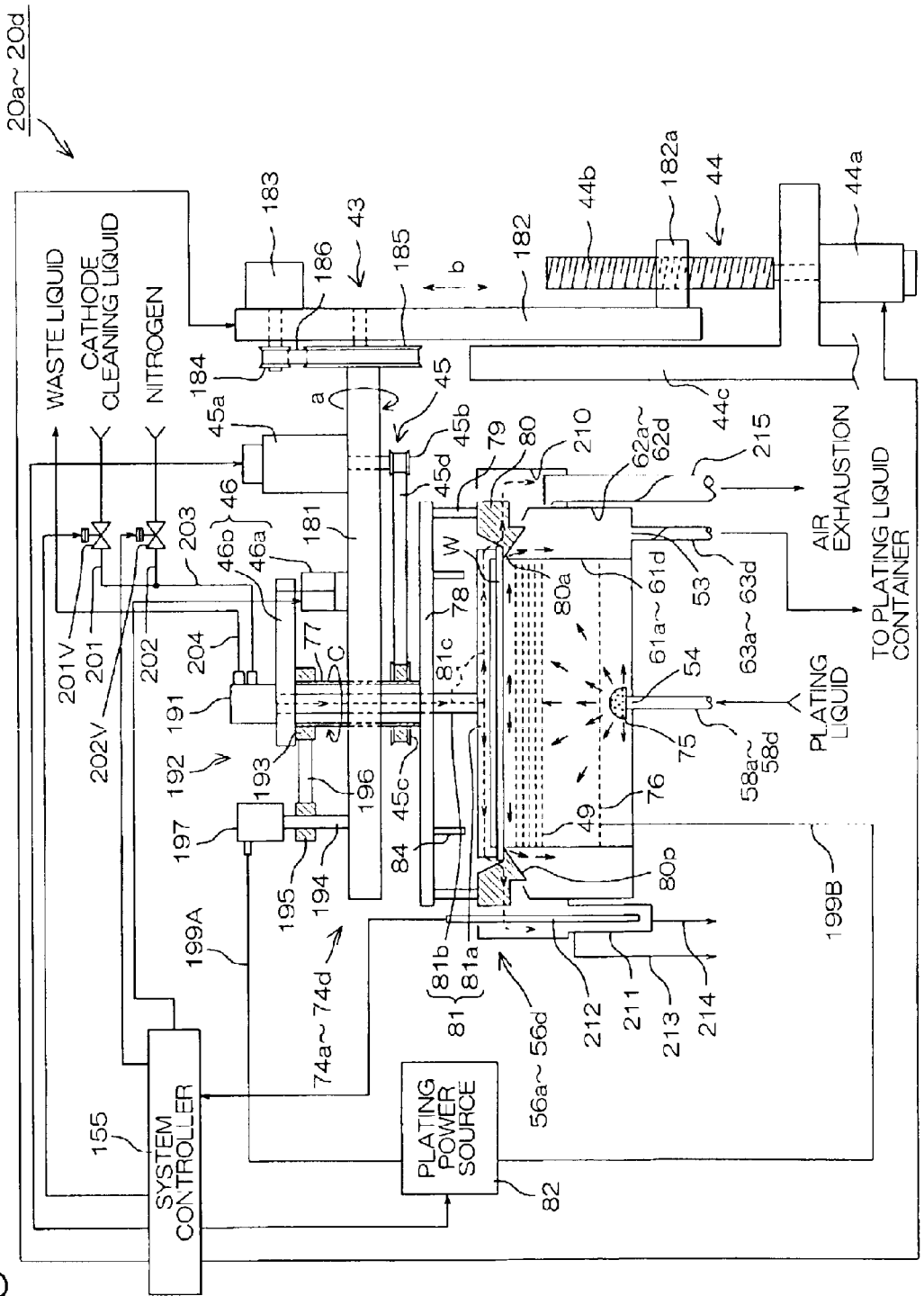
FIG. 9 is a schematic sectional view illustrating the construction of a plating unit.

FIG. 9 is a schematic sectional view illustrating the common construction of the plating units 20a to 20d. The wafer holding/rotating mechanisms 74a to 74d are each supported by an inversion base 181. An inversion driving section 43 is connected to one end of the inversion base 181.

The inversion driving section 43 includes a column-shaped vertical base 182 extending vertically, a rotary actuator 183 attached to the vertical base 182 and having a rotation shaft perpendicular to the vertical base 182, and a toothed pulley 184 attached to the rotation shaft of the rotary actuator 183, a toothed pulley 185 attached to a shaft extending parallel to the shaft of the rotary actuator 183 and supported rotatably by the vertical base 182, and a timing belt 186 stretched between the toothed pulley 184 and the toothed pulley 185 for transmitting a rotation force of the rotary actuator 183.

The rotary actuator 183 may be, for example, pneumatically driven. The inversion base 181 is attached to the vicinity of the shaft of the toothed pulley 185 perpendicularly to the toothed pulley 185. The inversion base 181 and the wafer holding/rotating mechanism 74a to 74d supported by the inversion base 181 can be pivoted (inverted) about the horizontal shaft as indicated by an arrow a in FIG. 9 by a pivotal driving force of the rotary actuator 183. Thus, the wafer W held by the wafer holding/rotating mechanism 74a to 74d can face upward or downward toward the plating cup 56a to 56d.

The vertical base 182 is coupled to a lift mechanism 44. The lift mechanism 44 includes a first motor 44a having a vertical rotation shaft, a ball thread 44b attached to the first motor 44a coaxially with the rotation shaft of the first motor 44a, and a vertical column-shaped guide 44c. The first motor 44a may be, for example, a servo motor. A support member 182a having an internal thread portion is provided in threading engagement with the ball thread 44b in the vicinity of a lower end of the vertical base 182. The guide 44c vertically guides the vertical base 182 while preventing the vertical base 182 from rotating about the axis of the ball thread 44b.

With this arrangement, the vertical base 182 can be moved vertically by rotating the first motor 44a. Therefore, the inversion base 181 coupled to the vertical base 182 and the wafer holding/rotating mechanism 74a to 74d supported by the inversion base 181 can vertically be moved up and down (in directions indicated by arrows b in FIG. 9).

The wafer holding/rotating mechanism 74a to 74d includes a rotary pipe 77 and a disk-shaped spin base 78 attached to one end of the rotary pipe 77 perpendicularly to the rotary pipe 77.

Figure 10:
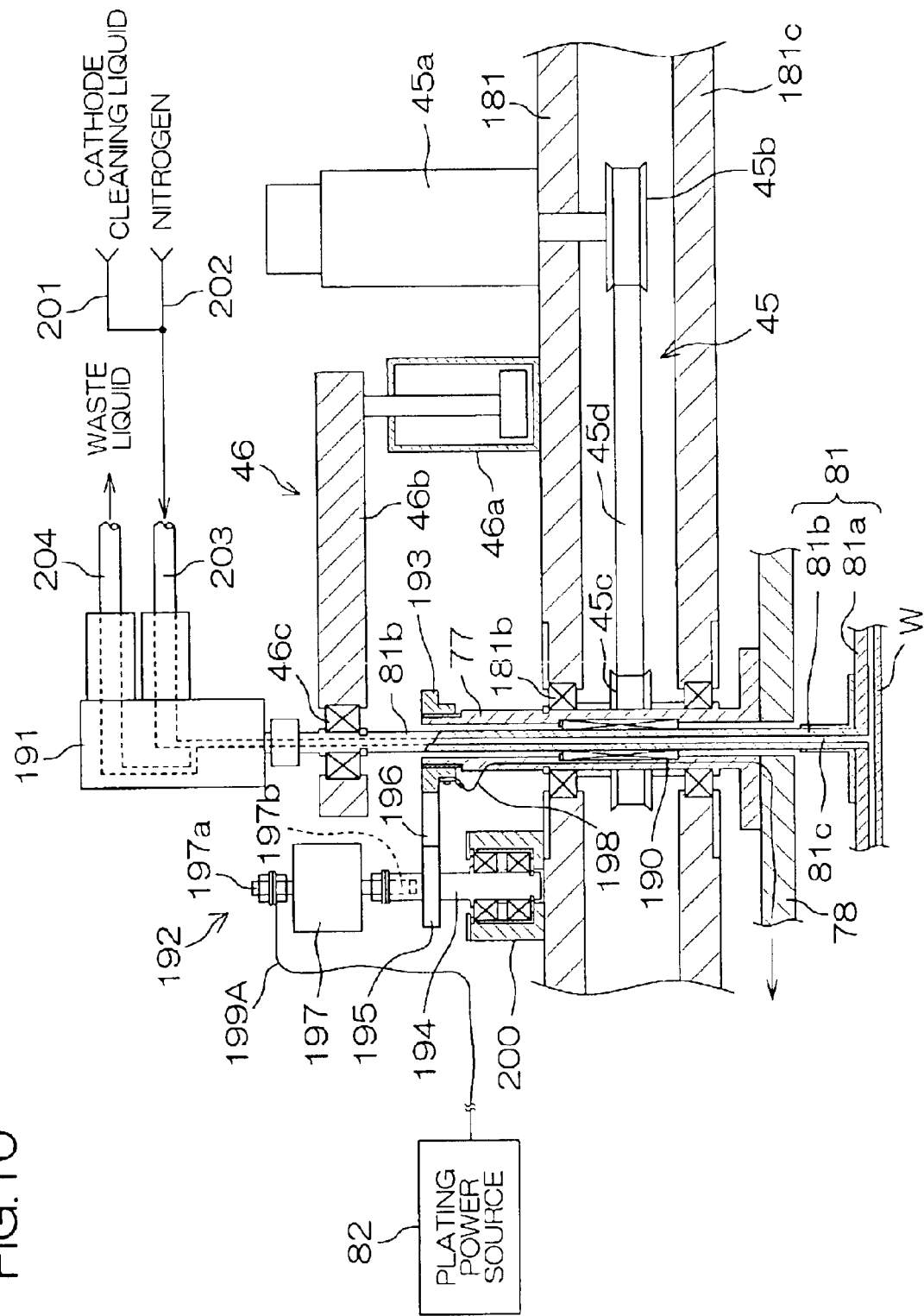
FIG. 10 is a schematic sectional view illustrating a portion around a rotary pipe on a greater scale.

FIG. 10 is a schematic sectional view illustrating a portion around the rotary pipe 77 on a greater scale. Referring to FIGS. 9 and 10, the rotary pipe 77 is supported rotatably about its axis by the inversion base 181 via a bearing 181b.

A plurality of wafer transfer pins 84 are provided on a surface of the spin base 78 opposite from the rotary pipe 77 between the center and the peripheral edge of the spin base 78. A plurality of support posts (e.g., four support posts) 79 are provided in a peripheral edge portion on the surface of the spin base 78 opposite from the rotary pipe 77. An annular cathode ring 80 is attached to distal ends of the support posts 79. The support posts 79 have a greater length than the wafer transfer pins 84.

The cathode ring 80 has an abutment portion 80a projecting toward the center of the cathode ring 80. The abutment portion 80a has an inner diameter slightly smaller than the diameter of the wafer W. The cathode ring 80 further has a projection 80p projecting opposite from the support posts 79.

A susceptor 81 is provided coaxially with the rotary pipe 77. The susceptor 81 includes a support shaft 81b extending through the rotary pipe 77, and a disk-shaped wafer back side press plate 81a attached to an end of the support shaft 81b (on the side of the cathode ring 80) perpendicularly to the support shaft 81b. The support shaft 81b is supported coaxially with the rotary pipe 77 by a ball spline 190, while being permitted to move axially of the rotary pipe 77.

The wafer back side press plate 81a is surrounded by the plurality of support posts 79. The wafer back side press plate 81a has a slightly smaller diameter than the wafer W. An end portion of the support shaft 81b opposite from the wafer back side press plate 81a projects out of the rotary pipe 77.

The susceptor 81 is coupled to a susceptor movement mechanism 46. The susceptor movement mechanism 46 includes an air cylinder 46a attached to the inversion base 181, and a transmission member 46b which couples a piston of the air cylinder 46a to the support shaft 81b. The transmission member 46b is fixed to the end portion of the support shaft 81b projecting out of the rotary pipe 77 opposite from the wafer back side press plate 81a. The susceptor 81 can be moved along the center axis of the rotary pipe 77 by driving the air cylinder 46a.

The wafer back side press plate 81a is formed with holes in association with the wafer transfer pins 84. Thus, the wafer transfer pins 84 are inserted into the holes of the wafer back side press plate 81a as the susceptor 81 is moved with respect to the rotary pipe 77. With the aforesaid arrangement, the wafer W can be held by the abutment portion 80a of the cathode ring 80 and the wafer back side press plate 81a.

A rotative driving mechanism 45 for rotating the rotary pipe 77 about its axis is coupled to the rotary pipe 77. The rotative driving mechanism 45 includes a second motor 45a provided on the inversion base 181 and having a rotation shaft parallel to the axis of the rotary pipe 77, a toothed pulley 45b fixed to the rotation shaft of the second motor 45a, a toothed pulley 45c provided around the rotary pipe 77, and a timing belt 45d stretched between the toothed pulley 45b and the toothed pulley 45c for transmitting a rotation force of the second motor 45a. The toothed pulleys 45b, 45c and the timing belt 45d are housed in a cover 181c (not shown in FIG. 9) attached to the inversion base 181.

The rotary pipe 77 can be rotated about its axis (in a direction indicated by an arrow c in FIG. 9) by a rotative driving force of the second motor 45a. The second motor 45a may be, for example, a servo motor. The rotation of the rotary pipe 77 is transmitted to the susceptor 81 through the ball spline 190, so that the rotary pipe 77 and the susceptor 81 are rotated together. Thus, the wafer W held by the abutment portion 80a of the cathode ring 80 and the wafer back side press plate 81a can be rotated.

In the plating process, the wafer holding/rotating mechanism 74a to 74d is moved down by the lift mechanism 44 with the wafer W thus held as facing downward, and a lower surface of the wafer W is brought into contact with the plating liquid filled in the plating vessel 61a to 61d.

Figure 11:
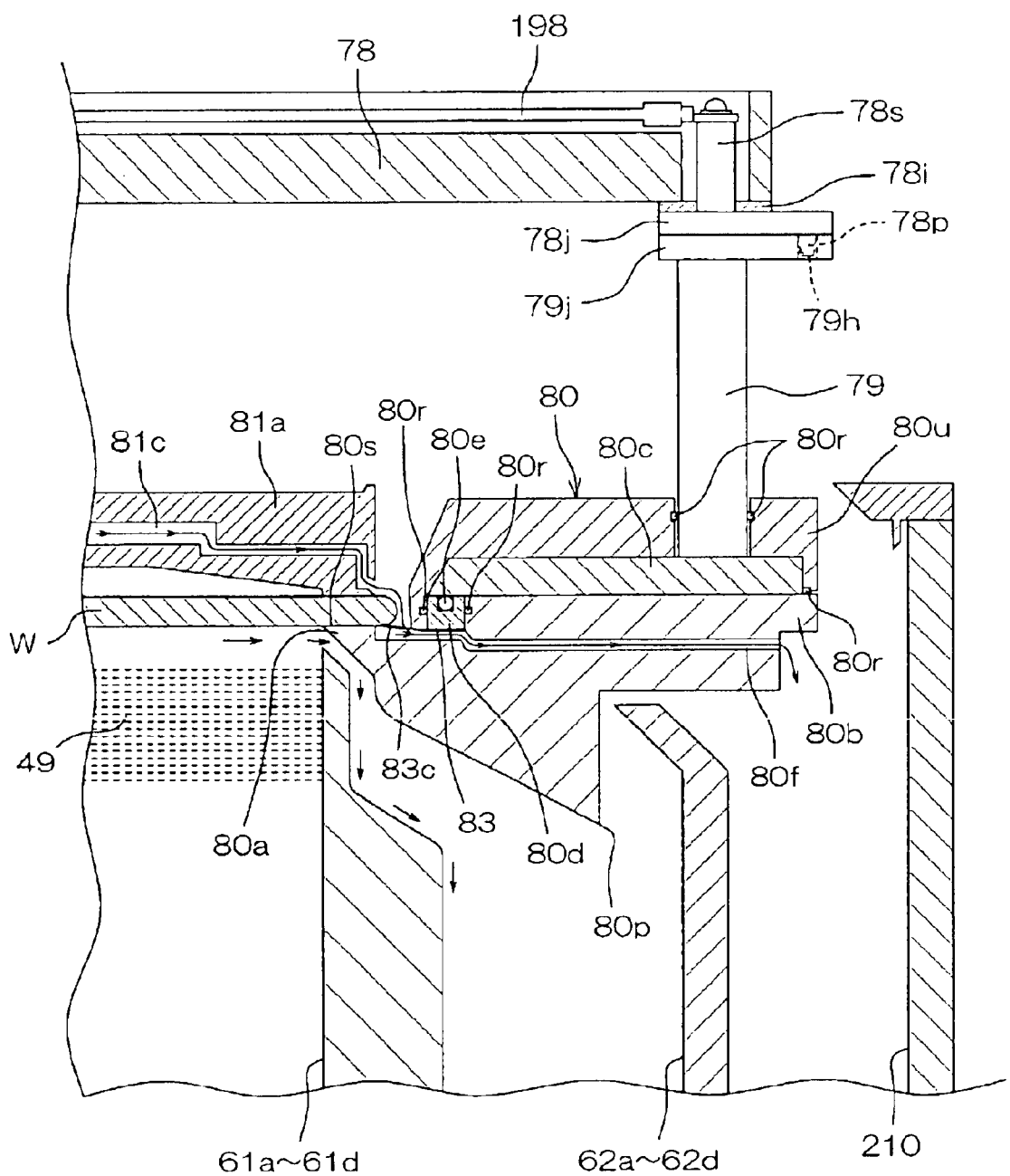
FIG. 11 is a schematic sectional view illustrating a portion around a wafer as observed in a plating process.

FIG. 11 is a schematic sectional view illustrating a portion around the wafer as observed in the plating process. Referring to FIGS. 9 to 11, a continuous fluid channel 81c is provided in the support shaft 81b and the wafer back side press plate 81a. The fluid channel 81c is provided as a single fluid channel extending through the support shaft 81b along the center axis of the support shaft 81b, and branched into a plurality of branch channels in the wafer back side press plate 81a. The branch channels extend from the center to the peripheral edge of the wafer back side press plate 81a, and open in the peripheral edge of the wafer back side press plate 81a.

A rotary joint 191 is attached to the end of the support shaft 81b opposite from the wafer back side press plate 81a. One end of a supply pipe 203 and one end of a leak pipe 204 are connected to the rotary joint 191. The other end of the supply pipe 203 is branched into a cathode cleaning liquid pipe 201 and a nitrogen gas pipe 202.

The cathode cleaning liquid pipe 201 is connected to a cathode cleaning liquid supply source, and the nitrogen gas pipe 202 is connected to a nitrogen gas supply source. A valve 201V is provided in the cathode cleaning liquid pipe 201, so that a cathode cleaning liquid (e.g., deionized water) can be supplied into the rotary joint 191 by opening the valve 201V. A valve 202V is provided in the nitrogen gas pipe 202, so that nitrogen gas can be supplied into the rotary joint 191 by opening the valve 202V.

Even during the rotation of the susceptor 81, a treatment fluid such as the cathode cleaning liquid or nitrogen gas can be supplied into the fluid channel 81c from the cathode cleaning liquid supply source or the nitrogen gas supply source on the side of a stationary system through the rotary joint 191.

A part of the cathode cleaning liquid supplied from the supply pipe 203 is drained through the leak pipe 204. Thus, particles generated by slidable members in the rotary joint 191 are washed away into the leak pipe 204 by the cathode cleaning liquid so as to be prevented from flowing into the fluid channel 81c.

Figure 12:
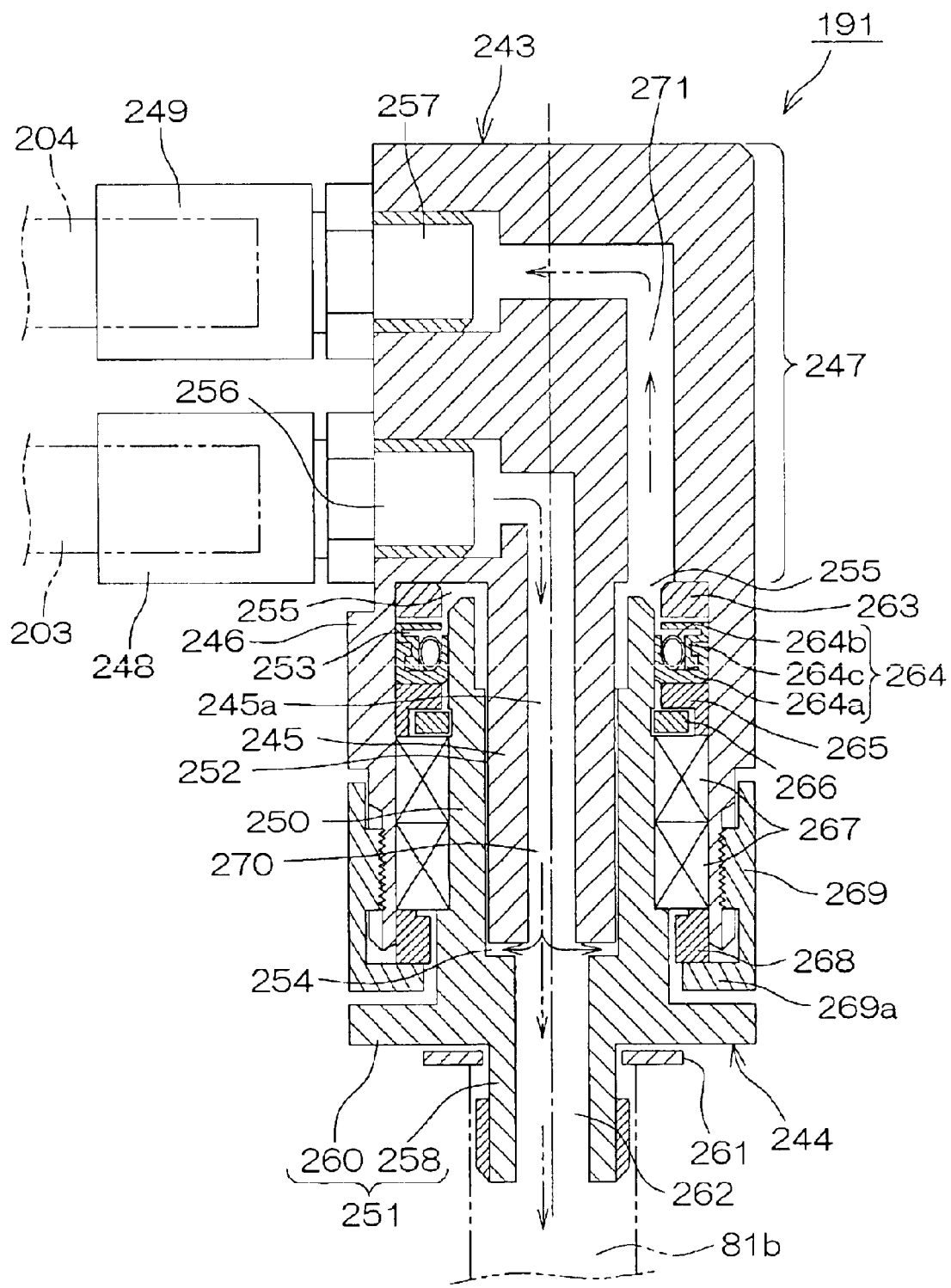
FIG. 12 is a schematic sectional view of a rotary joint.

FIG. 12 is a schematic sectional view of the rotary joint 191. The rotary joint 191 includes a stator 243 connected to the supply pipe 203 and the leak pipe 204, and a rotor 244 connected to the support shaft 81b of the susceptor 81.

The stator 243 includes a body 247, an inner cylinder 245 projecting from the body 247, and an outer cylinder 246 provided around the inner cylinder 245 coaxially with the inner cylinder 245 and projecting from the body 247. The body 247, the inner cylinder 245 and the outer cylinder 246 are integrally formed. A joint 248 connected to the supply pipe 203 and a joint 249 connected to the leak pipe 204 are attached to the body 247 as extending perpendicularly to the lengths of the inner cylinder 245 and the outer cylinder 246. A treatment fluid supply port 256 and a leak port 257 extend from the joint 248 and the joint 249, respectively, inwardly of the body 247.

The rotor 244 includes a joint 251 for connection to the support shaft 81b, and a cylindrical member 250 extending coaxially with the support shaft 81b connected to the joint 251. The rotor 244 has a through-hole 262 extending along the center axis thereof. The joint 251 includes a connection pipe 258 having an outer thread portion and a flange 260.

The support shaft 81b has an inner thread portion provided on an end interior surface thereof and engaged with the outer thread portion of the connection pipe 258. The end of the support shaft 81b engaged with the connection pipe 258 is restricted in position by the flange 260. A fluororesin packing 261 is provided between the support shaft 81b and the flange 260.

The cylindrical member 250 is fitted in an annular space defined between the inner cylinder 245 and the outer cylinder 246 of the body 247 coaxially with the inner cylinder 245 and the outer cylinder 246. The treatment fluid supply port 256, an inner space 245a of the inner cylinder 245 and the through-hole 262 of the rotor 244 communicate with each other, and constitute a main channel 270 for introducing the treatment fluid supplied from the supply pipe 203 into the fluid channel 81c provided in the support shaft 81b.

A first gap 252 is defined between the inner cylinder 245 and the cylindrical member 250, while a second gap 253 is defined between the outer cylinder 246 and the cylindrical member 250. The width of the first gap 252 (a distance between the inner cylinder 245 and the cylindrical potion 250) is, for example, 0.1 mm, but is increased in the vicinity of a distal end of the cylindrical member 250. The width of the second gap 253 (a distance between the outer cylinder 246 and the cylindrical member 250) is several millimeters. The main channel 270 and the first gap 252 communicate with each other through a first communication portion 254 provided in the vicinity of a distal end of the inner cylinder 245, while the first gap 252 and the second gap 253 communicate with each other through a second communication portion 255 provided in the vicinity of the distal end of the cylindrical member 250. The leak port 257 communicates with a part of the second communication portion 255. The first gap 252, the part of the second gap 253 and the leak port 257 constitute a leak channel 271, and the main channel 270 and the leak pipe 204 communicate with each other through the leak channel 271.

A first spacer 263, a sealing ring 264, a second spacer 265, a C-ring 266, two bearings 267 and a third spacer 268 are disposed in the second gap 253 in this order from the side of the second communication portion 255. These components except the C-ring 266 each have a closed ring shape and surround the cylindrical member 250. The sealing ring 264 is held between the first spacer 263 and the second spacer 265 thereby to be located at a fixed position axially of the outer cylinder 246.

The first spacer 263 and the second spacer 265 contact the outer cylinder 246, but do not contact the cylindrical member 250. The bearings 267 are located at fixed positions axially of the cylindrical member 250, and support the cylindrical member 250 and the outer cylinder 246 in a rotatable manner. The C-ring 266 is fitted in a shallow groove provided in a predetermined position of the cylindrical member 250.

The sealing ring 264 includes a fluororesin press-fit member (lip portion) 264a having a U-shaped cross section opening toward the second communication potion 255, a coil spring (helical spring) 264b provided in the press-fit member 264a, and a press member 264c partly covering an open portion of the press-fit member 264a. The press-fit member 264a is urged outward from the center of the coil spring 264b by the resilient force of the coil spring 264b, and kept in contact with the outer cylinder 246 and the cylindrical member 250. The coil spring 264b is composed of a material resistant to the cathode cleaning liquid to be used. The press member 264c presses the coil spring 264b to prevent the coil spring 264b from disengaging from the press-fit member 264a.

The outer cylinder 246 has an outer thread portion provided on an outer surface portion adjacent to the distal end thereof. A fixture ring 269 having an inner thread portion in association with the outer thread portion is fitted around the outer cylinder 246. The fixture ring 269 includes a flange 269a provided at an end thereof adjacent to the rotor 244 as projecting inwardly thereof. The flange 269a extends between the third spacer 268 and the flange 260.

When the rotary joint 191 is assembled by combining he stator 243 with the rotor 244, the fixture ring 269 is tightened around the outer cylinder 246 to introduce the C-ring 266, the third spacer 268 and the bearings 267 to the predetermined axial positions.

An end of the leak pipe 204 opposite from the rotary joint 191 usually opens at the atmospheric pressure, while the treatment fluid flowing through the main channel 270 is generally pressurized. Therefore, the treatment fluid flowing through the main channel 270 partly flows into the leak channel 271 which has a lower internal pressure. The treatment fluid (particularly, the cathode cleaning liquid) flowing through the leak channel 271 partly flows through the second communication portion 255 to reach the second gap 253, but the flow thereof is prevented by the sealing ring 264. Therefore, there is no possibility that the treatment fluid leaks toward the bearings 267.

When the support shaft 81b is rotated, the rotor 244 is also rotated. The rotor 244 is supported with respect to the stator 243 via the sealing ring 264 and the bearings 267 and, hence, can freely be rotated with respect to the stator 243. By the rotation of the rotor 244, the press-fit member 264a is brought into friction with either or both of the outer cylinder 246 and the cylindrical member 250. Although the fluororesin press-fit member 264a has a sufficient wear resistance, a small amount of particles are generated.

Since the treatment fluid flows from the first gap 252 toward the leak port 257 in the leak channel 271, the particles generated around the sealing ring 264 are drained together with the treatment fluid (particularly, the cathode cleaning liquid) into the leak pipe 204 through the leak channel 271. Therefore, there is no possibility that the treatment fluid flowing through the main channel 270 is contaminated with the particles and supplied to the wafer W.

An ejector may be attached to the end of the leak pipe 204 opposite from the rotary joint 191. In this case, when the flow rate of the treatment fluid flowing into the leak channel 271 from the main channel 270 is low, a pressure on the side of the leak port 257 is reduced to a negative level by the ejector for forcibly increasing the flow rate of the treatment fluid. Even if the internal pressure of the main channel 270 is close to the atmospheric pressure, the flow rate of the treatment fluid flowing through the leak channel 271 can be increased. Thus, the flow rate of the treatment fluid flowing through the leak channel 271 can be adjusted by adjusting the pressure on the side of the leak port 257.

Further, the flow of the particles into the main channel 270 can be suppressed by reducing the width of the first gap 252 to 50 μm.

Where the first gap 252 has a reduced width, the treatment fluid present in the first gap 252 experiences a great pressure loss. Therefore, even if the treatment fluid flowing through the main channel 270 is highly pressurized to increase the flow rate of the treatment fluid in the main channel 270, a great pressure (or load) is not exerted on the sealing ring 264. Therefore, the service life of the sealing ring 264 is prolonged. Where the treatment fluid is the cathode cleaning liquid, the cathode cleaning liquid present in the second gap 253 serves to lubricate and cool the sealing ring 264. This also prolongs the service life of the sealing ring 264.

The particles can be washed away by a small amount of the treatment fluid flowing through the leak channel 271. By reducing the width of the first gap 252, the amount of the treatment fluid flowing through the first gap 252 can be reduced, thereby reducing the consumption of the treatment fluid (e.g., the treatment liquid).

Since the inner cylinder 245 and the outer cylinder 246 are formed integrally with the body 247, the inner cylinder 245 and the outer cylinder 246 are spaced exactly the predetermined distance. Further, the cylindrical member 250 is supported with respect to the outer cylinder 246 at three positions by the sealing ring 264 and the two bearings 267, so that the distance between the cylindrical member 250 and the outer cylinder 246, i.e., the width of the second gap 253, can be kept exactly at the predetermined level. Therefore, the distance between the cylindrical member 250 and the inner cylinder 245, i.e., the width of the first gap 252, is also kept at the predetermined level. Hence, there is no possibility that the cylindrical member 250 is brought into contact with the inner cylinder 245.

Figure 13:
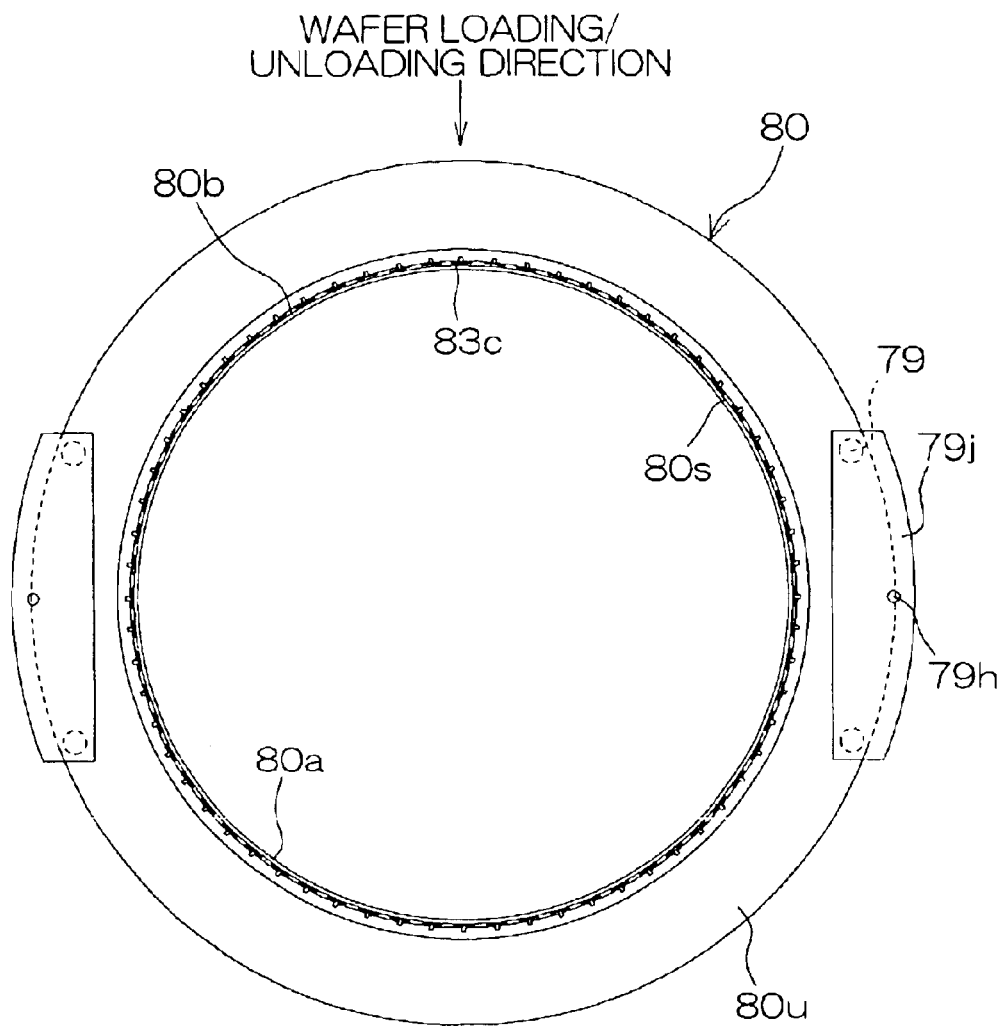
FIGS. 13(a) and 13(b) are schematic plan views of a cathode ring.
Figure 13:
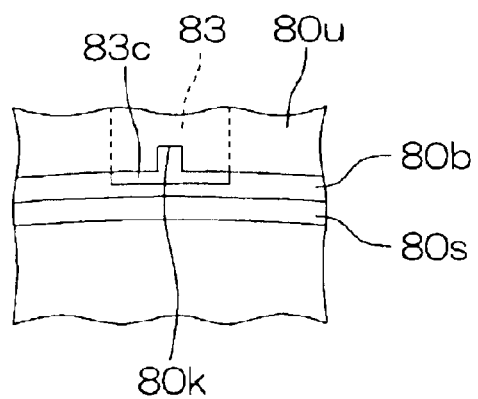

FIGS. 13(a) and 13(b) are schematic plan views of the cathode ring 80 (as seen from the side of the spin base 78). Particularly, FIG. 13(a) illustrates the entire cathode ring 80, and FIG. 13(b) illustrates a part of the inner periphery of the cathode ring 80 on a greater scale.

Referring to FIGS. 11, 13(a) and 13(b), the cathode ring 80 includes an upper ring 80u, a conduction plate 80c and a base ring 80b arranged in this order from the side of the spin base 78. The upper ring 80u, the conduction plate 80c and the base ring 80b each have an annular shape. The base ring 80b is composed of an inelastic material. The conduction plate 80c is covered with the upper ring 80u and the base ring 80b. The upper ring 80u and the base ring 80b are opposed (adjacent) to each other along the outer periphery of the conduction plate 80c and along the inner periphery of the conduction plate 80c opposite from the spin base 78.

The conduction plate 80c is electrically conductive. The conduction plate 80c has a higher strength than the upper ring 80u and the base ring 80b to impart the entire cathode ring 80 with a sufficient strength.

The base ring 80b is provided with the abutment portion 80a. In other words, the base ring 80b has a slightly smaller inner diameter than the upper ring 80u. The abutment portion 80a has a sealing surface 80s to be brought into contact with the wafer W in opposed relation to the wafer back side press plate 81a.

A plurality of fluid channels 80f are provided as a gap defined between the upper ring 80u and the base ring 80b and as through-holes extending radially through the base ring 80b. Where the wafer back side press plate 81a and the cathode ring 80 are located in position in the plating process, the fluid channels 80f are located at a lower position than the branch channels of the fluid channel 81c. A multiplicity of notches 80k (see FIG. 13(b)) are provided in an inner peripheral portion of the upper ring 80u, whereby the cathode cleaning liquid flowing out of the branch channels of the fluid channel 81c opening in the periphery of the wafer back side press plate 81a can be introduced into the fluid channels 80f in the plating process.

A cathode 83 is disposed in the fluid channels 80f (the gap between the upper ring 80u and the base ring 80b). Therefore, the cathode 83 can be cleaned with the cathode cleaning liquid in the plating process. The cathode 83 is disposed within substantially the same plane as the sealing surface 80s outwardly of the abutment portion 80a with respect to the center of the cathode ring 80.

Figure 14:
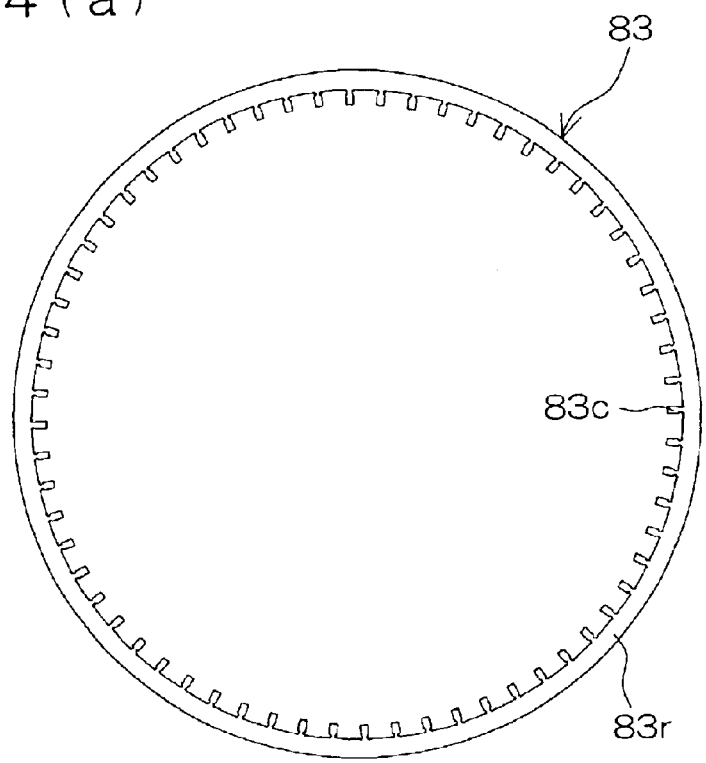
FIGS. 14(a), 14(b) and 14(c) are schematic plan views and a schematic sectional view illustrating the shape of a cathode.
Figure 14:
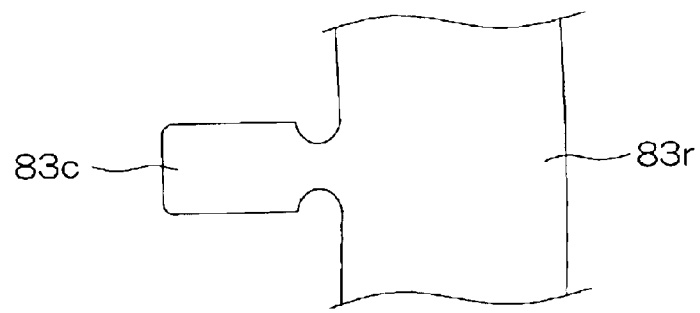
Figure 14:
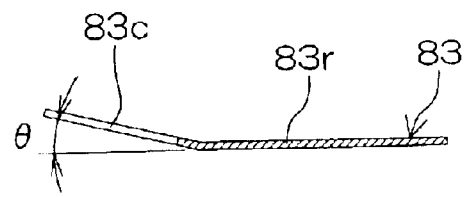

FIGS. 14(a) and 14(b) are schematic plan views illustrating the shape of the cathode 83, and FIG. 14(c) is a sectional view of the cathode 83. Particularly, FIG. 14(a) illustrates the entire cathode 83, and FIG. 14(b) illustrates a part of the cathode 83 on a greater scale.

The cathode 83 is composed of a spring stainless steel having a thickness of about 0.1 mm, and has a surface plated with platinum. This prevents formation of an oxide film on the surface of the cathode 83, and prevents dissolution of the cathode 83 even if a reverse electric field is applied to the cathode 83. The platinum film of the cathode 83, if having a very small thickness, has a shorter service life. The cathode 83 behaves resiliently in contact with wafer W. However, if the platinum film of the cathode 83 is too thick, the film is liable to be cracked in the resilient behavior. In view of these, the thickness of the platinum film of the cathode 83 is preferably about 0.01 $\mu$m to about 2 $\mu$m.

The cathode 83 has a ring portion 83r having a slightly greater inner diameter than the upper ring 80u, and a multiplicity of contact portions 83c arranged like a comb circumferentially of the cathode ring 80 as extending from the ring portion 83r toward the center of the cathode ring 80. The contact portions 83c are each bent at an angle θ of 5 to 60 degrees with their distal ends raised toward the wafer back side press plate 81a.

With the cathode 83 attached to the cathode ring 80, the distal ends of the contact portions 83c project from the gap between the upper ring 80u and the base ring 80b toward the inner periphery of the upper ring 80u (see FIGS. 11 and 13(b)). The bent contact portions 83c are restricted by the upper ring 80u (see FIG. 11).

Referring to FIG. 11, the cathode 83 is brought into resilient contact with a peripheral edge portion of the surface of the wafer W opposite from the wafer back side press plate 81a, while the wafer W is held between the abutment portion 80a and the wafer back side press plate 81a. That is, the contact portions 83c can be kept in contact with the wafer W at a predetermined contact pressure.

An electrically-conductive ring-shaped electrode press 80d is disposed between the base ring 80b and the upper ring 80u on a side of the conduction plate 80c opposite from the spin base 78. The base ring 80b has a groove, in which a coil spring 80e is housed. The cathode 83 is fixed to the electrode press 80d for electrical connection, and the electrode press 80d and the conduction plate 80c are kept in resilient contact with each other by the coil spring 80e for electrical connection. Thus, the electrical connection is maintained between the electrode press 80d and the conduction plate 80c, even if the base ring 80b is pressed by the wafer back side press plate 81a to be warped or slightly offset from the upper ring 80u.

The support posts 79 are electrically conductive, and extend through the upper ring 80u so as to be electrically connected to the conduction plate 80c. The support posts 79 are not provided equidistantly circumferentially of the cathode ring 80, but provided in two pairs which are spaced at 180 degrees about the center of the cathode ring 80 (see FIG. 13(a)). Thus, the wafer W can easily be inserted between the wafer back side press plate 81a and the cathode ring 80 through a space defined between the support posts 79.

O-rings 80r are provided between the support posts 79 and the upper ring 80u (around the support posts 79), between the upper ring 80u and the base ring 80b around the conduction plate 80c, between the upper ring 80u and the electrode press 80d (along the inner periphery of the electrode press 80d), and between the base ring 80b and the electrode press 80d (along the outer periphery of the electrode press 80d). This prevents the plating liquid from intruding into the cathode ring 80. When the cathode ring 80 is detached from the spin base 78 for cleaning thereof, it is merely necessary to immerse the cathode ring 80 in the cleaning liquid without the need for disassembling the cathode ring 80.

Electrically conductive coupling members 79j are attached to ends of the support posts 79 opposite from the conduction plate 80c. The coupling members 79j each couple two adjacent support posts 79 (see FIG. 13(a)). The coupling members 79j are each formed with a positioning hole 79h.

A conduction line 198 is provided within the spin base 78 and the rotary pipe 77. Electrically conductive coupling members 78j are each attached to the peripheral portion of the surface of the spin base 78 facing toward the cathode ring 80 via an insulative plate 78i. The conduction line 198 is electrically connected to the coupling member 78j via a conduction stud 78s extending through the insulative plate 78i. The coupling member 78j has a positioning pin 78p.

The coupling member 78j and the coupling member 79j are coupled to each other with the positioning pin 78p fitted in the positioning hole 79h. Thus, the cathode ring 80 is fixed to the spin base 78 in proper positional relationship. Even when the cathode ring 80 is rotated at a high speed, there is no possibility that the cathode ring 80 is offset. When the cathode ring 80 is detached from the spin base 78 by decoupling the coupling members 78j, 79j, the support posts 79 serve as handles of the cathode ring 80.

With the aforesaid arrangement, the cathode 83 is electrically connected to the conduction line 198.

Referring to FIGS. 9 and 10, an electrical connection mechanism 192 is provided between a plating power source 82 and the conduction line 198, so that electrically connection can be established between the conduction line 198 rotated together with the cathode ring 80 and the plating power source 82 on the side of the stationary system.

The electrical connection mechanism 192 includes an electrically conductive pulley 193 fitted around an end portion of the rotary pipe 77 opposite from the spin base 78, an electrically conductive rotary shaft 194 rotatably attached to the inversion base 181 in parallel relation to the rotary pipe 77, an electrically conductive pulley 195 fitted around the rotary shaft 194, an electrically conductive belt 196 stretched between the pulley 193 and the pulley 195, and a slip ring 197 attached to a distal end of the rotary shaft 194.

An end of the rotary shaft 194 opposite from the slip ring 197 is rotatably supported by a bearing box 200 attached onto the inversion base 181. The end of the rotary shaft 194 adjacent to the bearing box 200 is isolated from the surroundings by the bearing box 200.

The pulleys 193, 195 each have a surface plated with gold, for example, which is kept in contact with the belt 196. The belt 196 may be a steel belt having a surface plated with gold, for example. In this case, the electrical resistance between the pulley 193 and the pulley 195 can be reduced. The pulley 193 and the pulley 195 are mechanically connected to each other by the belt 196. When the rotary pipe 77 is rotated by the rotative driving mechanism 45, the rotative driving force is transmitted to the rotary shaft 194 via the pulley 193, the belt 196 and the pulley 195, whereby the rotary shaft 194 is rotated. Even during the rotation of the rotary pipe 77 and the rotary shaft 194, the electrical connection between the pulleys 193 and 195 is maintained through the belt 196.

The slip ring 197 is capable of electrically connecting the stationary system to the rotary system, and has a stationary terminal 197a and a rotary terminal 197b. The slip ring 197 is of a non-slidable type, which has no sliding contact between solid components, but establishes the electrical connection between the stationary terminal 197a and the rotary terminal 197b, for example, by mercury. Therefore, the electrical connection between the terminals 197a and 197b is stable with a reduced noise. In addition, the slip ring 197 has a longer service life.

The conduction line 198 (see FIG. 11) is electrically connected to the pulley 193. The pulley 193 is electrically isolated from the rotary pipe 77. Further, the pulley 195 is electrically connected to the rotary shaft 194. The rotary shaft 194 is electrically connected to the rotary terminal 197b of the slip ring 197. The stationary terminal 197a of the slip ring 197 is electrically connected to the plating power source 82 via a conduction line 199A.

With the aforesaid arrangement, a conduction path between the cathode 83 and the plating power source 82 is established via the electrode press 80d, the coil spring 80e, the conduction plate 80c, the support posts 79, the coupling members 79j, 78j, the conduction studs 78s, the conduction line 198, the pulley 193, the belt 196, the pulley 195, the rotary shaft 194, the slip ring 197 and the conduction line 199A. Thus, the to-be-treated surface of the wafer W held between the cathode ring 80 and the wafer back side press plate 81a can be energized.

Even when the wafer W is rotated by the rotative driving mechanism 45, the electrical connection between the cathode 83 and the plating power source 82 is maintained by the electrical connection mechanism 192. Where the belt 196 is stretched between the pulleys 193 and 195 with a sufficiently great tensile force, the belt 196 can be brought into non-sliding contact with the pulleys 193 and 195. Since the slip ring 197 is of a non-slidable type, there is no sliding contact in the conduction path between the plating power source 82 and the cathode 83. Therefore, the electrical connection can properly be established between the plating power source 82 and the cathode 83, while a noise attributable to the sliding contact such as a so-called brush noise is suppressed.

Since the rotary joint 191 and the slip ring 197 are respectively attached to the ends of the support shaft 81b and the rotary shaft 194, the replacement thereof is easy. That is, when one of the rotary joint 191 and the slip ring 197 is replaced, interference between the rotary joint 191 and the slip ring 197 can be avoided, which may otherwise occur where the rotary joint 191 and the slip ring 197 are both attached to the support shaft 81b or the rotary pipe 77.

Since the rotary joint 191 and the slip ring 197 are respectively attached to the ends of the support shaft 81b and the rotary shaft 194, the lengths of the support shaft 81b (rotary pipe 77) and the rotary shaft 194 can be reduced. Therefore, the size of the wafer holding/rotating mechanism 74a to 74d as measured axially of the support shaft 81b can be reduced, so that the wafer holding/rotating mechanism 74a to 74d can be inverted with a reduced turning radius.

Where the pulleys 193 and 195 are directly engaged with each other without the belt 196, the same effects can be provided. Further, where electrically conductive gears are employed instead of the pulleys 193, 195 and meshed with each other, the same effects can be provided.

The components which constitute the conduction path extending from the cathode 83 to the plating power source 82 are isolated from the other metal components, the metal screws and the metal bearings, and assuredly isolated from the ground. This prevents the electric current from flowing through unintended portions, and prevents a noise from interfering with the electric current flowing between the cathode 83 and the plating power source 82.

The operations of the plating power source 82, the inversion driving section 43 (rotary actuator 183), the lift mechanism 44 (first motor 44*a*), the rotative driving mechanism 45 (second motor 45*a*) and the susceptor movement mechanism 46 (air cylinder 46*a*), and the opening and closing of the valves 201V, 202V are controlled by the system controller 155.

Next, an explanation will be given to the construction of the plating cup 56*a* to 56*d*. Referring to FIGS. 9 and 11, the plating vessel 61*a* to 61*d* includes a cylindrical side wall having an inner diameter virtually equal to the outer diameter of the wafer W. A plating liquid supply port 54 is provided in a bottom center portion of the plating vessel 61*a* to 61*d*. The branch liquid supply pipe 58*a* to 58*d* is connected to the plating liquid supply port 54 as slightly projecting into the plating vessel 61*a* to 61*d*. A hemispherical shower head 75 having a multiplicity of holes is attached to an end of the branch liquid supply pipe 58*a* to 58*d* located in the plating vessel 61*a* to 61*d*. The plating liquid is diffusively introduced in various directions (at various angles) into the plating vessel 61*a* to 61*d* through the shower head 75.

A three-dimensional filter including a plurality of fluororesin mesh members 49 (about 3 to about 300 fluororesin mesh members) stacked one on another is provided in an upper portion of the plating vessel 61*a* to 61*d*. For example, the mesh members 49 each have an open mesh size of about 0.5 mm to about 5 mm.

The mesh members 49 each have a round plan shape having an outer diameter virtually equal to the inner diameter of the plating vessel 61*a* to 61*d*. The plurality of stacked mesh members 49 generally entirely cover the plating vessel 61*a* to 61*d* as viewed in plan. The plating liquid supplied upward from the lower side of the plating vessel 61*a* to 61*d* is rectified by the mesh members 49.

A mesh anode 76 is provided at a level about one fourth the depth of the plating vessel 61*a* to 61*d* from the bottom in the plating vessel 61*a* to 61*d* (between the shower head 75 and the mesh members 49). The anode 76 is a titanium mesh member coated with iridium oxide, and is insoluble in the plating liquid. Since the anode 76 is mesh-shaped, the flow of the plating liquid is not hindered by the anode 76.

The anode 76 has a round plan shape having an outer diameter virtually equal to the inner diameter of the plating vessel 61*a* to 61*d*, and generally entirely covers the plating vessel 61*a* to 61*d* as viewed in plan. The anode 76 is connected to the plating power source 82 via a conduction line 199B.

Components which constitute a conduction path extending from the anode 76 to the plating power source 82 are isolated from the other metal components, and assuredly isolated from the ground. This prevents the electric current from flowing through unintended portions, and prevents a noise from interfering with the electric current flowing between the anode 76 and the plating power source 82.

Figure 15:
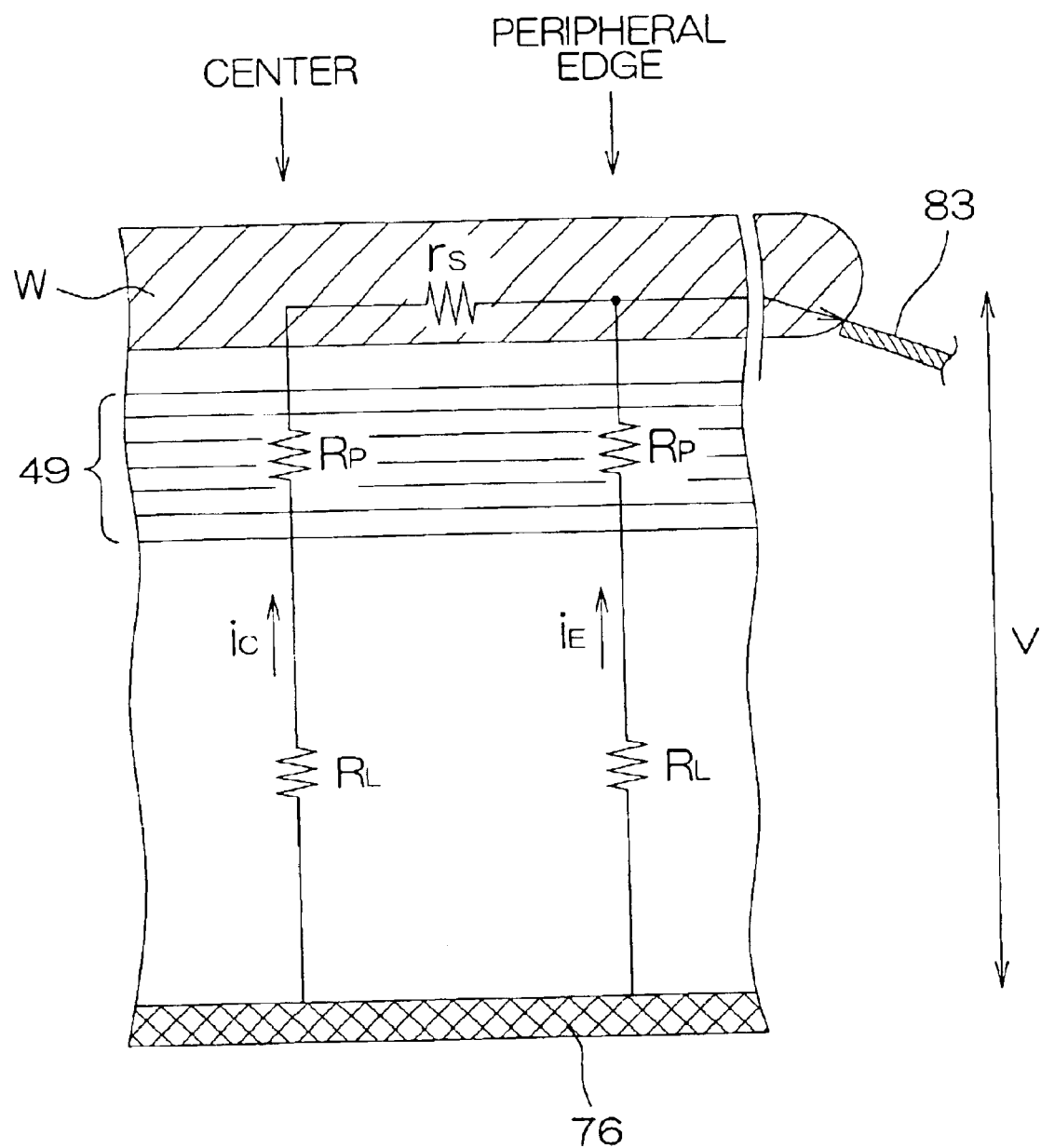
FIG. 15 is a schematic diagram illustrating an electrical equivalent circuit in a plating vessel.

FIG. 15 is a schematic diagram illustrating an electric equivalent circuit in the plating vessel 61*a* to 61*d*. With reference to FIG. 15, an explanation will be given to how the mesh members 49 influence the uniformity of the plating.

It is herein assumed that: the plating liquid has an electrical resistance $R_L$ in a region of the plating vessel between the anode 76 and the mesh members 49; the plating liquid has an electrical resistance $R_P$ in a region of the plating vessel where the vertically stacked mesh members 49*a* are disposed; the seed layer formed on the to-be-treated surface of the wafer W has an electrical resistance $r_s$ between the center and the periphery thereof; and a voltage V is applied between the cathode 83 and the anode 76.

Provided that the amperage of the electric current flowing vertically from the center of the anode 76 to the center of the wafer W is $i_c$ and the amperage of the electric current flowing vertically from the peripheral portion of the anode 76 to the peripheral portion of the wafer W is $i_E$, the voltage V is represented by an expression $V=i_E(R_L+R_P)=i_c(R_L+R_P+r_s)$. That is, the amperage $i_E$ of the electric current flowing vertically from the peripheral portion of the anode 76 to the peripheral portion of the wafer W is smaller than the amperage $i_c$ of the electric current flowing vertically from the center of the anode 76 to the center of the wafer W.

In the region where the mesh members 49 are disposed, the electric current flows only through the plating liquid which fills voids of the mesh members 49, because the mesh members 49 are composed of an insulative material. Therefore, the plating liquid in the region where the mesh members are present has a higher electrical resistance (e.g., a twice higher electrical resistance) than the plating liquid in the region where the mesh members 49 are absent. Accordingly, the electrical resistance $r_s$ of the seed layer between the center and the peripheral portion of the seed layer is smaller than the electrical resistance $R_L+R_P$ of the plating liquid in the entire plating vessel including the region where the mesh members 49 are present ($r_s<<R_L+R_P$).

Therefore, there is only a small difference between the amperage $i_c$ of the electric current flowing vertically from the center of the anode 76 to the center of the wafer W and the amperage $i_E$ of the electric current flowing vertically from the peripheral portion of the anode 76 to the peripheral portion of the wafer W. Since a film growth rate in the plating process is proportional to the amperage of the electric current flowing across the interface between the plating liquid and the wafer W, a difference in the thickness of the film formed by the plating between the center and the peripheral portion of the wafer W is reduced. That is, the uniformity of the thickness of the film formed by the plating is improved by providing the mesh members 49 in the plating liquid. The uniformity of the film thickness is improved as the electrical resistance of the conduction path is increased by the provision of the mesh members 49.

Referring to FIG. 9, a plating liquid outlet port 53 is provided in the bottom of the plating liquid recovery vessel 62*a* to 62*d*. The branch return pipe 63*a* to 63*d* is connected in communication with the plating liquid recovery vessel 62*a* to 62*d* via the plating liquid outlet port 53.

An upper edge portion of the plating vessel 61*a* to 61*d* has a reduced wall thickness with its outer circumferential portion cut away, and is complementary in configuration to a portion of the cathode ring 80 (base ring 80*b*) which is brought into opposed relation to the upper edge portion of the plating vessel 61*a* to 61*d* in the plating process. This prevents the interference between the plating vessel 61*a* to 61*d* and the cathode ring 80 in the plating process. A distance between the upper edge of the plating vessel 61*a* to 61*d* and the wafer W may be adjusted within a predetermined range from 0 mm (see FIG. 11). In the plating process, the projection 80*p* of the cathode ring 80 is inserted in an upper portion of the recovery vessel 62*a* to 62*d*.

With the wafer W in contact with the plating liquid, the distance between the wafer W and the mesh members 49 is adjusted within a range between 0.5 mm and 20 mm in consideration of the flow of the plating liquid. More specifically, where the distance between the wafer W and the mesh members 49 is reduced as described above, the plating liquid is drawn by the rotating wafer W only in a limited region. This suppresses the eddy flow of the plating liquid which is unwanted for the plating. Thus, the film formed by the plating has a uniform thickness.

A cathode cleaning liquid collection vessel 210 is provided around the plating liquid recovery vessel 62a to 62d for collecting the cathode cleaning liquid after cleaning the cathode 83. That is, the plating cup 56a to 56d has a triple structure having the plating vessel 61a to 61d, the plating liquid recovery vessel 62a to 62d and the cathode cleaning liquid collection vessel 210 arranged in this order from the inside to the outside.

An overflow pipe 213 and a drain pipe 214 are connected to the bottom of the cathode cleaning liquid collection vessel 210 via a liquid trap 211. The overflow pipe 213 is connected to an upper edge portion of a side wall of the liquid trap 211, while the drain pipe 214 is connected to the bottom of the liquid trap 211. A conductivity meter 212 is inserted in the liquid trap 211. Thus, the electrical conductivity of the liquid trapped in the liquid trap 211 can be measured. An output signal of the conductivity meter 212 is inputted to the system controller 155.

The flow channel of the drain pipe 214 is closed in the plating process, so that the liquid (cathode cleaning liquid and the like) flowing into the cathode cleaning liquid collection vessel 210 fills the liquid trap 211 and overflows through the overflow pipe 213. When the plating unit 20a to 20d is not in use, the flow channel of the drain pipe 214 is opened to drain the liquid from the liquid trap 211.

An air outlet pipe 215 is also connected to the bottom of the cathode cleaning liquid collection vessel 210, so that gas can be exhausted from the cathode cleaning liquid collection vessel 210. For prevention of intrusion of the cathode cleaning liquid into the air outlet pipe 215, a cover is provided above the air outlet pipe 215 so as not to close an open end of the air outlet pipe 215.

Figure 16:
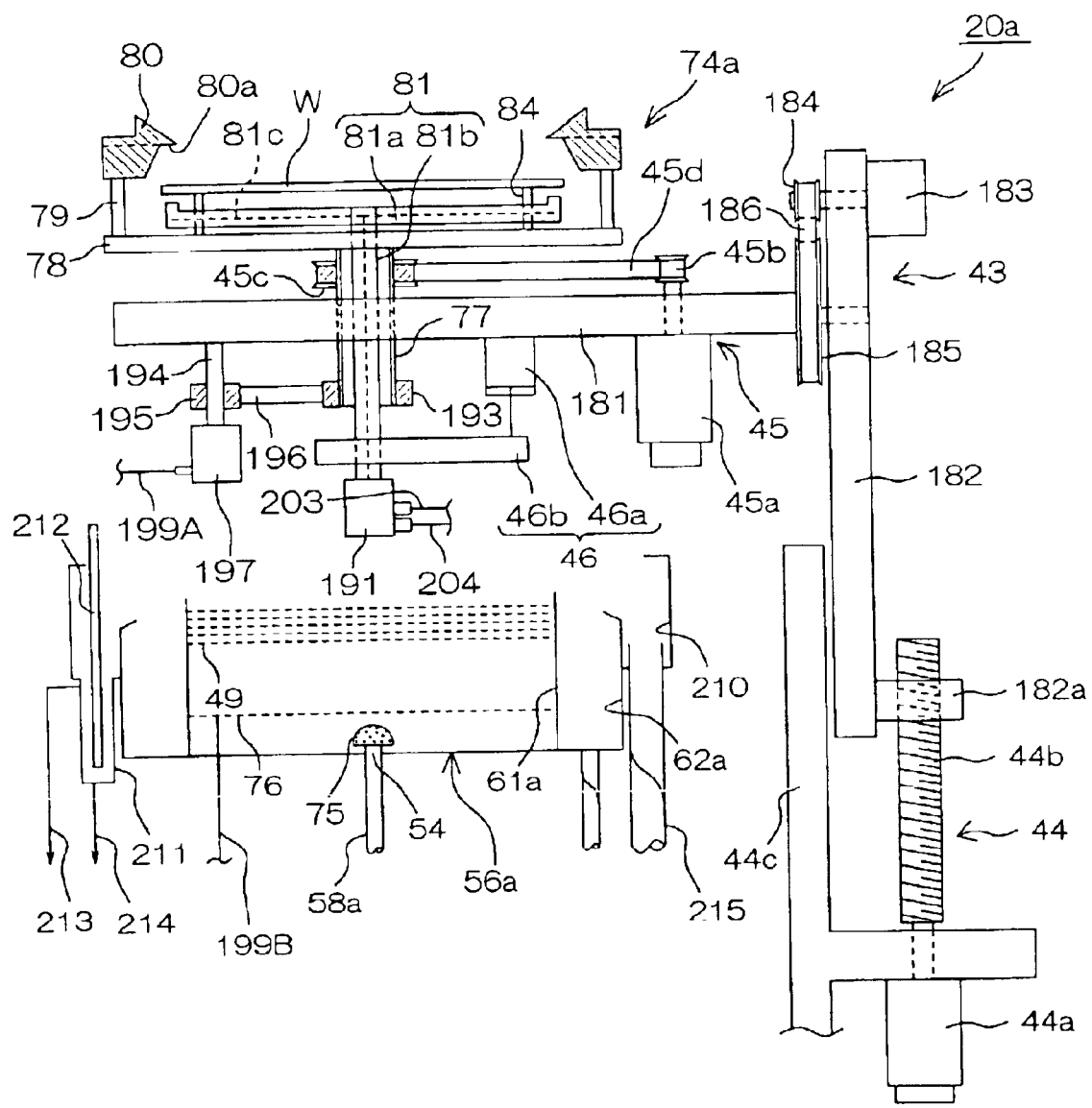
FIG. 16 is a schematic sectional view illustrating the plating unit with a spin base facing upward.

When the plating process is performed in the plating section 12, the system controller 155 first controls the inversion driving section 43 to invert any of the wafer holding/rotating mechanisms 74a to 74d (herein assumed to be the wafer holding/rotating mechanism 74a) with the wafer back side press plate 81a thereof facing upward. Further, the system controller 155 controls the susceptor movement mechanism 46 to move the wafer back side press plate 81a toward the rotary pipe 77, so that the wafer transfer pins 84 project out through the wafer back side press plate 81a. This state is shown in FIG. 16.

The rotation angular position of the spin base 78 is adjusted so that a circumferential portion of the spin base 78 having a wider support post interval (see FIGS. 13(a) and 13(b) ) is positioned in opposed relation to the second transport path 15. The spin base 78 is kept at the rotation angular position by a retention torque of the second motor 45a.

On the other hand, an untreated wafer W is taken out of the cassette C by means of the retractable arm 41 or the retractable arm 42 of the transport robot TR (see FIGS. 5(a), 5(b) and 5(c)). The wafer W is loaded onto the wafer transfer pins 84 through the space between the support posts 79 by the transport robot TR with the center of the wafer W coinciding with the center axis of the rotary pipe 77 (see FIGS. 13(a) and 13(b)). In this state, the to-be-treated (to-be-plated) surface of the wafer W faces upward.

Then, the system controller 155 controls the susceptor movement mechanism 46 to move the wafer back side press plate 81a apart from the rotary pipe 77. Thus, the wafer back side press plate 81a presses the peripheral edge portion of the lower (back) surface of the wafer W, and the peripheral edge portion of the upper surface of the wafer W is pressed against the abutment portion 80a of the cathode ring 80. That is, the wafer W is held between the wafer back side press plate 81a and the abutment portion 80a of the cathode ring 80. Thus, the peripheral edge portion of the upper surface of the wafer W is sealed by the sealing surface 80s of the abutment portion 80a, while the cathode 83 is biased toward the wafer W into contact with the peripheral edge portion of the upper surface (to-be-treated surface) of the wafer W.

The system controller 155 controls the inversion driving section 43 to invert the wafer holding/rotating mechanism 74a so that the wafer W faces downward. Then, the pump P1 is actuated under the control of the system controller 155 to supply the plating liquid into the plating vessel 61a at a flow rate of 10 l/min (see FIG. 7). Thus, the plating liquid is slightly raised from the edge of the plating vessel 61a to overflow into the recovery vessel 62a.

In turn, the system controller 155 controls the lift mechanism 44 to lower the wafer holding/rotating mechanism 74a. The lowering rate of the wafer holding/rotating mechanism 74a is reduced when the distance between the lower surface of the wafer W and the surface of the plating liquid is reduced to not greater than several millimeters. Then, the lower surface of the wafer W is gradually brought into contact with the surface of the plating liquid filled in the plating vessel 61a. A period from the start of the contact of the wafer W with the plating liquid to the completion of the contact should be such that the seed layer formed on the lower surface of the wafer W is hardly dissolved in the plating liquid.

Since the surface of the cathode ring 80 opposed to the plating vessel 61a is complementary in configuration to the upper edge of the plating vessel 61a, the cathode ring 80 is fitted around the upper edge of the plating vessel 61a. When the distance between the lower surface of the wafer W and the surface of the plating liquid is reduced to several millimeters, the system controller 155 controls the plating power source 82 to apply a first voltage between the anode 76 and the cathode 83.

With the lower surface of the wafer W in contact with the surface of the plating liquid, the to-be-treated surface of the wafer W is spaced about 0.5 mm to about 1 mm from the upper edge of the plating vessel 61a. A portion of the lower surface of the wafer W inward of the sealing surface 80s of the abutment portion 80a is entirely kept in contact with the plating liquid. The plating liquid flows from the center to the peripheral edge of the wafer W along the interface between the plating liquid and the wafer W, and then flows into the plating liquid recovery vessel 62a through a gap between the upper edge of the plating vessel 61a and the wafer W.

Subsequently, the system controller 155 controls the rotative driving mechanism 45 to rotate the wafer W at a relatively low rotation speed (e.g., 10 rpm to 100 rpm), and then controls the plating power source 82 to apply a second voltage (plating voltage) between the anode 76 and the cathode 83 for energization according to a predetermined electric current pattern for several minutes. Thus, electrons are donated to copper ions in the plating liquid in the interface between the plating liquid and the lower surface of the wafer W connected to the cathode 83, so that copper atoms are deposited on the lower surface of the wafer W. Thus, the lower surface of the wafer W is plated with copper.

Since the wafer W has an outer diameter virtually equal to the inner diameter of the plating vessel 61a and the anode 76 virtually covers the entire plating vessel 61a as seen in plan, a generally uniform electric field is formed between the anode 76 and the seed layer formed on the lower surface of the wafer W. Thus, the copper film formed by the plating has a uniform thickness.

Iron ions as an oxidizing/reducing agent are present in the form of divalent or trivalent iron ions in the plating liquid. The copper supply source (copper tube) housed in the major constituent managing section 2 (see FIG. 1) is deprived of electrons by the trivalent iron ions to release copper ions, while the trivalent iron ions are turned into divalent iron ions. On the other hand, the divalent iron ions donate electrons to the anode 76 thereby to be turned into trivalent iron ions.

In this embodiment, the mesh anode 76 has a sufficiently great surface area (e.g., a surface area two to ten times the area to be plated). Further, the plating liquid can be applied to the entire anode 76 at a sufficiently high flow rate by the shower head 75. Thus, a sufficient amount of divalent iron ions can be supplied to the anode 76 to promote the reaction in which the divalent iron ions donate electrons to the anode 76 thereby to be turned into trivalent iron ions.

Thus, the iron ions cyclically experience the oxidization and the reduction, so that the amount of electrons transferred between the plating liquid and the anode 76 is virtually balanced with the amount of electrons transferred between the cathode 83 and the plating liquid.

Therefore, the plating process is free from bubbles of active oxygen, which may otherwise be generated when the oxidizing/reducing agent is not used. Thus, oxidative decomposition of the additives contained in the plating liquid can be retarded. Further, it is possible to eliminate the possibility that the oxygen bubbles adhere on the lower surface of the wafer W and fill the fine holes or grooves formed in the surface (lower surface) of the wafer W to hinder the plating.

The plating liquid is drawn by the rotating wafer W in the vicinity of the interface between the plating liquid and the wafer W, and subjected to a centrifugal force. However, the plating liquid can assuredly be introduced into the recovery vessel 62a by the projection 80p of the cathode ring 80.

Upon the energization of the plating power source 82, the valve 201V is opened under the control of the system controller 155. Thus, the cathode cleaning liquid is introduced into the fluid channel 81c. The cathode cleaning liquid flows out of the peripheral openings of the wafer back side press plate 81a, and is introduced into the cathode cleaning liquid collection vessel 210 through the fluid channels 80f (see FIG. 11). Thus, the cathode electrode 83 is cleaned with the cathode cleaning liquid.

The plating liquid is present opposite from the cathode 83 with respect to the wafer W and the abutment portion 80a. Therefore, the plating liquid does not flow to the cathode 83 with the peripheral edge portion of the wafer W being sealed by the sealing surface 80s of the abutment portion 80a. On the other hand, if the sealing between the wafer W and the abutment portion 80a is insufficient, the plating liquid flows into a gap between the wafer W and the abutment portion 80a to reach the cathode 83. If the energized cathode 83 is kept in contact with the plating liquid, the cathode 83 is liable to be damaged (plated). Further, if the plating process is performed with the plating liquid leaking through the gap between the wafer W and the abutment portion 80a, the film formed by the plating is poorer in uniformity.

However, the plating liquid reaching the cathode 83 is washed away by the cathode cleaning liquid, so that the cathode 83 is protected. Then, the cathode cleaning liquid and the plating liquid flow into the liquid trap 211 from the cathode cleaning liquid collection vessel 210. The cathode cleaning liquid and the mixture of the cathode cleaning liquid and the plating liquid differ in electrical conductivity. Where the cathode cleaning liquid is deionized water, for example, the electrical conductivity of the cathode cleaning liquid is drastically increased by the plating liquid slightly mixed in the cathode cleaning liquid.

Therefore, a threshold is properly set for the electrical conductivity measured by the conductivity meter 212, so that the system controller 155 can detect the leakage of the plating liquid from the gap between the wafer W and the abutment portion 80a on the basis of the output signal of the conductivity meter 212. Upon detection of the leakage, the operation of the plating unit 20a is automatically interrupted under the control of the system controller 155, and the operator is informed of the leakage of the plating liquid. This prevents continuation of uneven plating of the wafer W to avoid continuous production of defective products.

After the plating process is performed on the wafer W for a predetermined period, the system controller 155 controls the plating power source 82 to stop the energization between the anode 76 and the cathode 83, and controls the lift mechanism 44 to lift the wafer W so that the lower surface of the wafer W is spaced several millimeters apart from the surface of the plating liquid filled in the plating vessel 61a.

Further, the system controller 155 controls the rotative driving mechanism 45 to rotate the wafer W at a relatively high speed (e.g., 200 rpm to 1000 rpm) for several tens seconds. Thus, the plating liquid is laterally spun off from the lower surface of the wafer W. At this time, the plated surface of the wafer W is kept covered with a film of the plating liquid rather than completely dried. Thus, the plated surface of the wafer W is prevented from being corroded during transportation of the wafer W.

Under the control of the system controller 155, the valve 201V is closed and the valve 202V is opened. Thus, the cathode cleaning liquid remaining in the fluid channel 81c is purged by nitrogen gas, and the cathode cleaning liquid in the fluid channels 80f is laterally drained by a centrifugal force. The cathode cleaning liquid remaining in the leak pipe 204 may be sucked to be drained by the ejector not shown.

In turn, the system controller 155 controls the rotative driving mechanism 45 to stop the rotation of the wafer W, and controls the lift mechanism 44 to lift the wafer holding/rotating mechanism 74a to a predetermined position. Then, the system controller 155 controls the inversion driving section 43 to invert the wafer holding/rotating mechanism 74a so that the wafer W faces upward. The rotation angular position of the spin base 78 is adjusted so that the circumferential portion of the spin base 78 having a wider support post interval is positioned in opposed relation to the second transport path 15. The spin base 78 is kept at the rotation angular position by a retention torque of the second motor 45a.

Thereafter, the system controller 155 controls the susceptor movement mechanism 46 to move the wafer back side press plate 81a toward the rotary pipe 77, whereby the wafer W is disengaged from the wafer back side press plate 81a.

At this time, the wafer W is smoothly released from the sealing surface 80s by the resilience of the cathode 83, so that the wafer W is supported on the wafer transfer pins 84 as shown in FIG. 16. Since the cathode cleaning liquid is not present in the fluid channels 80f, the cathode cleaning liquid does not drip on the upper surface (plated surface) of the wafer W.

After the wafer W is moved apart from the abutment portion 80a, the plating liquid remaining on the plated surface of the wafer W is sucked through a gap between the sealing surface 80s and the wafer W, so that the contact portions 83c of the cathode 83 are contaminated with the plating liquid. However, the plating liquid adhering to the contact portions 83c is rinsed off with the cathode cleaning liquid when the plating process is performed on the next wafer W. Therefore, the next plating process can be performed with the contact portions 83c kept clean.

The treated wafer W is unloaded through the space between the support posts 79 by the retractable arm 42 or the retractable arm 41 of the transport robot TR. Thus, the plating process on the single wafer W is completed.

The plating process maybe performed simultaneously in the plating cups 56a to 56d by simultaneously actuating the four pumps P1 to P4, or in some of the plating cups 56a to 56d by actuating corresponding ones of the pumps P1 to P4.

Figure 17:
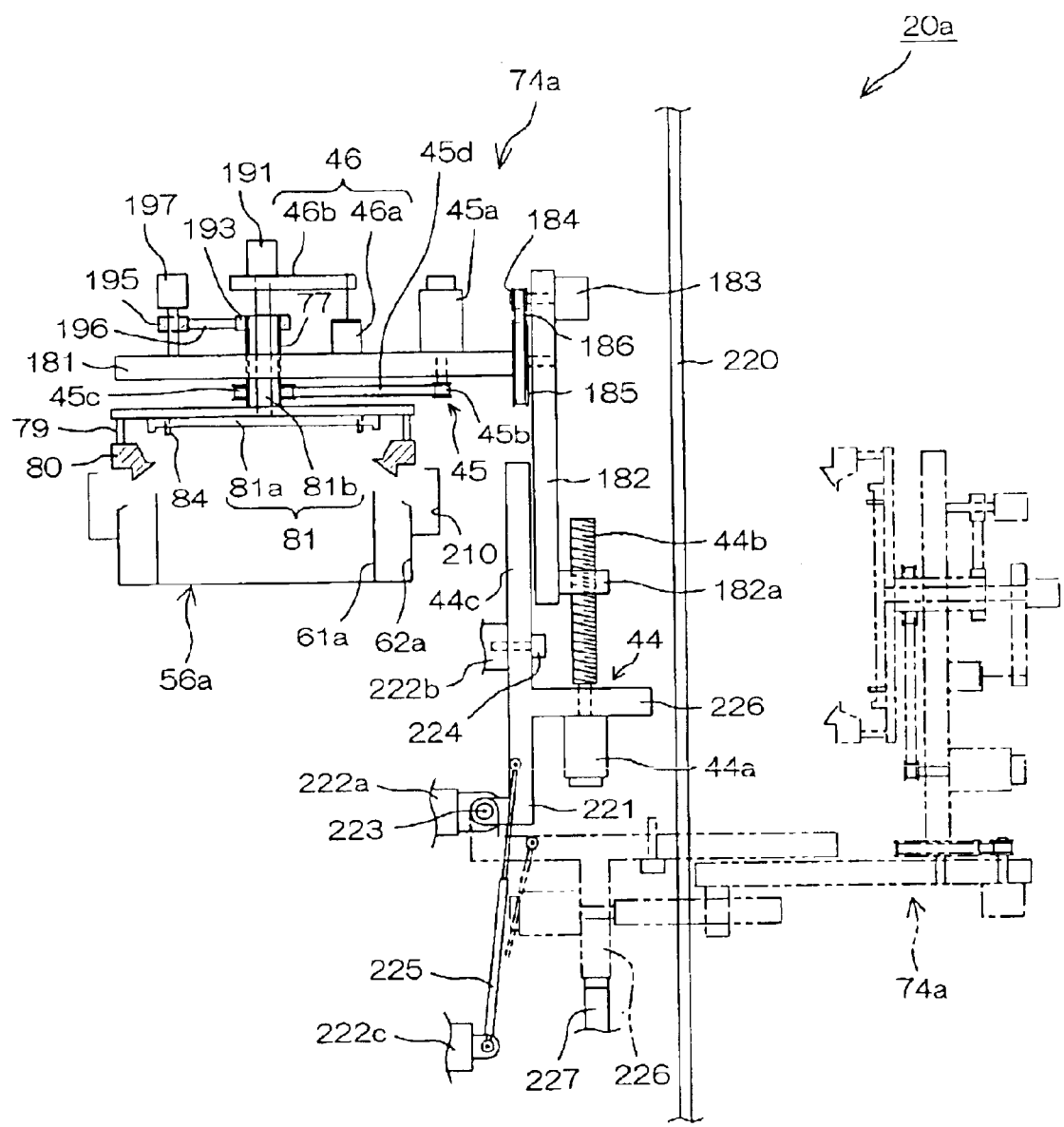
FIG. 17 is a schematic side view of the plating unit.

FIG. 17 is a schematic side view of the plating unit 20a. With reference to FIG. 17, an explanation will be given to an operation to be performed for the maintenance of the plating unit 20a. Since the plating units 20b to 20d have the same construction as the plating unit 20a, the maintenance operation can be performed in the same manner.

An outer cover 220 is provided as apart of the barrier wall of the enclosure 30 on a side of the plating unit 20a opposite from the second transport path 15. The outer cover 220 is removable from the enclosure 30. When the maintenance operation of the plating unit 20a is performed, the outer cover 220 is removed.

The guide 44c of the lift mechanism 44 includes a pivot member 221 provided at an end thereof adjacent to the first motor 44a as extending longitudinally of the guide 44c. The pivot member 221 is hinged to a frame 222a of the wafer treating section 1 so as to be pivotal about a pivot shaft 223 extending generally horizontally and parallel to the second transport path 15. The pivot shaft 223 is located closer to the outer cover 220 than the plating cup 56a at a lower position than the plating cup 56a.

The guide 44c can be fixed to a frame 222b of the wafer treating section 1 located at a higher position than the frame 222a by a fixture screw 224. With the guide 44c fixed to the frame 222b by the fixture screw 224, the vertical base 182 is located vertically, and the wafer holding/rotating mechanism 74a is located above the plating cup 56a. In this state, the plating process is performed.

The pivoting of the guide 44c is restricted by the frame 222b so as not to be inclined toward the plating cup 56a from a vertical position. That is, the guide 44c is only permitted to pivot apart from the plating cup 56a from the vertical position.

The pivot member 221 is coupled to a frame 222c of the wafer treating section 1 located at a lower position than the frame 222a via a gas damper 225. The gas damper 225 includes a cylinder and a piston, and is designed so that the piston resists a force exerted thereon inwardly of the cylinder by the pressure of gas charged in the cylinder. A cylinder end of the gas damper 225 is pivotally attached to the frame 222c, while a piston end of the gas damper 225 is pivotally attached to the pivot member 221.

An abutment portion 226 extends from the guide 44c perpendicularly to the length of the guide 44c. When the guide 44c is pivoted about 90 degrees around the pivot shaft 223 from the vertical position, an end of the abutment portion 226 abuts against a stopper 227 provided on the frame of the wafer treating section 1 for prevention of further pivoting of the guide 44c. In this state, the guide 44c is kept generally horizontally. A portion of the stopper 227 to be brought into abutment against the abutment portion 226 is covered with a rubber, so that a shock exerted thereon can be alleviated when the abutment portion 226 abuts against the stopper 227.

When the maintenance operation of the plating unit 20a is performed, the outer cover 220 is removed with the plating process stopped. Thus, the operator can perform the maintenance operation on the side of the apparatus where the outer cover has been attached. Subsequently, the fixture screw 224 is removed, and the wafer holding/rotating mechanism 74a is gradually inclined toward the operator by pivoting the pivot member 221 about the pivot shaft 223.

At this time, the gas damper 225 is operative so that the piston is forced into the cylinder. Therefore, only a small force is required for the operator to incline the wafer holding/rotating mechanism 74a with the aid of the resilient force of the gas damper 225. Even if the operator inadvertently lets his hands off from the wafer holding/rotating mechanism 74a, the resilient force of the gas damper 225 prevents the wafer holding/rotating mechanism 74a from abruptly falling down.

With the guide 44c kept generally horizontally, the abutment portion 226 abuts against the stopper 227, so that the wafer holding/rotating mechanism 74a cannot be moved further more. In this state, the wafer holding/rotating mechanism 74a projects laterally from the wafer treating section 1, so that the top of the plating cup 56a is open. This state is illustrated by a two-dot-and-dash line in FIG. 17. Thus, the operator can easily access an intended portion, and easily perform the maintenance operation.

The plating process should be performed with the center axis of the cathode ring 80 coinciding with the center axis of the plating vessel 61a to 61d. This is because there is a very small gap between the upper edge of the plating vessel 61a to 61d and the lower surface of the cathode ring 80 in the plating process, and the plating vessel 61a to 61d interferes with the cathode ring 80 if the center of the wafer W held by the wafer holding/rotating mechanism 74a to 74d is offset from the center axis of the plating vessel 61a to 61d (see FIG. 11). The plating cup 56a to 56d is properly positioned so that the center axis of the cathode ring 80 coincides with the center axis of the plating vessel 61a to 61d.

Unless the upper edge of the plating vessel 61a to 61d is kept horizontal, the plating liquid cannot be raised from the edge of the plating vessel 61a to 61d so as to be brought into contact with the wafer W. Therefore, the upper edge of the plating vessel 61a to 61d, if not kept horizontal, should be leveled horizontally.

Figure 18:
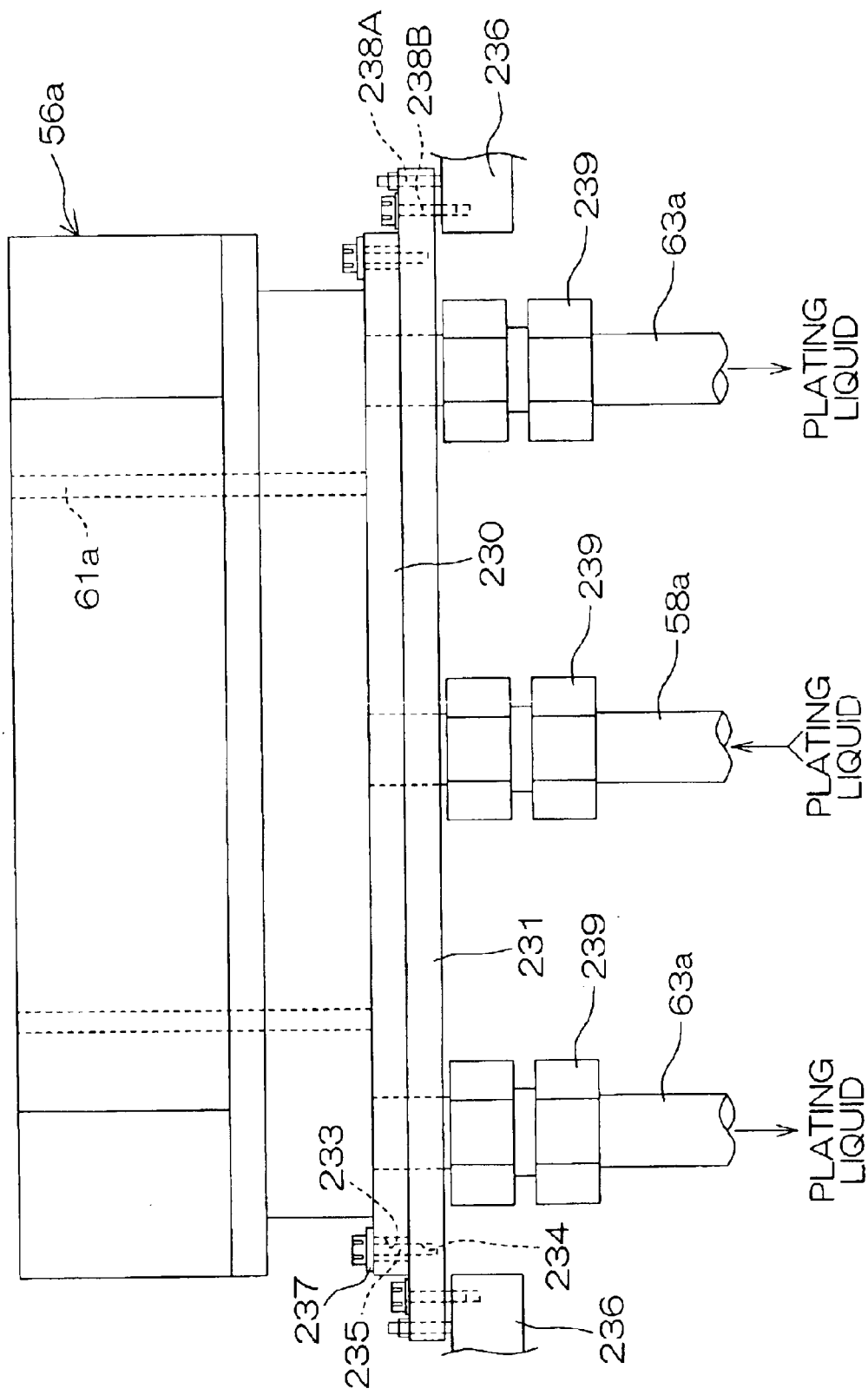
FIG. 18 is a schematic side view of a plating cup.

FIG. 18 is a schematic side view of the plating cup 56a. With reference to FIG. 18, an explanation will be given to how to position the plating cup 56a and how to level the upper edge of the plating cup 56a horizontally. Since the plating cups 56b to 56d have the same construction as the plating cup 56a, the positioning and leveling can be achieved in the same manner.

A first planar base plate 230 is unitarily fixed to the lower portion (bottom) of the plating cup 56a. The first base plate 230 is slightly greater in size than the bottom face of the plating cup 56a as viewed in plan. A second planar base plate 231 is attached to a lower portion of the first base plate 230 (opposite from the plating cup 56a). The second base plate 231 is fixed to a frame 236 of the wafer treating section 1. The second base plate 231 is slightly greater in size than the first base plate 230 as viewed in plan.

The first base plate 230 and the second base plate 231 each have through-holes extending through the thickness thereof, and the branch liquid supply pipe 58a and the branch return pipes 63a extend through these through-holes. The branch liquid supply pipe 58a and the branch return pipes 63a are connected to the plating cup 56a by fluororesin joints 239.

The first base plate 230 has at least three fixture holes 233 formed in a peripheral edge portion thereof as extending through the thickness thereof. The second base plate 231 has inner thread portions provided therein in association with the fixture holes 233. Fixture screws 235 having outer thread portions are respectively inserted through the fixture holes 233 and tightened into the inner thread portions 234 formed in the second base plate 231. Thus, the first base plate 230 is fixed to the second base plate 231.

The inner diameter of the fixture holes 233 is greater than the outer diameter of the fixture screws 235. For example, the fixture holes 233 each have an inner diameter of 10 mm, while the fixture screws 235 each have an outer diameter of 6 mm. In this case, the first base plate 230 is movable by 4 mm in any directions within the plane of the first base plate 230. In this case, washers 237 each having an outer diameter of 18 mm, for example, are provided between screw heads of the fixture screws 235 and the first base plate 230 to prevent the screw heads of the fixture screws 235 from falling into the fixture holes 233.

With the fixture screws 235 loosened, the first base plate 230 can be moved in any directions within the plane of the first base plate 230 to adjust the horizontal position of the plating vessel 61a.

The second base plate 231 is fixed to the frame 236 by at least three pairs of push screws 238A and pull screws 238B arranged in circumferentially spaced relation. The heights of the second base plate 231 from the frame 236 at the positions of the respective pairs of the push screws 238A and the pull screws 238B can be adjusted by properly adjusting the push screws 238A and the pull screws 238B. Thus, the inclination of the second base plate 231 can be adjusted.

In general, the upper edge of the plating vessel 61a is leveled horizontally by attaching the first base plate 230 to the horizontally leveled second base plate 231. For the leveling of the upper edge of the plating vessel 61a, a leveler is first placed on the second base plate 231 with the plating vessel 61a removed, and then the second base plate 231 is leveled horizontally. Thereafter, the first base plate 230 is attached to the second base plate 231. Thus, the upper edge of the plating vessel 61a is leveled horizontally.

At this time, the fixture screws 235 are loosened. In turn, the wafer holding/rotating mechanism 74a is lowered, and the first base plate 230 is moved with respect to the second base plate 231 so that the cathode ring 80 is fitted around the upper edge of the plating vessel 61a. Thus, the horizontal position of the plating vessel 61a is adjusted.

In general, the center axis of the cathode ring 80 and the center axis of the plating vessel 61a are adjusted generally parallel to each other with the wafer holding/rotating mechanism 74a and the plating cup 56a kept in opposed relation. Therefore, the plating vessel 61a is properly positioned in the aforesaid manner so that the center axis of the plating vessel 61a and the center axis of the cathode ring 80 can coincide with each other. With the plating vessel 61a properly positioned, the fixture screws 235 are tightened to fix the position of the plating vessel 61a.

Figure 19:
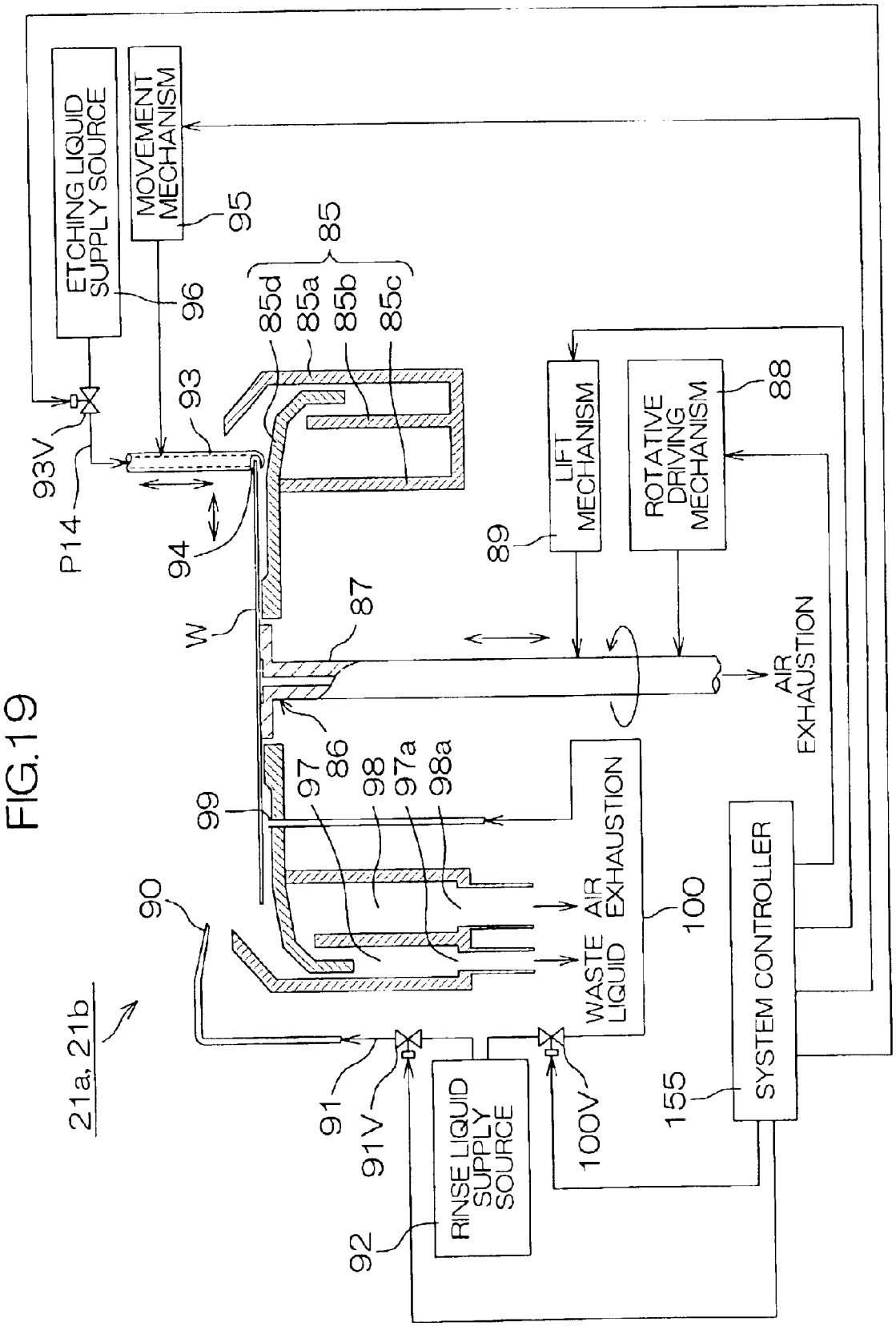
FIG. 19 is a schematic sectional view illustrating the construction of a bevel etching unit.

FIG. 19 is a schematic sectional view illustrating the common construction of the bevel etching units 21a, 21b.

A spin chuck 86 for generally horizontally holding and rotating the wafer W is provided in a generally cylindrical cup 85. The spin chuck 86 is adapted to hold the wafer W by sucking a center portion of the lower surface of the wafer W without contacting the peripheral edge of the wafer W. The spin chuck 86 has a vertical rotation shaft 87, and a rotative driving force is transmitted from a rotative driving mechanism 88 to the rotation shaft 87. A lift mechanism 89 for moving up and down the spin chuck 86 is coupled to the spin chuck 86, so that the spin chuck 86 can be brought into a state where its upper portion is accommodated in the cup 85 and into a state where its upper portion is located above an upper edge of the cup 85.

The cup 85 includes three cups 85a to 85c coaxially arranged. The outermost one of the cups 85a to 85c has an upper edge located at the highest position, and the middle cup 85b has an upper edge located at the lowest position. An annular treatment liquid guide plate 85d as seen in plan is coupled to an upper edge of the innermost cup 85c. An outer edge of the treatment liquid guide plate 85d is bent to be inserted into a space between the cup 85a and the cup 85b.

A treatment liquid collection vessel 97 having an open top is defined between the cup 85a and the cup 85b, and an air outlet vessel 98 is defined between the cup 85b and the cup 85c. A liquid drain port 97a is provided in the bottom of the treatment liquid collection vessel 97, and an air outlet port 98a is provided in the bottom of the air outlet vessel 98.

A rinse nozzle 90 is provided above the cup 85. A rinse liquid pipe 91 is connected in communication with the rinse nozzle 90, and a rinse liquid supply source 92 is connected to the rinse liquid pipe 91. A valve 91V is provided in the rinse liquid pipe 91. With the valve 91V being open, the rinse liquid can be discharged through the rinse nozzle 90 to be supplied to the upper surface of the wafer W held by the spin chuck 86.

Another rinse nozzle 99 extends through the treatment liquid guide plate 85d from the lower side. A rinse liquid pipe 100 is connected in communication with the rinse nozzle 99, and the rinse liquid supply source 92 is connected to the rinse liquid pipe 100. A valve 100V is provided in the rinse liquid pipe 100. With the valve 100V being open, the rinse liquid can be discharged through the rinse nozzle 99 to be supplied to the lower surface of the wafer W held by the spin chuck 86.

The rinse liquid may be, for example, deionized water. In this case, the rinse liquid (deionized water) can be supplied into the rinse liquid pipes 91, 100 through the deionized water pipe 32 extending through the deionized water pipe introduction port 32h formed in the enclosure 30 (see FIG. 3).

An etching pipe 93 is provided generally vertically above the cup 85. The etching pipe 93 has a groove 94 provided in a lower end portion thereof as opening horizontally toward the center of the cup 85 in association with the surface of the wafer W held by the spin chuck 86. The peripheral edge of the wafer W can be inserted in the groove 94. The inner space of the groove 94 and the inner space of the etching pipe 93 communicate with each other.

A movement mechanism 95 is coupled to the etching pipe 93. The etching pipe 93 can be moved vertically and radially of the cup 85 by the movement mechanism 95. Thus, the etching pipe 93 can be moved between a treatment position at which the peripheral edge of the wafer W is inserted in the groove 94 and a retracted position at which the etching pipe 93 is retracted from the treatment position apart from the wafer W. The etching pipe 93 can also be retracted laterally beyond the cup 85.

The etching pipe 93 is connected via the post-treatment agent pipe P14 to an etching liquid supply source 96 disposed in the post-treatment agent supplying section 4 (see FIG. 1) and containing the etching liquid. A valve 93V is provided in the post-treatment agent pipe P14 between the etching pipe 93 and the etching liquid supply source 96. With the valve 93V being open, the etching liquid can be supplied to the inner space of the groove 94. The flow rate of the etching liquid can also be adjusted by the valve 93V. The etching liquid may be, for example, a mixture of sulfuric acid, hydrogen peroxide aqueous solution and water.

The operations of the rotative driving mechanism 88, the lift mechanism 89 and the movement mechanism 95, and the opening and closing of the valves 91V, 100V, 93V are controlled by the system controller 155.

When the peripheral edge of the wafer W is to be etched by the bevel etching unit 21a, 21b, the system controller 155 first controls the movement mechanism 95 to retract the etching pipe 93 at the retracted position.

In turn, the system controller 155 controls the lift mechanism 89 to move up the spin chuck 86 so that the upper portion of the spin chuck 86 is located above the upper edge of the cup 85. The wafer W subjected to the plating process in the plating section 12 is loaded into the bevel etching unit 21a or 21b by the retractable arm 41 or the retractable arm 42 of the transport robot TR (see FIGS. 5(a), 5(b) and 5(c)), and held by the spin chuck 86 by suction with the center of the wafer W coinciding with the center axis of the rotation shaft 87. The surface of the wafer W subjected to the plating process faces upward.

Thereafter, the system controller 155 controls the lift mechanism 89 to move down the spin chuck 86. Thus, the wafer W held by the spin chuck 86 is surrounded by the cup 85a. Then, the system controller 155 controls the rotative driving mechanism 88 to rotate the wafer W held by the spin chuck 86. The rotation speed of the wafer W is, for example, about 500 rpm.

In this state, the valves 91V and 100V are opened under the control of the system controller 155. Thus, the rinse liquid is supplied to the upper and lower surfaces of the wafer W from the rinse nozzles 90 and 99. The rinse liquid spreads toward the peripheral edge of the wafer W by a centrifugal force, and flows over the entire upper surface of the wafer W and the lower surface of the wafer W except a portion thereof in contact with the spin chuck 86. Thus, the wafer W is cleaned.

The rinse liquid is spun off laterally of the wafer W by the centrifugal force, and flows over the interior of the cup 85a and the upper surface of the treatment liquid guide plate 85d down into the treatment liquid collection vessel 97. The rinse liquid is introduced into a collection tank not shown through the liquid drain port 97a. Further, gas is exhausted from the cup 85 through the air outlet port 98a by an air exhauster system not shown. Thus, mist of the rinse liquid and the like are prevented from scattering out of the cup 85.

After the rinsing process is performed for a predetermined period, the valves 91V, 100V are closed under the control of the system controller 155. The wafer W is continuously rotated, whereby the rinse liquid remaining on the wafer W is mostly spun off.

Subsequently, the system controller 155 controls the movement mechanism 95 to move the etching pipe 93 to the treatment position. Thus, the peripheral edge of the wafer W is inserted in the groove 94 as shown in FIG. 19. At this time, the rotation speed of the wafer W may be, for example, about 500 rpm. Then, the valve 93V is opened under the control of the system controller 155. The flow rate of the etching liquid may be, for example, 20 ml/min. Thus, the etching liquid is supplied into the groove 94 from the etching liquid supply source 96. The etching liquid flows out of the groove 94, so that the groove 94 is virtually filled with the etching liquid.

Since the peripheral edge of the wafer W is inserted in the groove 94, a part of the thin copper film formed on the peripheral edge of the wafer W is dissolved by the etching liquid. With the wafer W being rotated, the peripheral edge of the wafer W is moved relative to the etching pipe 93 located at the treatment position. As a result, the entire peripheral edge of the wafer W is etched. An etching width is determined by an insertion depth of the wafer W in the groove 94, so that the etching process can accurately be performed with a desired etching width.

Like the rinse liquid, the etching liquid spun off laterally of the wafer W by a centrifugal force is once collected in the collection vessel 97, and then introduced into the collection tank not shown through the liquid drain port 97a. During this period, gas is continuously exhausted through the air outlet port 98a, so that mist of the etching liquid is prevented from scattering out of the cup 85.

After the etching liquid is continuously supplied for a predetermined period (e.g., several tens seconds) for the etching of the thin copper film on the peripheral edge of the wafer W, the valve 93V is closed under the control of the system controller 155 to stop the supply of the etching liquid to the groove 94. Thus, the etching process for etching the peripheral edge of the wafer W is completed in the absence of the etching liquid in the groove 94.

Thereafter, the valves 91V, 100V are opened again under the control of the system controller 155 to supply the rinse liquid to the surfaces of the wafer W. Thus, the etching liquid remaining on the peripheral edge portion of the wafer W is rinsed away with the rinse liquid. During this period, the system controller 155 controls the movement mechanism 95 to move the etching pipe 93 to the retracted position.

After the rinse liquid is continuously supplied for a predetermined period (e.g., about one minute), the valves 91V, 100V are closed under the control of the system controller 155 to stop the supply of the rinse liquid. The system controller 155 controls the rotative driving mechanism 88 to rotate the spin chuck 86 at a high rotation speed (e.g., about 1000 rpm) for a predetermined period (e.g., several tens seconds) for spinning off the rinse liquid from the wafer W for drying. Then, the rotation of the spin chuck 86 is stopped.

Subsequently, the system controller 155 controls the lift mechanism 89 to move up the spin chuck 86 so that the wafer W held by the spin chuck 86 is located above the upper edge of the cup 85. Then, the wafer W is released out of the suction-held state.

In turn, the treated wafer W is unloaded by the retractable arm 42 or the retractable arm 41 of the transport robot TR. Thus, the etching process for the etching of the peripheral edge of the single wafer W is completed. Since no thin copper film is present on the peripheral edge of the treated wafer W, there is no possibility that copper adheres on the substrate holder hand 41c, 42c when the peripheral edge of the wafer is held by the substrate holder hand 41c, 42c (see FIG. 5(a)) in the subsequent steps.

In this embodiment, the cup 85 is fixed, and the spin chuck 86 is adapted to be moved up and down by the lift mechanism 89. However, it is merely necessary to vertically move the spin chuck 86 and the cup 85 relative to each other. For example, the spin chuck 86 may vertically be fixed, and the cup 85 may be adapted to be moved up and down. Even in this case, the upper portion of the spin chuck 86 can be located above the upper edge of the cup 85, so that the wafer W can be loaded and unloaded by the retractable arm 41 or the retractable arm 42.

Figure 20:
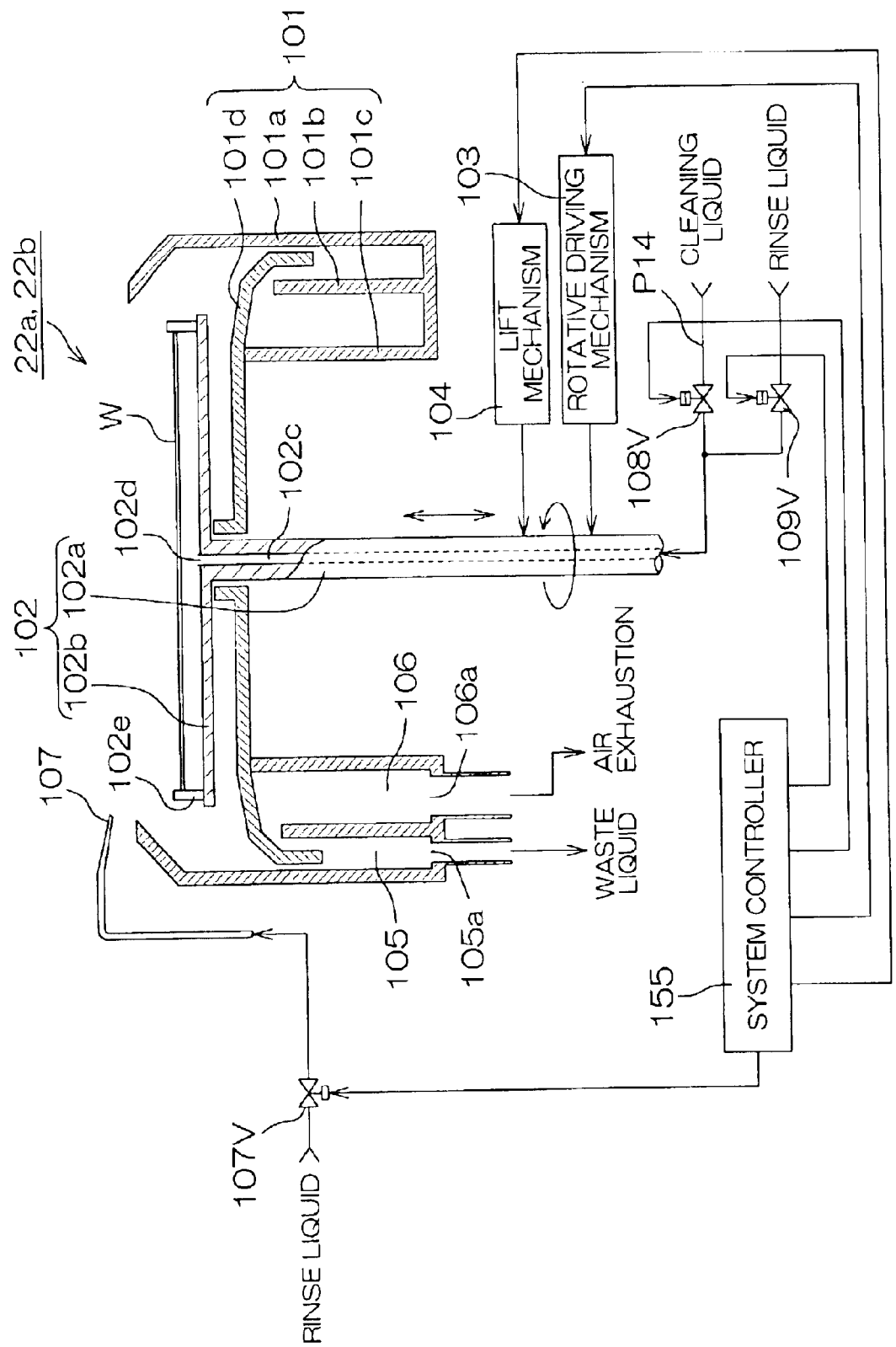
FIG. 20 is a schematic sectional view illustrating the construction of a cleaning unit.

FIG. 20 is a schematic sectional view illustrating the common construction of the cleaning units 22a, 22b.

A spin chuck 102 for generally horizontally holding and rotating the wafer W is provided in a generally cylindrical cup 101. The spin chuck 102 includes a vertical rotation shaft 102a and a disk spin base 102b provided at an upper end of the rotation shaft 102a perpendicularly to the rotation shaft 102a. A plurality of chuck pins 102e are provided upright on a peripheral edge portion of an upper surface of the spin base 102b in circumferentially spaced relation. The chuck pins 102e cooperatively support a peripheral edge portion of the lower surface of the wafer W in abutment against the peripheral surface (circumferential surface) of the wafer W for holding the wafer W.

A rotative driving force is transmitted to the rotation shaft 102a of the spin chuck 102 from a rotative driving mechanism 103. A lift mechanism 104 for moving up and down the spin chuck 102 is coupled to the spin chuck 102, so that the spin chuck 102 can be brought into a state where its upper portion is accommodated in the cup 101 and into a state where its upper portion is located above an upper edge of the cup 101.

The cup 101 includes three cups 101a to 101c coaxially arranged. The outermost one of the cups 101a to 101c has an upper edge located at the highest position, and the middle cup 101b has an upper edge located at the lowest position. An annular treatment liquid guide plate 101d as seen in plan is coupled to an upper edge of the innermost cup 101c. An outer edge of the treatment liquid guide plate 101d is bent to be inserted into a space between the cup 101a and the cup 101b.

A treatment liquid collection vessel 105 having an open top is defined between the cup 101a and the cup 101b, and an air outlet vessel 106 is defined between the cup 101b and the cup 101c. A liquid drain port 105a is provided in the bottom of the treatment liquid collection vessel 105, and an air outlet port 106a is provided in the bottom of the air outlet vessel 106.

A nozzle 107 is provided above the cup 101. The nozzle 107 is connected in communication with the rinse liquid supply source via a valve 107V. By opening the valve 107V, the rinse liquid can be discharged toward the wafer W held by the spin chuck 102 from the nozzle 107.

The rotation shaft 102a has a treatment liquid supply channel 102c extending therethrough axially thereof, and an open upper end serving as a treatment liquid outlet port 102d. The cleaning liquid can be supplied into the treatment liquid supply channel 102c through the post-treatment agent pipe P14 from a cleaning liquid supply source provided in the post-treatment agent supplying section 4 (see FIG. 1). The rinse liquid can also be supplied into the treatment liquid supply channel 102c from the rinse liquid supply source.

The cleaning liquid may be, for example, a mixture of sulfuric acid, a hydrogen peroxide aqueous solution and water. The rinse liquid may be, for example, deionized water. In this case, the rinse liquid (deionized water) can be supplied into the treatment liquid supply channel 102c and the nozzle 107 via the deionized water pipe 32 extending through the deionized water pipe introduction port 32h formed in the enclosure 30 (see FIG. 3).

A valve 108V is provided between the treatment liquid supply channel 102c and the cleaning liquid supply source. A valve 109V is provided between the treatment liquid supply channel 102c and the rinse liquid supply source. By closing the valve 109V and opening the valve 108V, the cleaning liquid can be discharged from the treatment liquid outlet port 102d. By closing the valve 108V and opening the valve 109V, the rinse liquid can be discharged from the treatment liquid outlet port 102d. Thus, the cleaning liquid or the rinse liquid can be supplied to the center of the lower surface of the wafer W held by the spin chuck 102.

The operations of the rotative driving mechanism 103 and the lift mechanism 104, and the opening and closing of the valves 107V, 108V, 109V are controlled by the system controller 155.

When the wafer W is to be cleaned in the cleaning unit 22a or 22b, the system controller 155 controls the lift mechanism 104 to move up the spin chuck 102 so that the upper portion of the spin chuck 102 is located above the upper edge of the cup 101. The wafer W subjected to the bevel etching process in the bevel etching unit 21a or 21b is loaded into the cleaning unit 22a or 22b by the retractable arm 41 or the retractable arm 42 of the transport robot TR (see FIGS. 5(a), 5(b) and 5(c)), and mechanically held by the chuck pins 102e with the center of the wafer W coinciding with the center axis of the rotation shaft 102a.

Thereafter, the system controller 155 controls the lift mechanism 104 to move down the spin chuck 102. Thus, the wafer W held by the spin chuck 102 is surrounded by the cup 101a. Then, the system controller 155 controls the rotative driving mechanism 103 to rotate the wafer W held by the spin chuck 102. The rotation speed of the wafer W is, for example, about 500 rpm. Gas is exhausted from the cup 101 through the air outlet port 106a by the exhauster system not shown.

In this state, the valves 107V, 108V are opened under the control of the system controller 155. Thus, the rinse liquid and the cleaning liquid are discharged toward the wafer W from the nozzle 107 and the treatment liquid outlet port 102d, respectively. The rinse liquid and the cleaning liquid supplied to the surfaces of the wafer W spread toward the peripheral edge of the wafer W by a centrifugal force. Thus, the entire lower surface of the wafer W is cleaned.

The rinse liquid and the cleaning liquid are spun off laterally of the wafer W by the centrifugal force, and flows over the interior of the cup 101a and the upper surface of the treatment liquid guide plate 101d down into the treatment liquid collection vessel 105. The rinse liquid and the cleaning liquid are introduced into the collection tank not shown through the liquid drain port 105a. Further, gas is exhausted from the cup 101 through the air outlet port 106a. Thus, mist of the cleaning liquid can be exhausted through the air outlet port 106a so as to be prevented from scattering out of the cup 101.

After this process is performed for a predetermined period, the valve 108V is closed and the valve 109V is opened under the control of the system controller 155. Thus, the rinse liquid is discharged toward the lower surface of the wafer W from the treatment liquid outlet port 102d. The supply of the rinse liquid to the upper surface of the wafer W from the nozzle 107 is continued. Thus, the cleaning liquid is rinsed away from the lower surface of the wafer W. After this process is continued for a predetermined period (e.g., about one minute), the valves 107V and 109V are closed under the control of the system controller 155 to stop the supply of the rinse liquid to the wafer W.

Subsequently, the system controller 155 controls the rotative driving mechanism 103 to rotate the wafer W held by the spin chuck 102 at a high speed, for example, at about 2000 rpm. Thus, the rinse liquid remaining on the wafer W is mostly spun off for drying. After the high-speed rotation of the wafer W is continued for a predetermined period (e.g., several tens seconds), the system controller 155 controls the rotative driving mechanism 103 to stop the rotation of the wafer W.

In turn, the system controller 155 controls the lift mechanism 104 to move up the spin chuck 102 so that the wafer W held by the spin chuck 102 is located above the upper edge of the cup 101. Thus, the wafer W is released from the chuck pins 102e.

Then, the treated wafer W is unloaded by the retractable arm 42 or the retractable arm 41 of the transport robot TR. Thus, the cleaning process for the cleaning of the single wafer W is completed.

In this embodiment, the cup 101 is fixed, and the spin chuck 102 is adapted to be moved up and down by the lift mechanism 104. However, it is merely necessary to vertically move the spin chuck 102 and the cup 101 relative to each other. For example, the spin chuck 102 may vertically be fixed, and the cup 101 may be adapted to be moved up and down. Even in this case, the spin base 102b can be located above the upper edge of the cup 101, so that the wafer W can be loaded and unloaded by the retractable arm 41 or the retractable arm 42.

Figure 21:
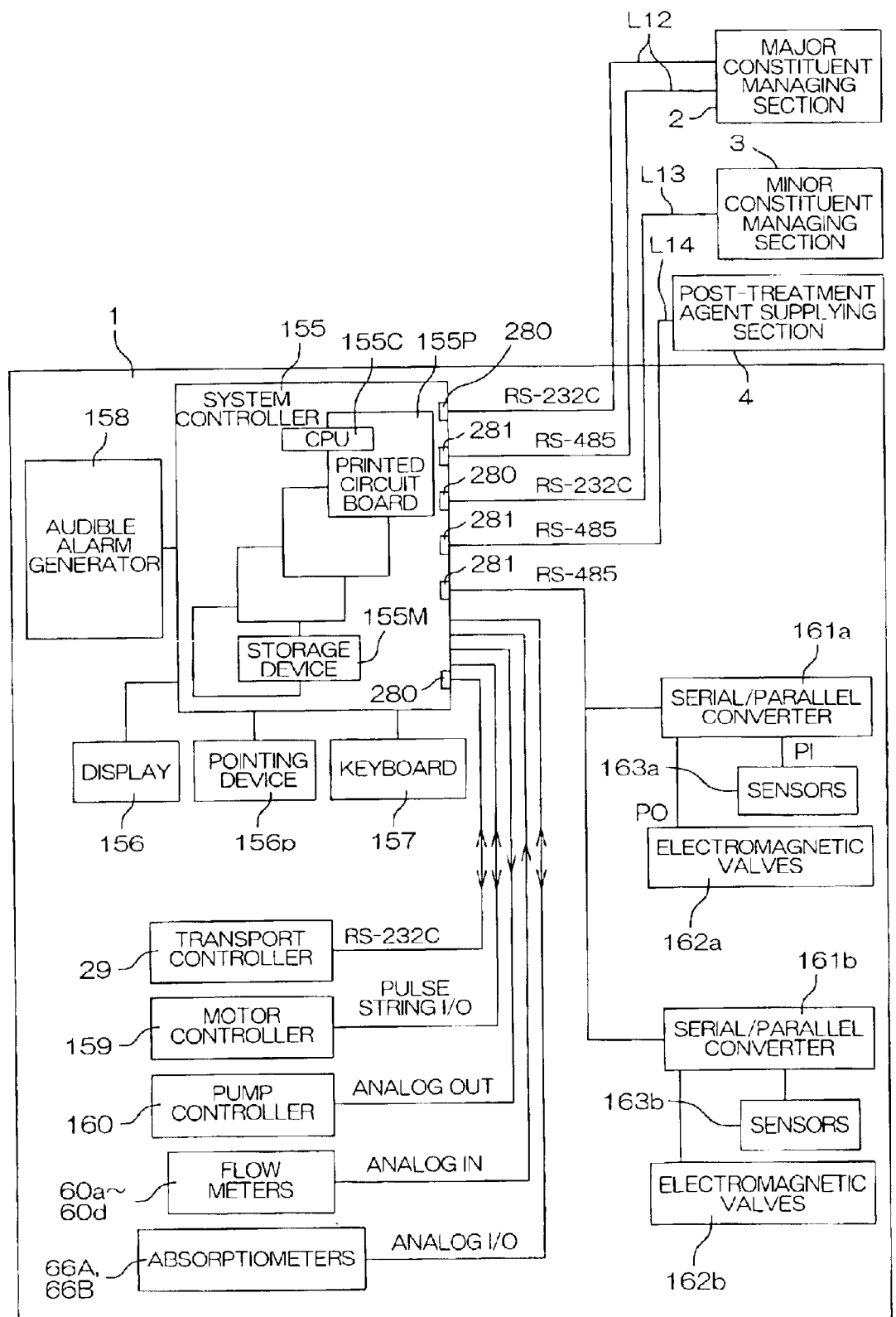
FIG. 21 is a block diagram illustrating the construction of a control system for the wafer treating section.

FIG. 21 is a block diagram illustrating the construction of a control system for the wafer treating section 1.

The system controller 155 controls the wafer treating section 1, the major constituent managing section 2, the minor constituent managing section 3 and the post-treatment agent supplying section 4 to comprehensively manage the entire plating apparatus 10. More specifically, the system controller 155 monitors the states of the respective sections, issues proper control commands to the respective sections, generates data for the respective sections, and takes in data from the respective sections.

Hardware of the system controller 155 includes a central processing unit (CPU) 155C having a processing capability of 10 MIPS (million instructions per second) or more, a storage device 155M including a semiconductor memory having a storage capacity of 10 Mbytes or more and a magnetic memory having a storage capacity of 1 Mbyte or more, RS-232C compatible serial ports 280, RS-485 compatible serial ports 281, and a plurality of printed circuit boards 155P. The magnetic memory may be, for example, a hard disk (HD) incorporated in a hard disk drive (HDD), or a flexible disk (FD) to be inserted in a flexible disk drive (FDD).

Software employed in the system controller 155 includes an operating system, and application programs which are at least partly described in a high-level language. These programs are stored in the storage device 155M. The application programs include recipes for performing the plating process, the bevel etching process, the cleaning process and the like.

The system controller 155 is connected to a display 156, a keyboard 157, a pointing device (e.g., a mouse) 156p, so that the operator can interact with the system controller 155 for inputting and outputting information. The system controller 155 is further connected to an audible alarm generator 158. When a certain event occurs, e.g., when the leakage of the plating liquid occurs which is judged on the basis of the output signal of the conductivity meter 212 (see FIG. 9) or when the residual amount of the copper supply source (copper tube) for supplying copper ions to the plating liquid is reduced below a predetermined level, an audible alarm is given, and information on the alarm is displayed on the display 156.

The system controller 155 is connected to the transport controller 29 (see FIG. 2), the major constituent managing section 2 and the minor constituent managing section 3 via the RS-232C compatible serial ports 280 by cables. The system controller 155 is further connected to a motor controller 159 by a pulse-string input/output cable, and connected to a pump controller 160, the flow meters 60a to 60d and the absorptiometers 66A and 66B by analog signal cables.

Thus, the system controller 155 is capable of controlling motors provided in the rotative driving mechanisms 45, 88, 103 (see FIGS. 9, 19 and 20), for example, via the motor controller 159, and controlling the operations of the pumps P1 to P4 (see FIG. 7) in the plating section 12, for example, via the pump controller 160. Signals indicative of the flow rates from the flow meters 60a to 60d (see FIG. 7) are inputted as analog signals to the system controller 155. Further, the system controller 155 controls the operations of the absorption meters 66A, 66B (e.g., light emission of the light emitting sections 68A, 68B) on an analog signal basis, and receives analog signals outputted from the light receiving sections 69A, 69B.

The system controller 155 is further connected to the major constituent managing section 2, the post-treatment agent supplying section 4 and serial/parallel converters 161a, 161b via the RS-485 compatible serial ports 281 by cables. In FIG. 21, only two serial/parallel converters 161a, 161b are shown, but the system controller 155 may be connected to a greater number of serial/parallel converters.

The serial/parallel converters 161a and 161b are respectively connected to electromagnetic valves 162a and 162b, and sensors 163a and 163b (e.g., the temperature sensor 70, the electromagnetic conductivity meter 71, the ultrasonic level meter 72 (see FIG. 7)) via parallel cables. The electromagnetic valves 162a, 162b are capable of controlling air valves (e.g., the valves 91V, 100V (see FIG. 19) and the valve 107V (see FIG. 20)).

Figure 22:
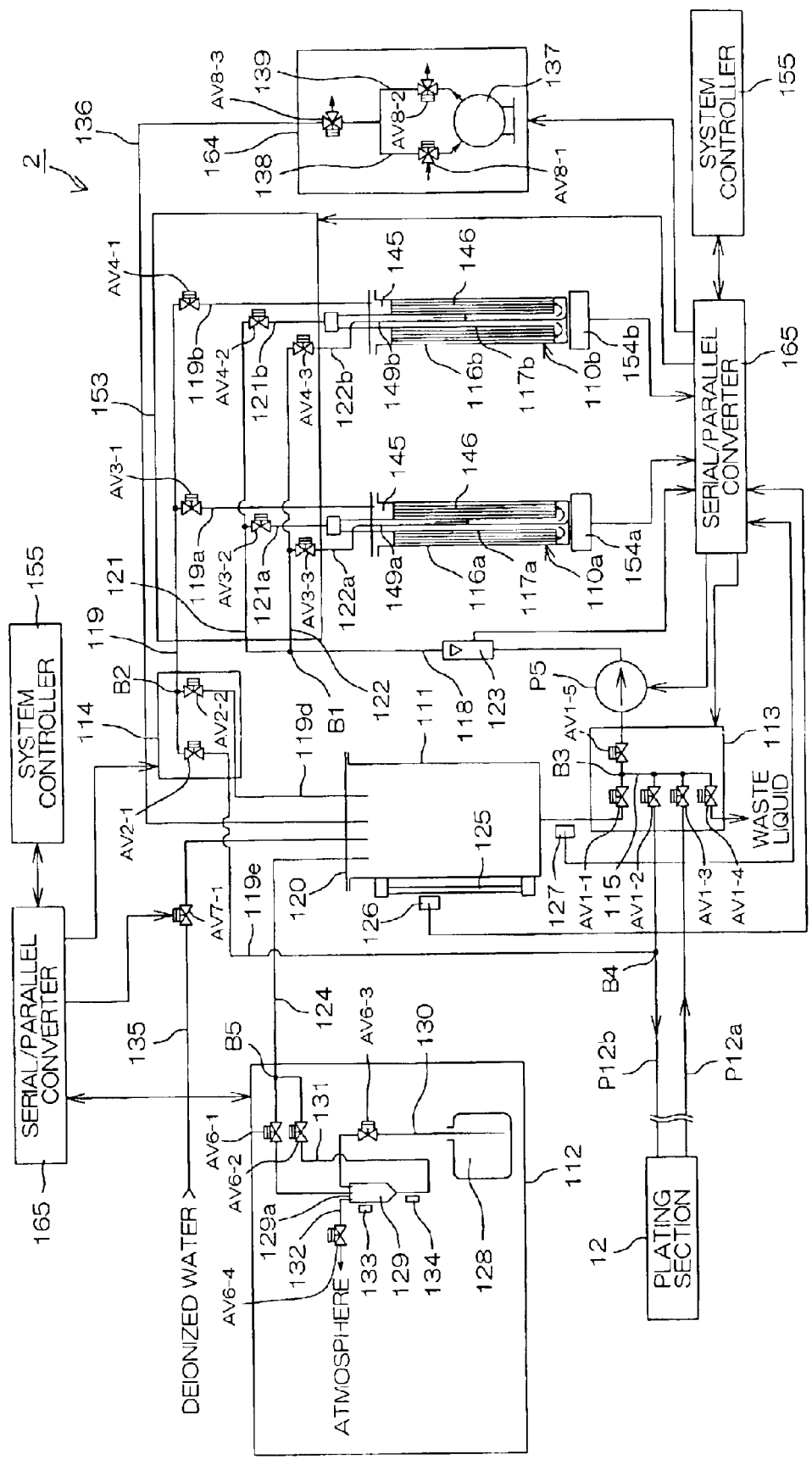
FIG. 22 is a schematic diagram illustrating the construction of a major constituent managing section.

FIG. 22 is a schematic diagram illustrating the construction of the major constituent managing section 2.

The major constituent managing section 2 includes at least one copper dissolution tank (two copper dissolution tanks 110a, 110b in this embodiment) for supplying copper ions to the plating liquid, a buffer container 111 for supplying a replacement liquid to one of the copper dissolution tanks 110a, 110b not in use, and an undiluted replacement liquid supplying section 112 for supplying an undiluted replacement liquid as a source of the replacement liquid to the buffer container 111.

Copper tubes 146 are provided as the copper supply source in each of the copper dissolution tanks 110a, 110b. The plating liquid is circulated through the plating liquid container 55 of the wafer treating section 1 and the copper dissolution tank 110a, 110b, whereby copper ions consumed by the plating are replenished in the plating liquid. In the copper dissolution tank 110a (110b) through which the plating liquid is not circulated in communication with the plating liquid container 55, the surface of the copper tubes 146 can be maintained in a proper state by filling the replacement liquid in the copper dissolution tank 110a (110b). This ensures proper leach-out of copper ions from the copper tubes 146 when the circulation of the plating liquid through the plating liquid container 55 and the copper dissolution tank 110a (110b) is started.

The copper dissolution tanks 110a, 110b each have a cylindrical sealed structure having a closed bottom and a generally vertical axis. The copper dissolution tank 110a, 110b is placed on a weight meter 154a, 154b, which is adapted to measure the total weight of the copper dissolution tank 110a, 110b including its content.

The copper dissolution tank 110a, 110b includes an outer pipe 116a, 116b constituting a side wall thereof, and an inner pipe 117a, 117b provided in the outer pipe 116a, 116b. An inner space of the inner pipe 117a, 117b communicates with a space (hereinafter referred to as "annular space 145") defined between the outer pipe 116a, 116b and the inner pipe 117a, 117b in a lower portion of the copper dissolution tank 110a, 110b. The copper tubes 146 are accommodated in the annular space 145.

The buffer container 111 has a cover 120 having piping ports for piping, and is virtually sealed. Upper and lower portions of the buffer container 111 are connected in communication with each other by a bypass pipe 125 vertically extending along the exterior of the buffer container 111. A constant volume check sensor 126 is provided at a predetermined height on a lateral side of the bypass pipe 125 for detecting the presence or absence of liquid at this predetermined height within the bypass pipe 125.

The liquid (e.g., the replacement liquid) is allowed to freely flow between the buffer container 111 and the bypass pipe 125, so that a liquid surface level in the buffer container 111 is virtually equal to a liquid surface level in the bypass pipe 125. Thus, the presence or absence of the liquid at the predetermined height in the buffer container 111 can be detected by the constant volume check sensor 126.

One end of a circulation pipe 118 is connected to the bottom of the buffer container 111 via a piping port for communication between the circulation pipe 118 and the buffer container 111. The other end of the circulation pipe 118 is branched into branch circulation pipes 121, 122 at a branch point B1. The branch circulation pipe 121 is further branched into branch circulation pipes 121a, 121b, while the branch circulation pipe 122 is further branched into branch circulation pipes 122a, 122b.

The branch circulation pipes 121a and 121b are respectively connected to upper portions of the inner pipes 117a and 117b of the copper dissolution tanks 110a and 110b. The branch circulation pipes 122a and 122b are respectively connected to liquid outlet pipes 149a and 149b provided in the copper dissolution tanks 110a and 110b. Valves AV3-2 and AV4-2 are provided in the branch circulation pipes 121a and 121b, respectively. Valves AV3-3 and AV4-3 are provided in the branch circulation pipes 122a and 122b, respectively.

Branch circulation pipes 119a and 119b are connected in communication with the annular spaces 145 of the copper dissolution tanks 110a and 110b, respectively. Valves AV3-1 and AV4-1 are provided in the branch circulation pipes 119a and 119b, respectively. The branch circulation pipes 119a, 119b are connected to one end of a circulation pipe 119. The other end of the circulation pipe 119 is branched into branch circulation pipes 119d and 119e at a branch point B2.

The valves AV3-1, AV3-2, AV3-3, AV4-1, AV4-2, AV4-3 are collectively disposed in a copper dissolution tank channel switching section 153.

The branch circulation pipe 119d extends into the buffer container 111 through the piping port formed in the cover 120 (through the cover 120). A valve AV2-2 is provided in the branch circulation pipe 119d.

One end of a channel switching pipe 115 is connected to the circulation pipe 118 at a branch point B3. A valve AV1-4 is provided at the other end of the channel switching pipe 115. By opening the valve AV1-4, the liquid can be drained from the other end of the channel switching pipe 115. The plating liquid transport pipes P12a and P12b are connected to the channel switching pipe 115 via valves AV1-3 and AV1-2, respectively.

A valve AV1-1 is provided in the circulation pipe 118 between the buffer container 111 and the branch point B3. A valve AV1-5, a pump P5 and a flow meter 123 are provided in the circulation pipe 118 between the branch point B3 and the branch point B1 in this order from the branch point B3. An emptiness check sensor 127 is provided on a lateral side of the circulation pipe 118 in the vicinity of the buffer container 111 (between the buffer container 111 and the branch point B3). The emptiness check sensor 127 is capable of detecting the presence or absence of the liquid at the height of the emptiness check sensor 127 in the circulation pipe 118. This makes it possible to determine whether or not the buffer container 111 is empty.

The valves AV1-1, AV1-2, AV1-3, AV1-4, AV1-5 are collectively disposed in an inlet-side main channel switching section 113.

The branch circulation pipe 119e is connected to the plating liquid transport pipe P12b at a branch point B4. A valve AV2-1 is provided in the branch circulation pipe 119e. The valves AV2-1, AV2-2 are collectively disposed in an outlet-side main channel switching section 114.

The undiluted replacement liquid supplying section 112 includes an undiluted replacement liquid tank 128 containing the undiluted replacement liquid, and a measure cup 129 for dispensing a predetermined amount of the undiluted replacement liquid. The undiluted replacement liquid may be, for example, concentrated sulfuric acid. The measure cup 129 has a cover 129a, and is virtually sealed. The measure cup 129 has a bottom having an inverted cone shape. A liquid outlet port is provided in a center portion of the bottom of the measure cup 129. The bottom of the measure cup 129 is inclined downward toward the liquid outlet port. An undiluted replacement liquid transport pipe 130 extends from an upper portion of the measure cup 129 into a bottom portion of the undiluted replacement liquid tank 128. A valve AV6-3 is provided in the undiluted replacement liquid transport pipe 130.

The undiluted replacement liquid supplying section 112 is connected to the buffer container 111 by an undiluted replacement liquid supply pipe 124. The undiluted replacement liquid supply pipe 124 extends to the upper portion of the measure cup 129 through the cover 129a. One end of an undiluted replacement liquid transport pipe 131 is connected to the center portion of the bottom (liquid outlet port) of the measure cup 129. The other end of the undiluted replacement liquid transport pipe 131 is connected to the undiluted replacement liquid supply pipe 124 at a branch point B5. A valve AV6-1 is provided in the undiluted replacement liquid supply pipe 124 between the branch point B5 and the measure cup 129. A valve AV6-2 is provided in the undiluted replacement liquid transport pipe 131.

A leak pipe 132 extends through the cover 129a to be connected in communication with the measure cup 129. A valve AV6-4 is provided in the leak pipe 132 outside the measure cup 129. By opening the valve AV6-4, the internal pressure of the measure cup is set at the atmospheric pressure.

A constant volume check sensor 133 is provided at a predetermined height on a lateral side of the measure cup 129 for detecting the presence or absence of liquid at this predetermined height in the measure cup 129. An emptiness check sensor 134 is provided on a lateral side of the undiluted replacement liquid transport pipe 131 in the vicinity of the measure cup 129. The emptiness check sensor 134 is capable of detecting the presence or absence of liquid at the height of the emptiness check sensor 134 in the undiluted replacement liquid transport pipe 131. This makes it possible to determine whether or not the measure cup 129 is empty.

A deionized water supply pipe 135 extends through the cover 120 to be connected in communication with the buffer container 111. Thus, deionized water can be supplied to the buffer container 111 from a deionized water supply source not shown. A valve AV7-1 is provided in the deionized water supply pipe 135.

An air inlet/outlet pipe 136 is introduced into the buffer container 111 through the cover 120. An air pump 137 is connected to an end of the air inlet/outlet pipe 136 opposite from the buffer container 111. A three-way valve AV8-3 is provided in the air inlet/outlet pipe 136. The three-way valve AV8-3 is adapted to selectively establish air communication between the buffer container 111 and the air pump 137 and between the buffer container 111 and the atmosphere.

The air pump 137 has an exhaustion pipe 138 and an air supply pipe 139. The air inlet/outlet pipe 136 is connected in communication with the exhaustion pipe 138 and the air supply pipe 139. A three-way valve AV8-1 is provided in the exhaustion pipe 138, while a three-way valve AV8-2 is provided in the air supply pipe 139. The three-way valves AV8-1, AV8-2, AV8-3, which may be air valves, are collectively disposed in a pressure increasing/reducing section 164.

Air can be supplied into the buffer container 111 by establishing communication between the atmosphere and the air pump 137 by the three-way valve AV8-1 and between the air pump 137 and the air inlet/outlet pipe 136 by the three-way valve AV8-2, and actuating the air pump 137. Gas can be exhausted from the buffer container 111 by establishing communication between the air inlet/outlet pipe 136 and the air pump 137 by the three-way valve AV8-1 and between the air pump 137 and the atmosphere by the three-way valve AV8-2, and actuating the air pump 137.

The opening and closing of the valve AV7-1 and the valves in the inlet-side main channel switching section 113, the outlet-side main channel switching section 114, the copper dissolution tank channel switching section 153, the undiluted replacement liquid supplying section 112 and the pressure increasing/reducing section 164, and the operations of the pump P5 and the air pump 137 are controlled by the system controller 155 of the wafer treating section 1 via the serial/parallel converter 165. Output signals of the constant volume check sensors 126, 133, the emptiness check sensors 127, 134, the flow meter 123 and the weight meters 154$a$, 154$b$ are inputted to the system controller 155 of the wafer treating section 1 via the serial/parallel converter 165.

With reference to FIG. 22, an explanation will hereinafter be given of the operation of the major constituent managing section 2 during the plating process performed in the plating section 12.

Prior to the plating process, the system controller 155 determines which of the copper dissolution tanks 110$a$, 110$b$ is to be used. One of the copper dissolution tanks 110$a$, 110$b$ which contains the copper tubes 146 whose total weight is lightest is used. The other copper dissolution tank is not used, but reserved as a spare.

The storage device 155M of the system controller 155 stores data of the net weights of the respective copper dissolution tanks 110$a$, 110$b$ and the weights of the respective copper dissolution tanks 110$a$, 110$b$ measured when the plating liquid is filled therein. The system controller 155 calculates the weights of the copper tubes 146 in the copper dissolution tanks 110$a$, 110$b$ on the basis of the output signals of the weight meters 154$a$, 154$b$.

It is herein assumed that the weight of the copper tube 146 in the copper dissolution tank 110$a$ is judged to be the lightest and sufficient to supply copper ions to the plating liquid for a predetermined period. In this case, a flow channel is established for circulating the plating liquid through the plating section 12 and the copper dissolution tank 110$a$ under the control of the system controller 155. More specifically, the valves AV1-3, AV1-5, AV3-2, AV3-1, AV2-1 are opened, and the other valves are closed.

In this state, the pump P5 is actuated under the control of the system controller 155. Thus, the plating liquid is supplied into the copper dissolution tank 110$a$ from the plating section 12, flows over the interior and exterior surfaces of the copper tubes 146 in the copper dissolution tank 110$a$, and returned into the plating section 12. In the copper dissolution tank 110$a$, the copper tubes 146 are deprived of electrons by trivalent iron ions in the plating liquid, whereby the trivalent iron ions are reduced to divalent iron ions. Copper ions are leached into the plating liquid from the copper tubes 146 deprived of the electrons.

Thus, the copper ions are supplied from the copper tubes 146, while being consumed on the lower surface of the wafer W during the plating process. On the other hand, the trivalent iron ions are reduced to the divalent iron ions in the vicinity of the copper tubes 146, while the divalent iron ions are oxidized into the trivalent iron ions in the vicinity of the anode 76.

Where the concentrations of the copper ions, the divalent iron ions and the trivalent iron ions in the plating liquid are not within the predetermined concentration ranges, the plating process cannot properly be performed with a poorer capability of filling the holes or grooves formed in the surface of the wafer W with copper. Therefore, the concentrations of the copper ions and the divalent and trivalent iron ions in the plating liquid should be kept at the predetermined concentration levels (within the predetermined concentration ranges). That is, the amount of the copper ions consumed on the lower surface of the wafer W should substantially be equalized with the amount of the copper ions leaching out of the copper tubs 146, and the amount of the divalent iron ions occurring in the vicinity of the anode 76 should substantially be equalized with the amount of the trivalent iron ions occurring in the vicinity of the copper tubes 146.

The copper ion consumption rate at which the copper ions are consumed in the plating liquid by the plating is determined by the operation statuses of the respective plating units 20$a$ to 20$d$. The copper ion leaching rate at which the copper ions leach into the plating liquid from the copper tubes 146 in the copper dissolution tank 110$a$ is determined by the surface area of the copper tubes 146 in contact with the plating liquid, the flow rate of the plating liquid flowing in the vicinity of the copper tubes 146 and the concentration of the trivalent iron ions in the plating liquid.

The inner and outer peripheral surface areas of the copper tube 146 account for a major percentage of the total surface area of the cupper tube 146. As the dissolution of the copper tube 146 proceeds, the thickness and length of the copper tube 146 are reduced. However, the reduction rate of the length is negligible. Therefore, the outer and inner peripheral surface areas of the copper tube 146 (the total surface area of the copper tube 146) are considered to be virtually constant before complete dissolution of the copper tube 146, even if the dissolution of the copper tube 146 proceeds. Whether or not the copper tube 146 is very close to the complete dissolution is determined on the basis of the output signal of the weight meter 154a. The flow rate of the plating liquid flowing into the copper dissolution tank 110a may be employed as the flow rate of the plating liquid flowing in the vicinity of the copper tube 146.

Therefore, the system controller 155 determines the pumping rate of the pump PS on the basis of the operation statuses of the plating units 20a to 20d and the output signal of the absorptiometer 66B indicative of the concentration of the iron ions. The pumping rate of the pump PS is regulated at a predetermined level on the basis of the feedback of the output signal of the flow meter 123 to the system controller 155. Under such control, the amount of the copper ions supplied to the plating liquid is balanced with the amount of the copper ions consumed in the plating liquid to keep the copper ion concentration virtually constant in the plating liquid.

If the dissolution of the copper tubes 146 in the copper dissolution tank 110a extremely proceeds, the total surface area of the copper tubes 146 is rapidly reduced, making it difficult to supply the copper ions to the plating liquid at a constant rate. To avoid such an event, the supply of the plating liquid to the copper dissolution tank 110a is stopped when the weight of the copper tubes 146 in the copper dissolution tank 110a is reduced below a predetermined level (e.g., 20% to 30% of the initial weight). Then, the supply of the plating liquid to the copper dissolution tank 110b is started.

More specifically, when the system controller 155 judges on the basis of the signal of the weight meter 154a that the weight of the copper tubes 146 in the copper dissolution tank 110a is reduced below the predetermined level, the valves AV4-1 and AV4-2 are opened and the valves AV3-1 and AV3-2 are closed under the control of the system controller 155. Thus, the plating liquid is circulated through the plating section 12 and the copper dissolution tank 110b. Where the copper tubes 146 contained in the copper dissolution tank 110b has a sufficient weight, the copper ions can stably be supplied into the plating liquid.

Since the two copper dissolution tanks 110a, 110b are provided in the major constituent managing section 2, the copper ions can constantly be supplied to the plating liquid without excess and deficiency. Thus, the surface of the wafer W can properly be copper-plated with the fine holes or grooves thereof properly filled with copper.

Next, an explanation will be given to the operation of the major constituent managing section 2 after the completion of the plating process in the plating section 12. If the plating liquid is circulated through the plating liquid container 55 and the copper dissolution tank 110a or 110b when the plating process is not performed in any of the plating units 20a to 20d, the concentration of the copper ions in the plating liquid is increased beyond the proper concentration range. This is because the copper ions are continuously supplied to the plating liquid from the copper tubes 146, though the copper ions are not consumed.

If the circulation of the plating liquid is stopped, the surface of the copper tubes 146 in the copper dissolution tank 110a, 110b is irreversibly deteriorated. Therefore, the surface of the wafer W cannot properly be copper-plated with a poorer capability of filling the fine holes or grooves thereof with copper, when the plating process is performed again in any of the plating units 20a to 20d by resuming the circulation of the plating liquid.

To cope with this, the plating liquid in the copper dissolution tank 110a, 110b is replaced with the replacement liquid for prevention of the increase in the concentration of the copper ions in the plating liquid and the deterioration of the surface of the copper tubes 146 upon the completion of the plating process in the plating section 12. It is herein assumed that the plating liquid in the copper dissolution tank 110a is replaced with the replacement liquid.

The deterioration of the surface of the copper tubes 146 may occur within several hours. On the other hand, the plating process is often resumed immediately after the completion of the plating process in the plating section 12 due to a change in a production plan. In this case, if the plating liquid in the copper dissolution tank 110a is already replaced with the replacement liquid, the replacement liquid in the copper dissolution tank 110a should be replaced again with the plating liquid. The time required for the replacement of the plating liquid in the copper dissolution tank 110a is about 5 minutes to about 10 minutes, so that the productivity is reduced. Therefore, the plating liquid in the copper dissolution tank 110a is replaced with the replacement liquid after a lapse of a 2- to 3-hour standby period from the completion of the plating process in the plating section 12.

If the plating process is less likely to be resumed immediately after the completion of the plating process in the plating section 12, the plating liquid in the copper dissolution tank 110a may be replaced with the replacement liquid immediately after the completion of the plating process.

First, the pump P5 is stopped and all the valves in the major constituent managing section 2 are closed under the control of the system controller 155. In turn, the system controller 155 controls the pressure increasing/reducing section 164 to supply air into the buffer container 111. Thus, the internal pressure of the buffer container 111 is increased. Then, the valves AV2-2, AV3-1, AV3-2, AV1-5, AV1-2 are opened under the control of the system controller 155. Thus, air pressurized in the buffer container 111 is introduced into the annular space 145, so that the plating liquid is forced out of the copper dissolution tank 110a into the plating liquid container 55 in the plating section 12.

The system controller 155 calculates the weight of the plating liquid in the copper dissolution tank 110a on the basis of the output signal of the weight meter 154a, and maintains the aforesaid conditions until it is judged that almost all the plating liquid is expelled from the copper dissolution tank 110a. When the system controller 155 judges that almost all the plating liquid is expelled from the copper dissolution tank 110a, the valve AV3-3 is opened for a predetermined period under the control of the system controller 155. Thus, the plating liquid remaining in the bottom portion of the copper dissolution tank 110a is virtually completely discharged through the liquid outlet pipe 149a.

Subsequently, the valve AV7-1 is opened under the control of the system controller 155 to introduce deionized water into the buffer container 111. When it is judged on the basis of the output signal of the constant volume check sensor 126 that the surface of deionized water rises to reach the predetermined level in the buffer container 111, the valve AV7-1 is closed under the control of the system controller 155. Thus, a predetermined amount of deionized water is contained in the buffer container 111.

In turn, the valves in the major constituent managing section 2 except the three-way valves AV8-1, AV8-2, AV8-3 are closed, and air is exhausted from the buffer container 111 by the pressure increasing/reducing section 164 under the control of the system controller 155. Thus, the internal pressure of the buffer container 111 is reduced. Then, the valves AV6-1, AV6-3 are opened under the control of the system controller 155. Thus, the internal pressure of the measure cup 129 is also reduced, so that the undiluted replacement liquid is sucked into the measure cup 129 from the undiluted replacement liquid tank 128 through the undiluted replacement liquid transport pipe 130.

During this period, the system controller 155 monitors the output signal of the constant volume check sensor 133, and judges whether the surface of the undiluted replacement liquid in the measure cup 129 reaches the predetermined level. If it is judged that the surface of the undiluted replacement liquid reaches the predetermined level, the valves AV6-3, AV6-1 are closed under the control of the system controller 155. Thus, a predetermined volume of the undiluted replacement liquid is dispensed in the measure cup 129.

Then, the valves AV6-2, AV6-4 are opened under the control of the system controller 155. Thus, the internal pressure of the measure cup 129 is set at the atmospheric pressure, so that the undiluted replacement liquid is transported from the measure cup 129 into the buffer container 111 having a lower internal pressure through the undiluted replacement liquid transport pipe 131 and the undiluted replacement liquid supply pipe 124 and mixed with the deionized water in the buffer container 111.

Since the bottom of the measure cup 129 is inclined downward toward the undiluted replacement liquid transport pipe 131 (liquid outlet port), the undiluted replacement liquid is virtually completely discharged from the measure cup 129. When it is judged on the basis of the output signal of the emptiness check sensor 134 that the measure cup 129 is empty, the valves AV6-2, AV6-4 are closed under the control of the system controller 155.

Thus, the replacement liquid which has a predetermined composition and a predetermined concentration (e.g., 10% sulfuric acid aqueous solution) is prepared in the buffer container 111.

In turn, the system controller 155 controls the three-way valve AV8-3 to establish communication between the buffer container 111 and the atmosphere. Thus, the internal pressure of the buffer container 111 is set at the atmospheric pressure. Thereafter, the valves AV1-1, AV1-5, AV3-2, AV3-1, AV2-2 are opened, and the pump PS is actuated under the control of the system controller 155. At this time, the pump P5 is operated only for a predetermined period, or operated until it is judged on the basis of the output signal of the weight meter 154a that the copper dissolution tank 110a is filled with the replacement liquid.

Thereafter, the pump P5 is stopped, and all the valves in the major constituent managing section 2 are closed under the control of the system controller 155. Then, the valves AV1-1, AV1-4 are opened under the control of the system controller 155, whereby the replacement liquid remaining in the buffer container 111 is drained. Thus, the replacement of the plating liquid in the copper dissolution tank 110a with the replacement liquid is completed.

Thus, the increase in the copper ion concentration of the plating liquid can be prevented. Further, the deterioration of the surface of the copper tubes 146 can be prevented. Therefore, when the plating process is performed again in any of the plating units 20a to 20d by circulating the plating liquid through the plating section 12 and the copper dissolution tank 110a (110b), the surface of the wafer W can properly be copper-plated with the fine holes and grooves thereof properly filled with copper. Even if a small amount of the replacement liquid of the sulfuric acid aqueous solution is mixed in the plating liquid, the replacement liquid does not adversely affect the plating liquid because sulfuric acid is a supporting electrolyte of the plating liquid.

In the replacement of the plating liquid with the replacement liquid, deionized water may be introduced into and discharged from the copper dissolution tank 110a before the introduction of the replacement liquid after the plating liquid is discharged from the copper dissolution tank 110a. Thus, the copper dissolution tank 110a is cleaned with deionized water, so that the amount of the plating liquid mixed with the replacement liquid can be reduced. The introduction of the deionized water into the copper dissolution tank 110a can be achieved in substantially the same manner as the introduction of the replacement liquid into the copper dissolution tank 110a, except that only deionized water is introduced into the buffer container 111 from the deionized water supply source (but the undiluted replacement liquid is not introduced after the introduction of the deionized water).

Where the replacement liquid filled in the copper dissolution tank 110a, 110b is replaced again with the plating liquid, the following operation is performed. First, the replacement liquid is expelled from the copper dissolution tank 110a, 110b in substantially the same manner as when the plating liquid is expelled from the copper dissolution tank 110a, 110b for the replacement of the plating liquid with the replacement liquid. In this operation, however, the expelled replacement liquid is drained by closing the valve AV1-2 and opening the valve AV1-4 under the control of the system controller 155.

Thereafter, all the valves in the major constituent managing section 2 are closed, and then the valves AV1-2, AV1-5, AV3-2, AV3-1, AV2-1, for example, are opened under the control of the system controller 155. Thus, the plating liquid is introduced into the copper dissolution tank 110a.

Figure 23:
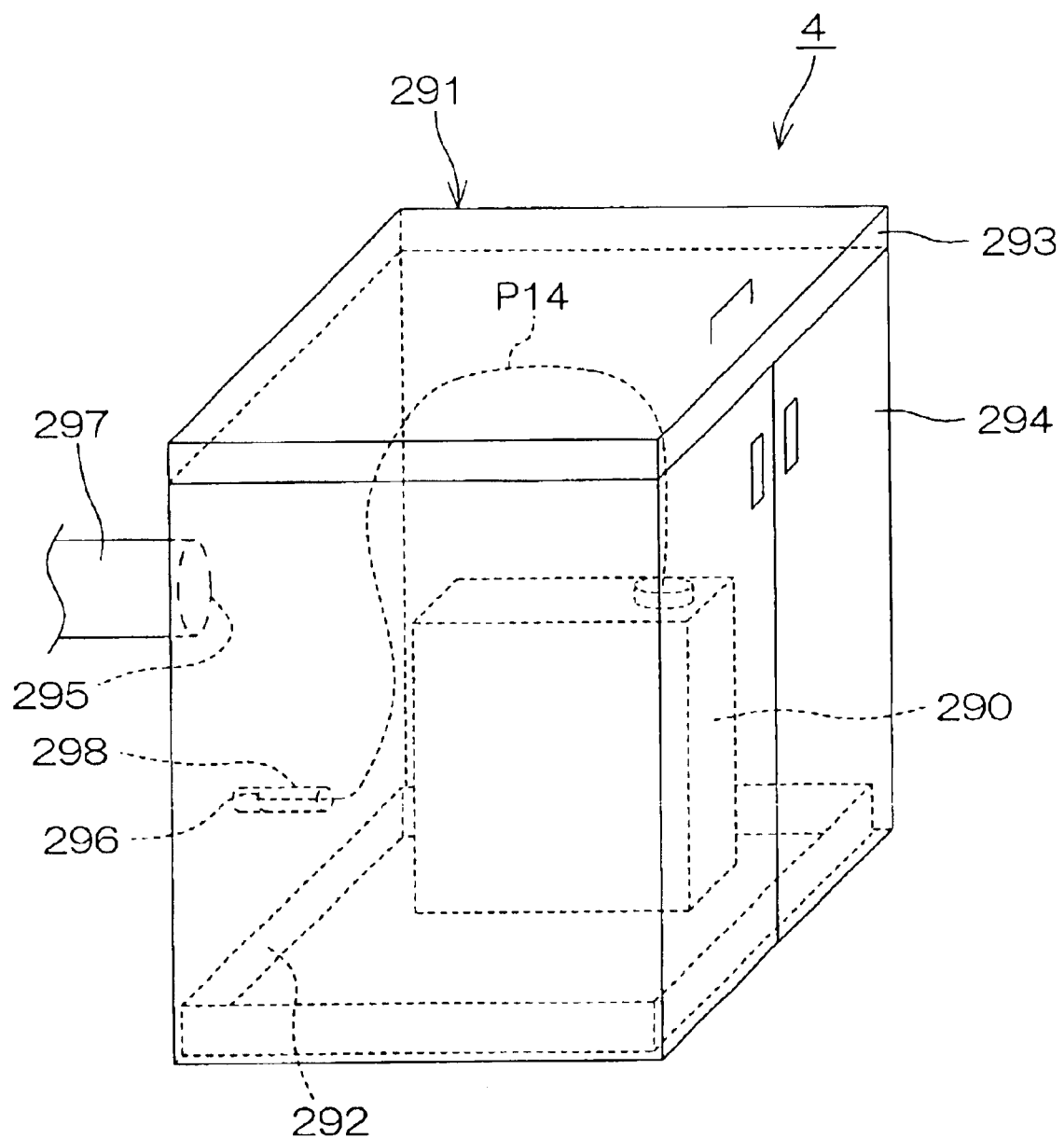
FIG. 23 is a schematic perspective view illustrating the construction of a post-treatment agent supplying section.

FIG. 23 is a schematic perspective view illustrating the construction of the post-treatment agent supplying section 4.

The post-treatment agent supplying section 4 includes a post-treatment agent tank 290 which contains the post-treatment agent (e.g., the etching liquid and the cleaning liquid) to be used in the bevel etching units 21a, 21b and the cleaning units 22a, 22b, and a tank enclosure 291 which houses the post-treatment agent tank 290. A liquid surface sensor not shown is attached to the post-treatment agent tank 290, and an output of the liquid surface sensor is inputted to the system controller 155. Thus, the system controller 155 can sense whether or not the surface level of the post-treatment agent in the post-treatment agent tank 290 is reduced below a predetermined level.

In this embodiment, only the single post-treatment agent tank 290 is shown, assuming that the same agent is employed as the etching liquid for use in the bevel etching units 21a, 21b and as the cleaning liquid for use in the cleaning units 22a, 22b. Where a plurality of post-treatment agents are used, a plurality of post-treatment agent tanks 290 may be employed.

The tank enclosure 291 has a top cover 293 and a front door 294. By opening the cover 293 or the door 294, the post-treatment agent tank 290 can be taken in and out of the tank enclosure 291. With the cover 293 and the door 294 being closed, the tank enclosure 291 is virtually sealed.

A vat 292 is provided on the bottom of the tank enclosure 291, and the post-treatment agent tank 290 is placed in the vat 292. The volume of the vat 292 is greater than the volume of the post-treatment agent tank 290 (where the plurality of post-treatment agent tanks 290 are provided, the total volume of the post-treatment agent tanks 290). Even if the post-treatment agent is entirely leaked out of the post-treatment agent tank 290, the leaked post-treatment agent can be received in the vat 292.

A leakage detection sensor not shown is provided in the bottom of the vat 292 for detecting the leakage of the post-treatment agent. An output of the leakage detection sensor is inputted to the system controller 155, so that the system controller 155 can detect the leakage of the post-treatment agent in the vat 292.

An air outlet port 295 and a post-treatment agent pipe introduction port 296 are provided in a rear face of the tank enclosure 291. An air outlet pipe 297 is connected to the air outlet port 295 for exhausting air from the tank enclosure 291. By exhausting air through the air outlet pipe 297 with the tank enclosure 291 being virtually sealed, the internal pressure of the tank enclosure 291 can be kept at a negative level.

The air outlet pipe 297 is connected to the exhauster system not shown. An air exhaustion pressure sensor not shown is provided in the air outlet pipe 297. An output of the air exhaustion pressure sensor is inputted to the system controller 155, so that the system controller 155 can detect an abnormal air exhaustion pressure.

A short protection pipe 298 is inserted through the post-treatment agent pipe introduction port 296, and the post-treatment agent pipe P14 is inserted through the protection pipe 298. That is, the two pipes are inserted through the post-treatment agent pipe introduction port 296.

The post-treatment agent pipe P14 extends from an inside bottom portion of the post-treatment agent tank 290 to each of the bevel etching units 21a, 21b and the cleaning units 22a, 22b. The valve 93V (see FIG. 19) and the valve 108V (see FIG. 20) provided in the post-treatment agent pipe P14 are disposed in the post-treatment agent supplying section 4 (though not shown in FIG. 23). By actuating a pump not shown with the valve 93V or 108V being open, the post-treatment agent (the etching liquid or the cleaning liquid) can be supplied into the bevel etching units 21a, 21b or the cleaning units 22a, 22b from the post-treatment agent tank 290.

Figure 24:
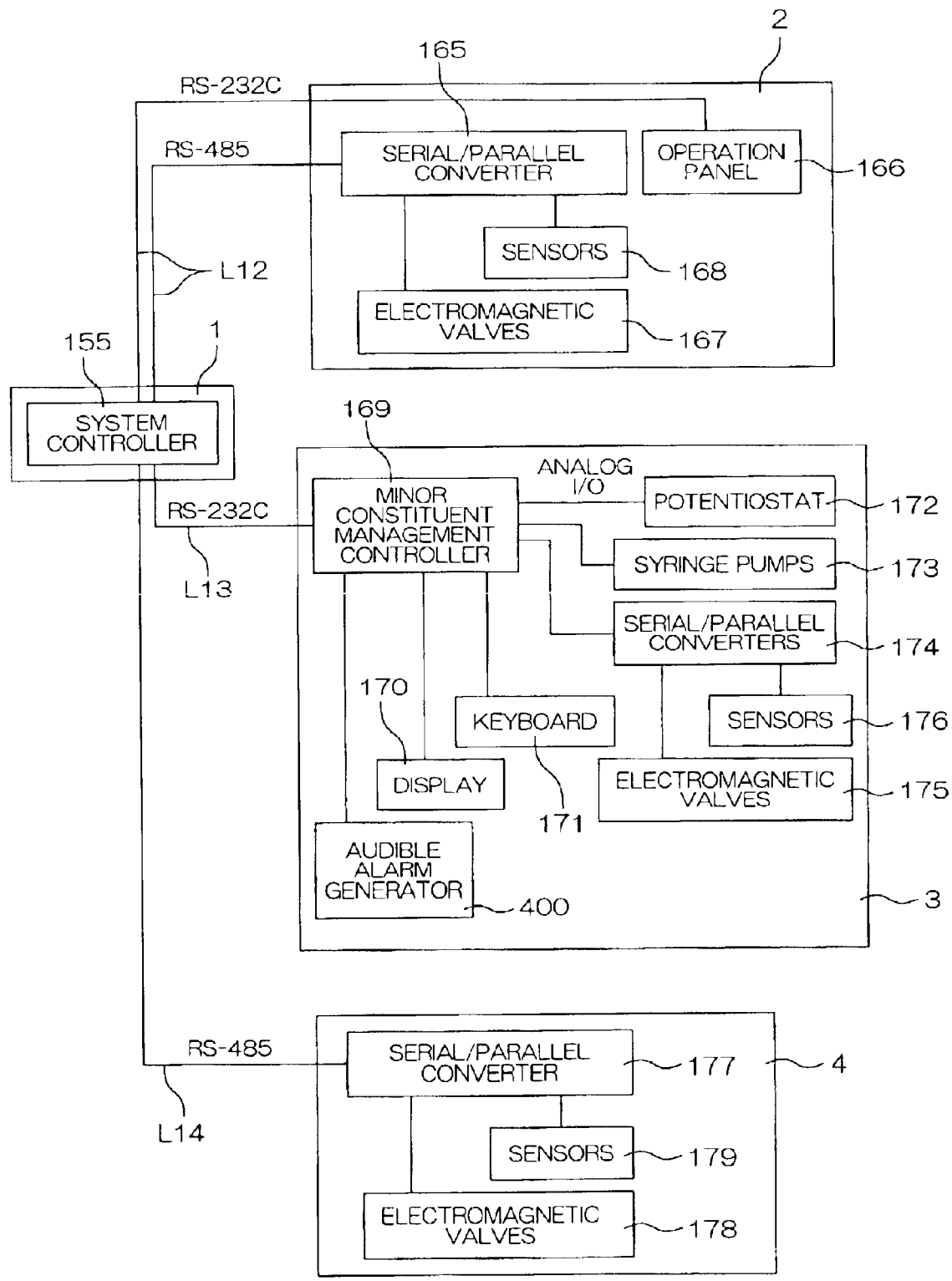
FIG. 24 is a block diagram illustrating the construction of control systems for the major constituent managing section, a minor constituent managing section and the post-treatment agent supplying section.

FIG. 24 is a block diagram illustrating the construction of control systems for the major constituent managing section 2, the minor constituent managing section 3 and the post-treatment agent supplying section 4.

The major constituent managing section 2 includes the serial/parallel converter 165 and an operation panel 166. The system controller 155 provided in the wafer treating section 1 is connected to the serial/parallel converter 165 via the RS-485 compatible serial port by a cable, and connected to the operation panel 166 via the RS-232C compatible serial port by a cable.

Electromagnetic valves 167 and sensors 168 (e.g., the constant volume check sensors 126, 133, the emptiness check sensors 127, 134 and the weight meters 154a, 154b (see FIG. 22)) are connected in parallel to the serial/parallel converter 165. The electromagnetic valves 167 are capable of controlling air valves (e.g., the valve AV1-1 and the like (see FIG. 22)). The operator can input and output information on the major constituent managing section 2 by means of the operation panel 166.

The minor constituent managing section 3 includes a minor constituent management controller 169, so that a control operation can be performed independently of the system controller 155 provided in the wafer treating section 1. The minor constituent management controller 169 is connected to the system controller 155 via the RS-232C compatible serial port by a cable.

A display 170, a keyboard 171, an audible alarm generator 400, a potentiostat (power source) 172, syringe pumps 173 and a serial/parallel converter 174 are connected to the minor constituent management controller 169. The display 170 and the keyboard 171 permit the operator to interact with the minor constituent management controller 169 for inputting and outputting information.

The syringe pumps 173 are capable of adding an indicator and the like dropwise to a sampled plating liquid when the concentrations of the minor constituents of the plating liquid are measured. Further, the syringe pumps 173 are capable of quantitatively dispensing replenishment liquids respectively containing the minor constituents in required amounts.

Electromagnetic valves 175 and sensors 176 (e.g., surface level sensors) are connected to the serial/parallel converter 174 by parallel cables. The magnetic valves 175 are capable of controlling air valves. The serial/parallel converter 174 converts serial signals from the minor constituent management controller 169 into parallel signals, which are in turn outputted to the electromagnetic valves 175 and the like. Further, the serial/parallel converter 174 converts parallel signals from the sensors 176 into serial signals, which are in turn outputted to the minor constituent management controller 169.

The post-treatment agent supplying section 4 includes a serial/parallel converter 177. The system controller 155 provided in the wafer treating section 1 is connected to the serial/parallel converter 177 via the RS-485 compatible serial port by a cable. Electromagnetic valves 178 and sensors 179 are connected to the serial/parallel converter 177 by parallel cables. The electromagnetic valves 178 are capable of controlling air valves (e.g., the valve 93V (see FIG. 19) and the valve 108V (see FIG. 20)). The sensors 179 include the liquid surface sensor, the air exhaustion pressure sensor and the leakage detection sensor.

Figure 25:
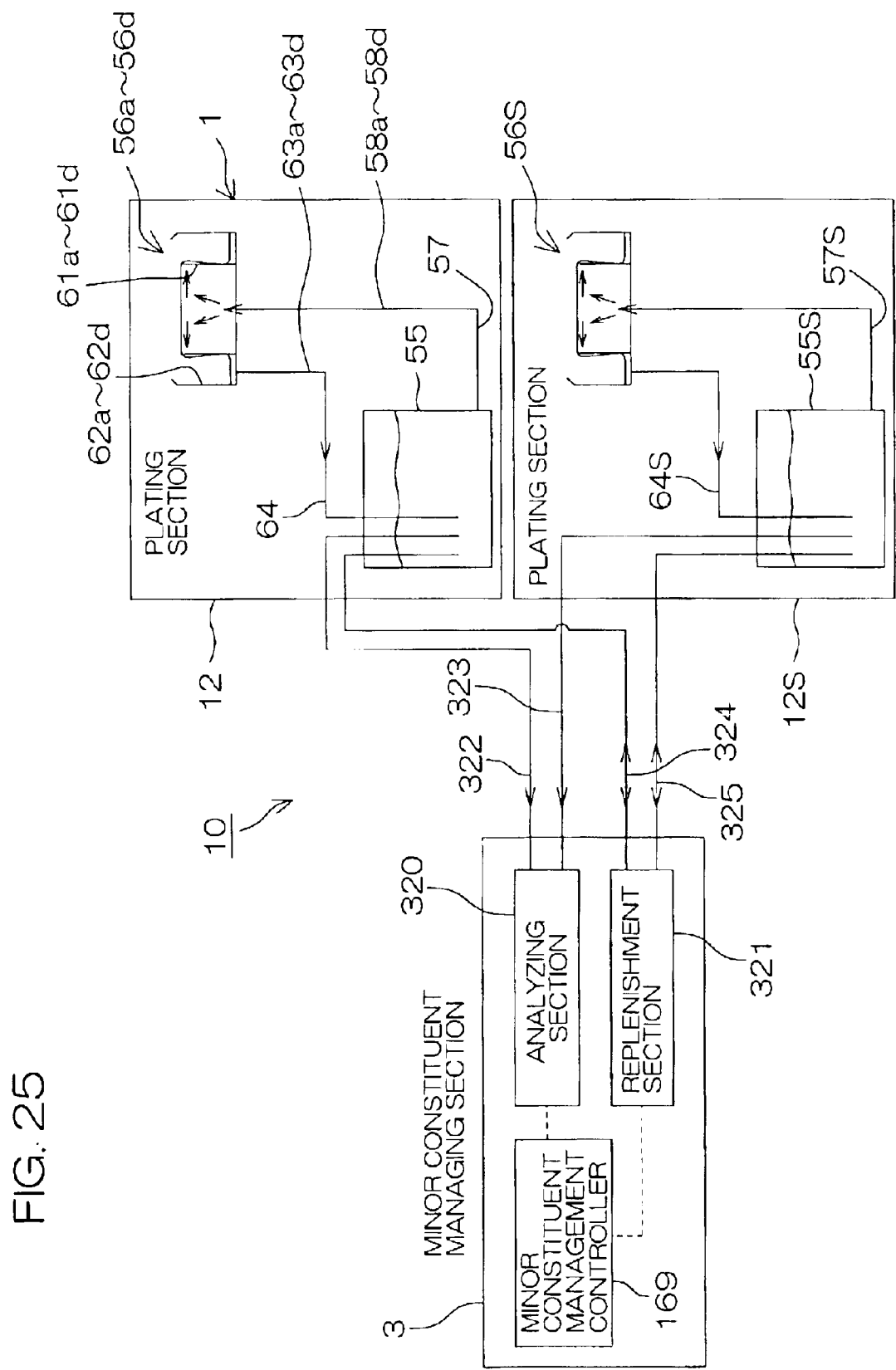
FIG. 25 is a schematic diagram illustrating the construction of the minor constituent managing section and connection between the minor constituent managing section and plating sections.

FIG. 25 is a schematic diagram illustrating the construction of the minor constituent managing section 3 and the connection between the minor constituent managing section and plating sections.

As shown in FIG. 25, the minor constituent managing section 3 can be connected to plating sections 12, 12S provided in different wafer treating sections. The minor constituent managing section 3 is capable of quantitatively analyzing minor constituents in plating liquids being respectively used in the plating sections 12, 12S, and adjusting the compositions of the respective plating liquids so that the concentrations of the minor constituents in the respective plating liquids are kept within predetermined concentration levels. Of course, the minor constituent managing section 3 may be connected to the single plating section 12 (12S).

The minor constituent managing section 3 includes an analyzing section 320 for quantitatively analyzing the plating accelerating additive (hereinafter referred to simply as "accelerator"), the plating retarding additive (hereinafter referred to simply as "retarder") and chlorine as the minor constituents of the plating liquids, a replenishment section 321 for supplying the accelerator, the retarder and chlorine to the respective plating liquids in the plating sections 12, 12S on the basis of the results of the analysis performed by the analyzing section 320 so that the concentrations of the accelerator, the retarder and chlorine in the respective plating liquids can be kept at the predetermined concentration levels, and the minor constituent management controller 169 for controlling the operations of the analyzing section 320 and the replenishment section 321.

The plating section 12S connected to the minor constituent managing section 3 has the same construction as the plating section 12. The plating section 12S includes a plating liquid container 55S which contains a great amount of the plating liquid, a plating cup 56S for performing the plating process on a wafer W, a liquid supply pipe 57S for supplying the plating liquid into the plating cup 56S from the plating liquid container 55S, and a return pipe 64S for returning the plating liquid from the plating cup 56S to the plating liquid container 55S.

Sampling pipes 322 and 323 are respectively connected between the plating liquid container 55 and the analyzing section 320 and between the plating liquid container 55S and the analyzing section 320. The sampling pipes 322 and 323 respectively extend into the vicinity of the bottoms of the plating liquid containers 55 and 55S, so that ends of the sampling pipes 322, 323 are submerged in the plating liquids in the respective plating liquid containers 55, 55S. Either of the sampling pipes 322, 323 is selected by the minor constituent management controller 169 to sample the plating liquid contained in the corresponding one of the plating liquid containers 55, 55S.

Replenishment pipes 324 and 325 are respectively connected between the plating liquid container 55 and the replenishment section 321 and between the plating liquid container 55S and the replenishment section 321. The replenishment pipes 324 and 325 respectively extend into the vicinity of the bottoms of the plating liquid containers 55 and 55S, so that ends of the replenishment pipes 324, 325 are submerged in the plating liquids in the respective plating liquid containers 55, 55S.

The concentrations of the minor constituents in the plating liquids change to be reduced below the predetermined concentration levels (or the predetermined concentration ranges) during the use of the plating liquids in the plating sections 12, 12S. Either of the replenishment pipes 324, 325 is selected by the minor constituent management controller 169 to supply the accelerator, the retarder and chlorine to the plating liquid contained in the corresponding one of the plating liquid containers 55, 55S. Thus, the concentrations of the minor constituents in the plating liquid can be adjusted at the predetermined concentration levels.

Thus, the single minor constituent managing section 3 can be shared by the two plating sections 12, 12S.

Figure 26:
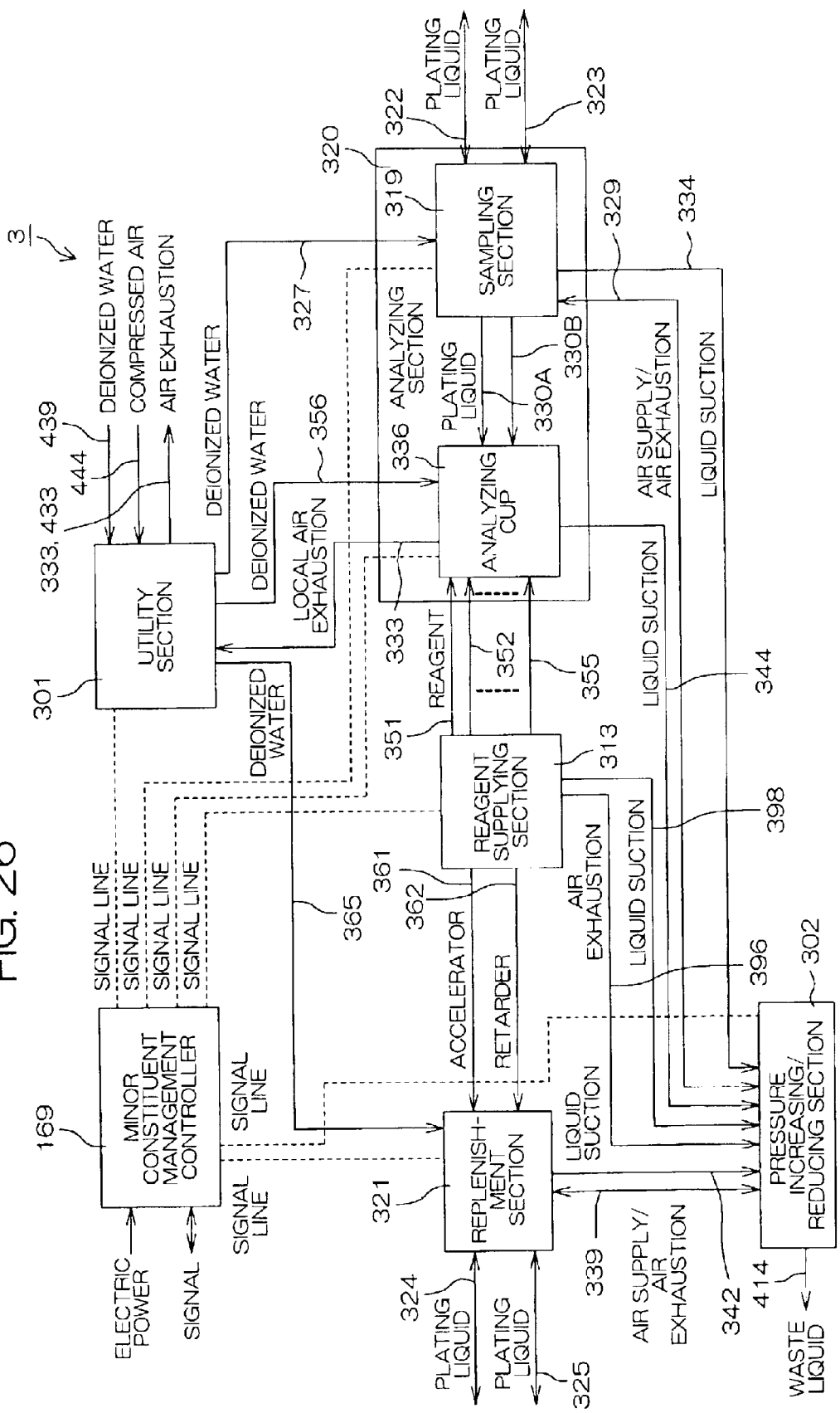
FIG. 26 is a block diagram illustrating the construction of the minor constituent managing section in detail.

FIG. 26 is a block diagram illustrating the construction of the minor constituent managing section 3 in detail.

In addition to the analyzing section 320, the replenishment section 321 and the minor constituent management controller 169, the minor constituent managing section 3 includes a utility section 301 for managing deionized water and compressed air to be used in the minor constituent managing section 3 and exhaustion of air from the minor constituent managing section 3, a reagent supplying section 313 for supplying analytic reagents to the analyzing section 320 and supplying replenishment liquids containing the minor constituents of the plating liquid to the replenishment section 321, and a pressure increasing/reducing section 302 for transporting liquids between the analyzing section 320, the replenishment section 321, the reagent supplying section 313 and the plating liquid containers 55, 55a by increasing and reducing the internal pressures of these sections.

The analyzing section 320 includes a sampling section 319 for sampling the plating liquid from the plating liquid container 55, 55S, and an analyzing cup 336 for containing the plating liquid for a titrimetric analysis and a CVS analysis or a CPVS analysis. The plating liquid sampled from the plating liquid container 55, 55S is taken into the sampling section 319, and then a predetermined volume of the sampled plating liquid is dispensed in the analyzing cup 336.

The plating liquid is introduced into the replenishment section 321 from the plating liquid container 55, 55S. In the replenishment section 321, the replenishment liquids are supplied into the plating liquid from the reagent supplying section 313, and the resulting plating liquid is fed back in to the plating liquid container 55, 55S. Thus, the concentrations of the minor constituents of the plating liquid in the plating liquid container 55, 55S can be kept at the proper concentration levels.

Deionized water is supplied to the sampling section 319, the analyzing cup 336 and the replenishment section 321 through the utility section 301. Air around the analyzing cup 336 can be exhausted from the minor constituent managing section 3 under the control of the utility section 301.

The pressure increasing/reducing section 302 is capable of supplying air into each sealed vessel for increasing the internal pressure of the sealed vessel and exhausting air from the sealed vessel for reducing the internal pressure of the sealed vessel. By the air exhausting or supplying operation of the pressure increasing/reducing section 302, any of the liquids contained in the sealed vessel can be discharged from the container. Waste plating liquid and reagents (replenishment liquids) occurring in the sampling section 319, the analyzing cup 336, the replenishment section 321 and the reagent supplying section 313 are sucked out by the pressure increasing/reducing section 302 and then discarded.

The minor constituent management controller 169 is connected to the sampling section 319, the analyzing cup 336, the reagent supplying section 313, the replenishment section 321, the utility section 301 and the pressure increasing/reducing section 302 by signal lines. Thus, the minor constituent management controller 169 can control the respective sections and acquire information from the respective sections.

Figure 27:
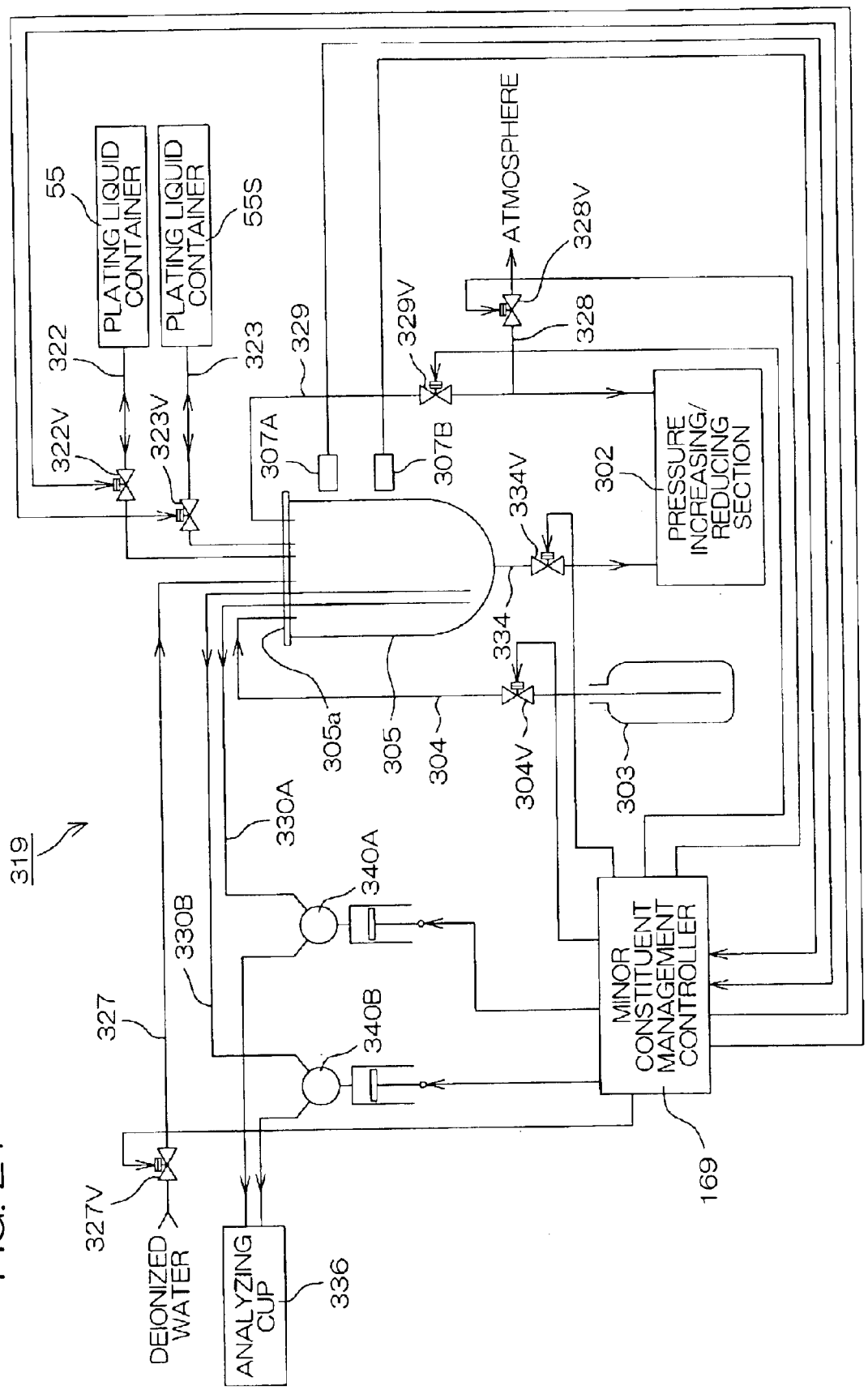
FIG. 27 is a schematic diagram illustrating the construction of a sampling section.

FIG. 27 is a schematic diagram illustrating the construction of the sampling section 319. The sampling section 319 includes a sampling vessel 305 for containing the plating liquid supplied through the sampling pipe 322, 323, and a reference plating liquid vessel 303 for containing a reference plating liquid to be used for calibration in the analyzing process. The reference plating liquid has a known accelerator concentration, a known retarder concentration, and a known chlorine concentration.

The sampling vessel 305 is composed of a resin, and has a volume of about 500 ml. At least one liquid surface sensor (two liquid surface sensors 307A, 307B in this embodiment) is attached to a lateral side of the sampling vessel 305. The liquid surface sensors 307A, 307B are capable of detecting the presence or absence of the plating liquid at the heights of the liquid surface sensors 307A, 307B in the sampling vessel 305. The liquid surface sensor 307A is located at a higher position than the liquid surface sensor 307B. Outputs of the liquid surface sensors 307A, 307B are inputted to the minor constituent management controller 169.

The sampling vessel 305 has an upper cover 305a, so that the sampling vessel 305 can virtually be sealed. An air inlet/outlet pipe 329 is connected between the sampling vessel 305 and the pressure increasing/reducing section 302. The air inlet/outlet pipe 329 extends into the sampling vessel 305 through a pipe introduction port provided in the upper cover 305a (through the upper cover 305a) to open into an upper portion of the sampling vessel 305 (in the vicinity of the upper cover 305a). With the sampling vessel 305 being virtually sealed, the internal pressure of the sampling vessel 305 can be increased or reduced by the pressure increasing/reducing section 302.

A valve 329V is provided in the air inlet/outlet pipe 329. One end of a leak pipe 328 is connected to the air inlet/outlet pipe 329 between the valve 329V and the pressure increasing/reducing section 302. The other end of the leak pipe 328 is open to the atmosphere. A valve 328V is provided in the leak pipe 328. By simultaneously opening the valves 329V, 328V, the internal pressure of the sampling vessel 305 can be set at the atmospheric pressure.

The sampling vessel 305 has a hemispherical bottom portion, and a drain port is provided in the lowest portion (at the center of the bottom) of the sampling vessel 305. One end of a drain pipe 334 is connected to the drain port. That is, the bottom of the sampling vessel 305 is inclined downward toward the drain port (toward the junction with the drain pipe 334).

The other end of the drain pipe 334 is connected to the pressure increasing/reducing section 302. A valve 334 V is provided in the drain pipe 334. With the valve 334V being open, the liquid in the sampling vessel 305 is sucked into the pressure increasing/reducing section 302 by the pressure increasing/reducing section 302. Since the bottom of the sampling vessel 305 is inclined downward toward the drain port, the liquid can generally completely be drained from the sampling vessel 305.

The sampling pipes 322, 323 extend into the sampling vessel 305 through the cover 305a to open into the vicinity of the upper cover 305a in the sampling vessel 305. Valves 322V and 323V are provided in the sampling pipes 322 and 323, respectively. By opening and closing the valves 322V, 323V, flow channels of the sampling pipes 322, 323 can be opened and closed.

A reference plating liquid transport pipe 304 extends from an inner bottom portion of the reference plating liquid container 303 to an inner upper portion of the sampling vessel 305. The reference plating liquid transport pipe 304 extends into the sampling vessel 305 through the upper cover 305a to open into the vicinity of the upper cover 305a in the sampling vessel 305. A valve 304V is provided in the reference plating liquid transport pipe 304.

With the aforesaid arrangement, the plating liquid in the plating liquid container 55, the plating liquid in the plating liquid container 55S or the reference plating liquid in the reference plating liquid container 303 can be transported into the sampling vessel 305 by reducing the internal pressure of the sampling vessel 305 by the pressure increasing/reducing section 302 with the sampling vessel 305 being virtually sealed, and opening the valve 322V, 323V or 304V.

Plating liquid transport pipes 330A, 330B are connected between the sampling vessel 305 and the analyzing cup 336. The plating liquid transport pipes 330A, 330B extend into the sampling vessel 305 through the upper cover 305a to open into the vicinity of the bottom of the sample vessel 305. A large volume syringe pump 340A is provided in the plating liquid transport pipe 330A, while a small volume syringe pump 340B is provided in the plating liquid transport pipe 330B.

The plating liquid or the reference plating liquid transported into the sampling vessel 305 can quantitatively be dispensed into the analyzing cup 305 through the plating liquid transport pipes 330A, 330B by means of the large volume syringe pump 340A and the small volume syringe pump 340B. The large volume syringe pump 340A and the small volume syringe pump 340B can dispense the plating liquid or the reference plating liquid, for example, in volumes of 50 ml and 500 µl, respectively, by each suction/discharge operation thereof. The large volume syringe pump 340A and the small volume syringe pump 340B can selectively be employed depending on the volume of the plaiting liquid or the reference plating liquid to be used in the analyzing cup 336.

A deionized water pipe 327 extends into the sampling vessel 305 through the upper cover 305a to be connected in communication with the sampling vessel 305. The deionized water pipe 327 opens into the vicinity of the upper cover 305a in the sampling vessel 305. A valve 327V is provided in the deionized water pipe 327. By opening the valve 327V, deionized water can be supplied into the sampling vessel 305 from the deionized water supply source.

The open ends of the air inlet/outlet pipe 329, the sampling pipes 322, 323, the reference plating liquid transport pipe 304 and the deionized water pipe 327 are each located at a higher position than the liquid surface sensor 307A in the sampling vessel 305. The open ends of the plating liquid transport pipes 330A, 330B are each located at a lower position than the liquid surface sensor 307B in the sampling vessel 305.

The opening and closing of the valves 322V, 323V, 328V, 329V, 334V, 304V, 327V and the operations of the large volume syringe pump 340A and the small volume syringe pump 340B are controlled by the minor constituent management controller 169. The valves 322V, 323V, 328V, 329V, 334V, 304V, 327V may be air valves.

Figure 28:
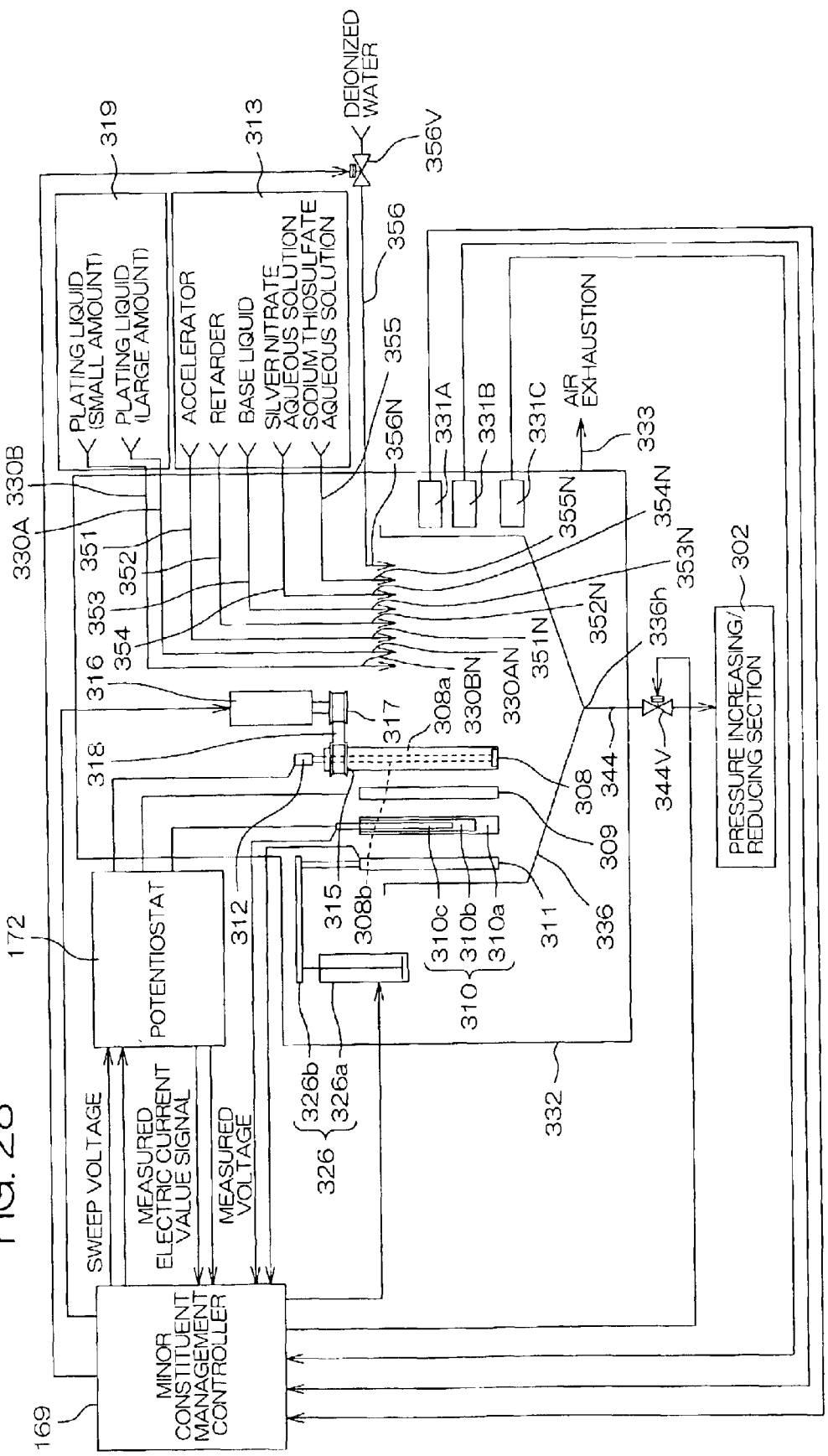
FIG. 28 is a schematic diagram illustrating the construction of an analyzing cup.

FIG. 28 is a schematic diagram illustrating the construction of the analyzing cup 336.

The analyzing cup 336 has an open top. Nozzles 330AN and 330BN provided in an upper portion of the analyzing cup 336 are respectively connected to the plating liquid transport pipes 330A and 330B. The plating liquid or the reference plating liquid transported from the sampling vessel 305 can be supplied into the analyzing cup 336 through the nozzle 330AN or 330BN.

That is, the plating liquid to be analyzed is once sampled from the plating liquid container 55 or 55S into the sampling vessel 305, and transported from the sampling vessel 305 to the analyzing cup 336. The sampling vessel 305 and the analyzing cup 336 are disposed adjacent each other in a common enclosure of the minor constituent managing section 3.

In the prior art, the plating liquid is sampled directly into the analyzing cup through a sampling tube connected between the plating liquid container in the wafer treating section and the analyzing cup, and then analyzed in the analyzing cup. In the present invention, however, the sampling vessel 305 and the analyzing cup 336 are provided adjacent each other, so that the plating liquid transport pipes 330A, 330B each have a significantly reduced length as compared with the sampling tube in the prior-art plating apparatus.

Therefore, the amount of the plating liquid to be transported can be controlled with a higher level of accuracy as compared with the prior-art plating apparatus. Since air is unlikely to be trapped in the plating liquid transport pipes 330A, 330B between the sampling vessel 305 and the analyzing cup 336 provided adjacent each other, deterioration in the accuracy of the transportation amount can be prevented. Therefore, the plating liquid can accurately quantitatively be dispensed for the CVS analysis, the CPVS analysis or the titrimetric analysis. Thus, the quantitative analysis can accurately be performed for the determination of the concentrations of the accelerator, the retarder and chlorine.

An accelerator transport pipe 351, a retarder transport pipe 352, a base liquid transport pipe 353, a silver nitrate aqueous solution transport pipe 354 and a sodium thiosulfate aqueous solution transport pipe 355 extend from the reagent supplying section 313 to the analyzing cup 336. Nozzles 351N, 352N, 353N, 354N and 355N provided in the upper portion of the analyzing cup 336 are connected to the accelerator transport pipe 351, the retarder transport pipe 352, the base liquid transport pipe 353, the silver nitrate aqueous solution transport pipe 354 and the sodium thiosulfate aqueous solution transport pipe 355, respectively. The accelerator, the retarder, a base liquid, a silver nitrate aqueous solution and a sodium thiosulfate aqueous solution can be supplied into the analyzing cup 336 through the nozzles 351N, 352N, 353N, 354N and 355N, respectively.

The base liquid is employed for diluting the plating liquid to be analyzed. The silver nitrate aqueous solution is employed as a reagent for the titrimetric analysis of chlorine. The sodium thiosulfate aqueous solution is employed for cleaning the analyzing cup 336 by removing silver chloride (AgCl) generated during the titrimetric analysis of chlorine.

A deionized water pipe 356 extends from the deionized water source to the analyzing cup 336. A valve 356V is provided in the deionized water pipe 356. A nozzle 356N provided in the upper portion of the analyzing cup 336 is connected to the deionized water pipe 356. By opening the valve 356V, deionized water can be supplied into the analyzing cup 336 through the nozzle 356N.

The nozzles 330AN, 330BN, 351N, 352N, 353N, 354N, 355N, 356N are each located at such a height as to be kept out of contact with liquid contained in the analyzing cup 336. The nozzles 330AN, 330BN, 351N, 352N, 353N, 354N, 355N, 356N are capillary tubes each produced by thinly drawing an end portion of a fluororesin tube to an open diameter of not greater than 1 mm. Thus, very small amounts of the plating liquid, the reference plating liquid, the accelerator, the retarder, the base liquid, the silver nitrate aqueous solution, the sodium thiosulfate aqueous solution and deionized water can be supplied dropwise into the analyzing cup 336.

The analyzing cup 336 has a funnel-shaped bottom portion downwardly tapered. A drain port 336h is provided at the lowest portion of the analyzing cup 336. That is, the bottom portion of the analyzing cup 336 is inclined downward toward the drain port 336h. One end of a drain pipe 344 is connected to the drain port 336h. The other end of the drain pipe 344 is connected to the pressure increasing/reducing section 302.

A valve 344V is provided in the drain pipe 344. With the valve 344V being open, the liquid in the analyzing cup 336 can be sucked into the pressure increasing/reducing section 302 by the pressure increasing/reducing section 302. Since the bottom portion of the analyzing cup 336 is inclined downward toward the drain port 336h (drain pipe 344), the liquid in the analyzing cup 336 can virtually completely be drained.

At least one liquid surface sensor (three liquid surface sensors 331A, 331B, 331C in this embodiment) is attached to a lateral side of the analyzing cup 336. The liquid surface sensors 331A, 331B, 331C are capable of detecting the presence or absence of the liquid at the heights of the liquid surface sensors 331A, 331B, 331C in the analyzing cup 336. Among the liquid surface sensors 331A, 331B, 331C, the liquid surface sensor 331A is located at the highest position, and the liquid surface sensor 331C is located at the lowest position. Output signals of the liquid surface sensors 331A, 331B, 331C are inputted to the minor constituent management controller 169.

A rotary electrode 308, a counter electrode 309, a reference electrode 310 and a silver/silver chloride electrode 311 are inserted in the analyzing cup 336. The counter electrode 309, the reference electrode 310 and the silver/silver chloride electrode 311 are disposed generally vertically.

The rotary electrode 308 is composed of platinum (Pt) and provided at one end of a cylindrical rod 308a of an insulative material. The rotary electrode 308 is of a disk shape having a smaller diameter than the rod 308a, and is flush with an end face of the rod 308a and coaxial with the rod 308a. The rod 308a is disposed vertically with the rotary electrode 308 facing downward. The rod 308a is held rotatably about a center axis thereof by a holder not shown.

An electrically conductive member 308b extends through the rod 308a along the center axis of the rod 308a. One end of the electrically conductive member 308b is electrically connected to the rotary electrode 308. The other end of the electrically conductive member 308b projects from the rod 308a, and a slip ring 312 is attached to the projection. A rotary terminal of the slip ring 312 is electrically connected to the electrically conductive member 308b, while a stationary terminal of the slip ring 312 is electrically connected to the potentiostat 172 via a conduction line.

A pulley 315 is fitted around an end portion of the rod 308a adjacent to the slip ring 312. A pulley 317 fitted around a rotation shaft of a motor 316 is disposed on a lateral side of the pulley 315. A belt 318 is stretched between the pulley 315 and the pulley 317. By driving the motor 316, the rotary electrode 308 can be rotated about the center axis of the rod 308a. The maximum rotation speed of the rotary electrode 308 may be, for example, 3000 rpm.

The counter electrode 309 is composed of copper, and has a rod shape. The counter electrode 309 is electrically connected to the potentiostat 172 via a conduction line.

The reference electrode 310 includes an outer glass tube 310a, an inner glass tube 310b provided in the outer glass tube 310a, and a silver/silver chloride electrode 310c provided in the inner glass tube 310b. The inner glass tube 310b is filled with a mixture of a potassium chloride aqueous solution and a sulfuric acid aqueous solution, and a space defined between the outer glass tube 310a and the inner glass tube 310b is filled with a 10-vol % sulfuric acid aqueous solution. The inside of the inner glass tube 310b slightly communicates with the outside of the outer glass tube 310a. The silver/silver chloride electrode 310c is electrically connected to the potentiostat 172 and the minor constituent management controller 169 via conduction lines.

The silver/silver chloride electrode 311 has an exposed silver chloride surface, which is brought into contact with the plating liquid contained in the analyzing cup 336 for the analysis. The silver/silver chloride electrode 311 is electrically connected to the minor constituent management controller 169 via a conduction line.

A vertical mechanism 326 is coupled to an upper end of the silver/silver chloride electrode 311 for moving up and down the silver/silver chloride electrode 311. The vertical mechanism 326 is driven by an air cylinder 326a as a drive source, and a piston of the air cylinder 326a is coupled to the silver/silver chloride electrode 311 by a coupling member 326b. The silver/silver chloride electrode 311 can be lifted by the vertical mechanism 326 so as to be brought out of contact with the liquid contained in the analyzing cup 336.

The minor constituent management controller 169 is capable of measuring the potential of the silver/silver chloride electrode 311 with respect to the reference potential of the silver/silver chloride electrode 310c of the reference electrode 310.

A sweep voltage specified by the minor constituent management controller 169 is applied to the potentiostat 172. The potentiostat 172 regulates an electric current flowing between the counter electrode 309 and the rotary electrode 308 so that a voltage between the reference electrode 310 and the rotary electrode 308 (action electrode) is equalized with the sweep voltage. A voltage indicative of an electric current level observed at this time is applied to the minor constituent management controller 169.

The analyzing cup 336 is housed in an analyzing cup chamber 332 defined by barrier walls. Air is exhausted from the analyzing cup chamber 322 through a dedicated air outlet pipe 333. In the analysis, the plating liquid contained in the analyzing cup 336 is stirred at a high speed by the rod 308a with the rotary electrode 308, so that mist of the plating liquid is generated. The mist is exhausted from the minor constituent managing section 3 through the air outlet pipe 333.

The opening and closing of the valves 356V, 344V and the operations of the motor 316 and the air cylinder 326a are controlled by the minor constituent management controller 169.

Figure 29:
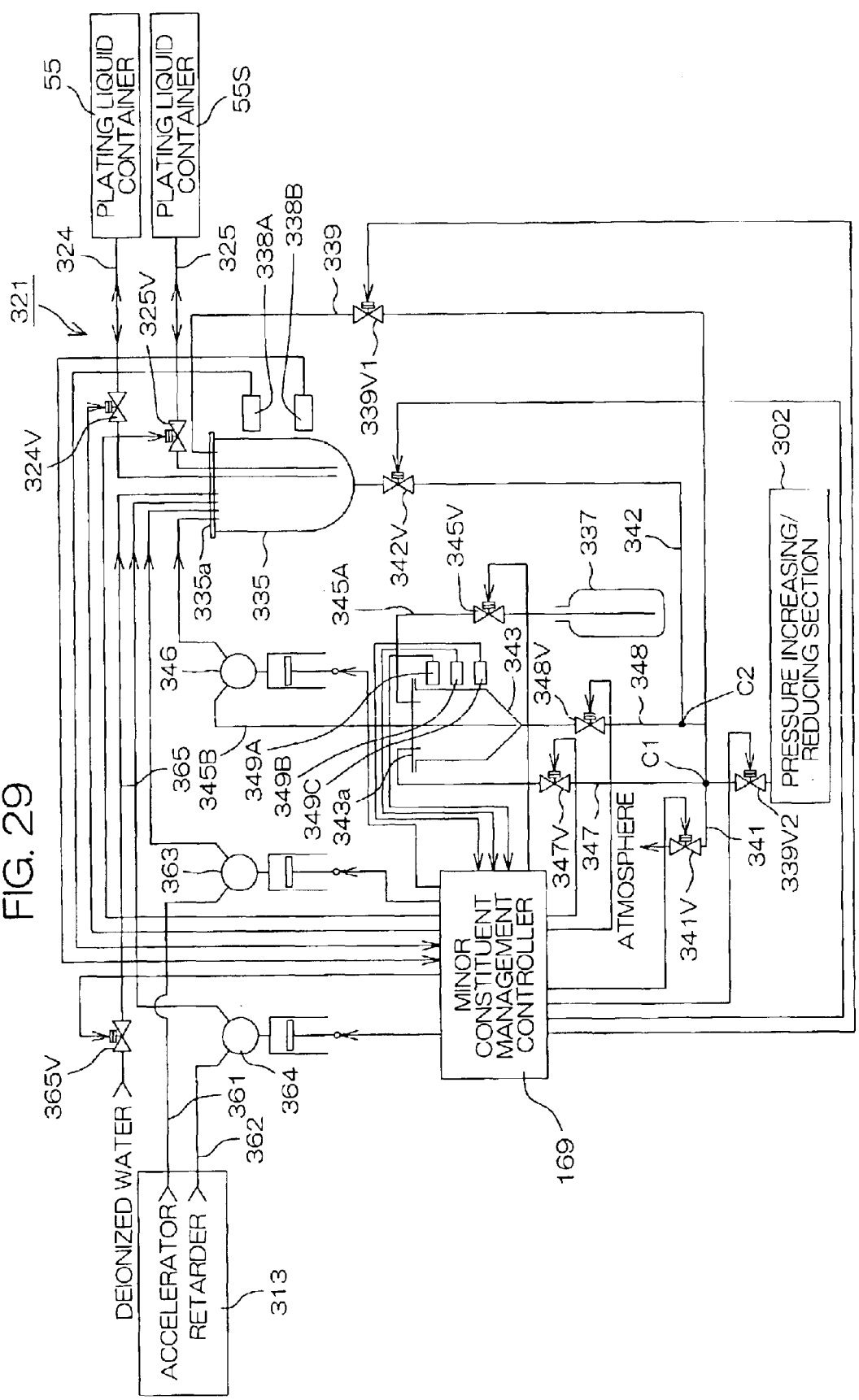
FIG. 29 is a schematic diagram illustrating the construction of a replenishment section.

FIG. 29 is a schematic diagram illustrating the construction of the replenishment section 321.

The replenishment section 321 includes a preparation vessel (mixing cup) 335 for containing the plating liquid, and a chlorine replenishment liquid container 337 which contains a chlorine replenishment liquid for replenishing the plating liquid with chlorine (chlorine ions). The chlorine replenishment liquid is supplied into the preparation vessel 335 from the chlorine replenishment liquid container 337 via the buffer cup 343. An accelerator replenishment liquid for replenishing the plating liquid with the accelerator and a retarder replenishment liquid for replenishing the plating liquid with the retarder are supplied into the preparation vessel 335 from the reagent supplying section 313.

In the replenishment section 321, a proper amount of the plating liquid is transported into the preparation vessel 335 from the plating liquid container 55, 55S, and the chlorine replenishment liquid, the accelerator replenishment liquid and the retarder replenishment liquid are added in proper amounts to the plating liquid in the preparation vessel 335. Then, the resulting plating liquid is returned into the plating liquid container 55, 55S.

The preparation vessel 335 is composed of a resin, and has a volume of about 500 ml. At least one liquid surface sensor (two liquid surface sensors 338A, 338B in this embodiment) is provided on a lateral side of the preparation vessel 335. The liquid surface sensors 338A, 338B are capable of detecting the presence or absence of the plating liquid at the heights of the liquid surface sensors 338A, 338B in the preparation vessel 335. The liquid surface sensor 338A is located at a higher position than the liquid surface sensor 338B. Outputs of the liquid surface sensors 338A, 338B are inputted to the minor constituent management controller 169.

The preparation vessel 335 has an upper cover 335a, and can virtually be sealed. An air inlet/outlet pipe 339 is connected between the preparation vessel 335 and the pressure increasing/reducing section 302. The air inlet/outlet pipe 339 extends into the preparation vessel 335 through a pipe introduction port provided in the upper cover 335a (through the upper cover 335a) to open into an upper portion of the preparation vessel 335 (in the vicinity of the upper cover 335a).

Two valves 339V1 and 339V2 are provided in the air inlet/outlet pipe 339 on the side of the preparation vessel 335 and on the side of the pressure increasing/reducing section 302, respectively. By opening the valves 339V1, 339V2 with the preparation vessel 335 being virtually sealed, the internal pressure of the preparation vessel 335 can be increased or reduced by the pressure increasing/reducing section 302.

One end of a leak pipe 341 is connected to the air inlet/outlet pipe 339 at a branch point C1 between the valves 339V1 and 339V2. The other end of the leak pipe 341 is open to the atmosphere. A valve 341V is provided in the leak pipe 341. The internal pressure of the preparation vessel 335 can be set at the atmospheric pressure by simultaneously opening the valves 339V1 and 341V.

The preparation vessel 335 has a hemispherical bottom portion, and a drain port is provided at the lowest portion (at the center of the bottom portion) of the preparation vessel 335. One end of a drain pipe 342 is connected to the drain port. That is, the bottom portion of the preparation vessel 335 is inclined downward toward the drain port (toward the junction with the drain pipe 342).

The other end of the drain pipe 342 is connected to the pressure increasing/reducing section 302. A valve 342V is provided in the drain pipe 342. With the valve 342V being open, liquid in the preparation vessel 335 can be sucked into the pressure increasing/reducing section 302 by the pressure increasing/reducing section 302. Since the bottom portion of the preparation vessel 335 is inclined downward toward the drain port (drain pipe 342), the liquid in the preparation vessel 335 can virtually completely be drained.

The replenishment pipes 324, 325 extend into the preparation vessel 335 through the upper cover 325a. The replenishment pipes 324, 325 open into the vicinity of the bottom of the preparation vessel 335. Valves 324V and 325V are provided in the replenishment pipes 324 and 325, respectively. Flow channels of the replenishment pipes 324, 325 can be opened and closed by opening and closing the valves 324V, 325V.

The buffer cup 343 is composed of a resin, and three liquid surface sensors 349A, 349B, 349C of an optical or capacitive type are attached to a lateral side of the buffer cup 343. The liquid surface sensors 349A, 349B, 349C are capable of detecting the presence or absence of the chlorine replenishment liquid at the heights of the sensors 349A, 349B, 349C in the buffer cup 343. Among the liquid surface sensors 349A, 349B, 349C, the liquid surface sensor 349A is located at the highest position, and the liquid surface sensor 349C is located at the lowest position. Outputs of the liquid surface sensors 349A, 349B, 349C are inputted to the minor constituent management controller 169.

The buffer cup 343 has an upper cover 343a, and can virtually be sealed. A chlorine replenishment liquid transport pipe 345A extends from a bottom portion of the chlorine replenishment liquid container 337 to an upper portion of the buffer cup 343. The chlorine replenishment liquid transport pipe 345A extends into the buffer cup 343 through the upper cover 343a to open into the vicinity of the upper cover 343a of the buffer cup 343. A valve 345V is provided in the chlorine replenishment liquid transport pipe 345A.

A chlorine replenishment liquid transport pipe 345B extends from the bottom of the buffer cup 343 to the upper portion of the preparation vessel 335 through the upper covers 343a, 335a. A syringe pump 346 is provided in the chlorine replenishment liquid transport pipe 345B.

An air inlet/outlet pipe 347 is connected between the buffer cup 343 and a branch point C1 of the air inlet/outlet pipe 339. The air inlet/outlet pipe 347 extends into the buffer cup 343 through the upper cover 343a to open into the upper portion of the buffer cup 343. A valve 347V is provided in the air inlet/outlet pipe 347. By opening the valves 347V, 339V2 with the buffer cup 343 being virtually sealed, the internal pressure of the buffer cup 343 can be reduced or increased by the pressure increasing/reducing section 302.

By reducing the internal pressure of the buffer cup 343, the chlorine replenishment liquid in the chlorine replenishment liquid container 337 can be sucked into the buffer cup 343 through the chlorine replenishment liquid transport pipe 345A. By simultaneously opening the valves 341V and 347V, the internal pressure of the buffer cup 343 is set at the atmospheric pressure. The chlorine replenishment liquid can be supplied into the preparation container 335 from the buffer cup 343 by the syringe pump 346.

The buffer cup 343 has a funnel-shaped bottom portion, and a drain port is provided at the lowest portion (at the center of the bottom portion) of the buffer cup 343. One end of a drain pipe 348 is connected to the drain port. That is, the bottom portion of the buffer cup 343 is inclined downward toward the drain port (toward the junction with the drain pipe 348).

The other end of the drain pipe 348 is connected to the drain pipe 342 at a branch point C2. The branch point C2 is located between the valve 342V and the pressure increasing/reducing section 302. A valve 348V is provided in the drain pipe 348. With the valve 348V being open, the chlorine replenishment liquid in the buffer cup 343 can be sucked into the pressure increasing/reducing section 302 by the pressure increasing/reducing section 302. Since the bottom portion of the buffer cup 343 is inclined downward toward the drain port (toward the drain pipe 348), the chlorine replenishment liquid can virtually completely be drained from the buffer cup 343.

The open ends of the chlorine replenishment liquid transport pipe 345A and the air inlet/outlet pipe 347 are each located at a higher position than the liquid surface sensor 349A in the buffer cup 343. The open end of the chlorine replenishment liquid transport pipe 345B is located at a lower position than the liquid surface sensor 349C in the buffer cup 343.

An accelerator replenishment liquid transport pipe 361 for transporting the accelerator replenishment liquid and a retarder replenishment liquid transport pipe 362 for transporting the retarder replenishment liquid are connected between the reagent supplying section 313 and the preparation vessel 335. The accelerator replenishment liquid transport pipe 361 and the retarder replenishment liquid transport pipe 362 extend into the preparation vessel 335 through the upper cover 335a to open into the upper portion of the preparation vessel 335.

A syringe pump 363 is provided in the accelerator replenishment liquid transport pipe 361, while a syringe pump 364 is provided in the retarder replenishment liquid transport pipe 362. The accelerator replenishment liquid and the retarder replenishment liquid are quantitatively dispensed into the preparation vessel 335 from the reagent supplying section 313 through the accelerator replenishment liquid transport pipe 361 and the retarder replenishment liquid transport pipe 362 by the syringe pumps 363 and 364, respectively.

A deionized water pipe 365 extends into the preparation vessel 335 through the upper cover 335a to be connected in communication with the preparation vessel 335. The deionized water pipe 365 opens into the vicinity of the upper cover 335a in the preparation vessel 335. A valve 365V is provided in the deionized water pipe 365. By opening the valve 365V, deionized water can be supplied into the preparation vessel 335 from the deionized water supply source.

The open ends of the air inlet/outlet pipe 339, the chlorine replenishment liquid transport pipe 345B, the accelerator replenishment liquid transport pipe 361, the retarder replenishment liquid transport pipe 362 and the deionized water pipe 365 are each located at a higher position than the liquid surface sensor 338A in the preparation vessel 335. The open ends of the replenishment pipes 324, 325 are each located at a lower position than the liquid surface sensor 338B in the preparation vessel 335.

The opening and closing of the valves 324V, 325V, 339V1, 339V2, 342V, 341V, 347V, 348V, 345V, 365V and the operations of the syringe pumps 346, 363, 364 are controlled by the minor constituent management controller 169. The valves 324V, 325V, 339V1, 339V2, 342V, 341V, 347V, 348V, 345V, 365V may be air valves.

Figure 30:
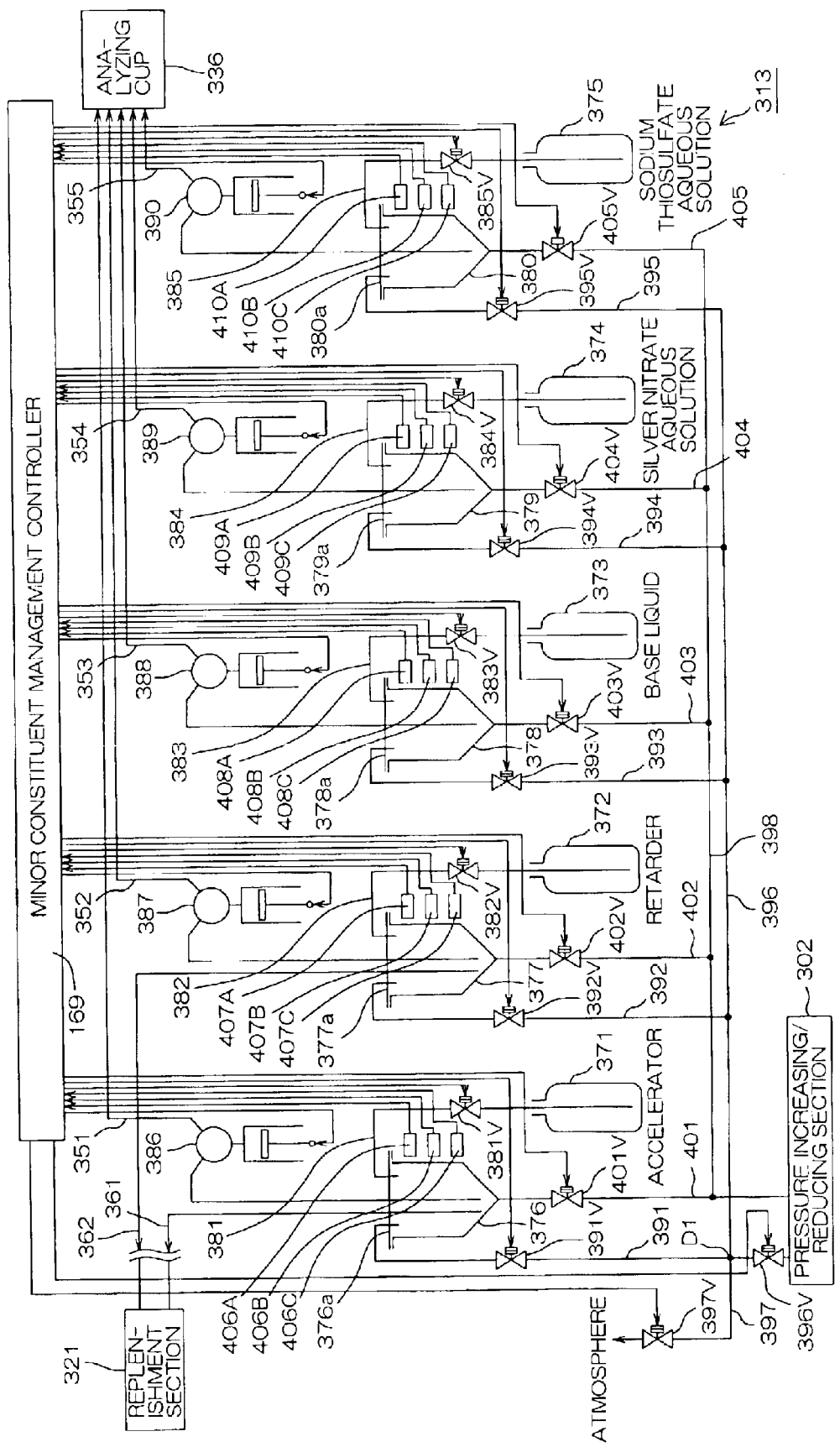
FIG. 30 is a schematic diagram illustrating the construction of a reagent supplying section.

FIG. 30 is a schematic diagram illustrating the construction of the reagent supplying section 313.

The reagent supplying section 313 includes an accelerator container 371 which contains the accelerator, a retarder container 372 which contains the retarder, a base liquid container 373 which contains the base liquid, a silver nitrate aqueous solution container 374 which contains the silver nitrate aqueous solution, and a sodium thiosulfate aqueous solution container 375 which contains the sodium thiosulfate aqueous solution. The base liquid has substantially the same composition as the plating liquid having a predetermined composition but does not contain the minor constituents. The silver nitrate aqueous solution has a concentration of 0.01 N, for example.

The accelerator is supplied as a reagent to the analyzing cup 336 and as the accelerator replenishment liquid to the replenishment section 321 from the accelerator container 371 via a buffer cup 376. The retarder is supplied as a reagent to the analyzing cup 336 and as the retarder replenishment liquid to the replenishment section 321 from the retarder container 372 via a buffer cup 377.

The base liquid is supplied to the analyzing cup 336 from the base liquid container 373 via a buffer cup 378. The silver nitrate aqueous solution is supplied to the analyzing cup 336 from the silver nitrate aqueous solution container 374 via a buffer cup 379. The sodium thiosulfate aqueous solution is supplied to the analyzing cup 336 from the sodium thiosulfate aqueous solution container 375 via a buffer cup 380.

The buffer cups 376 to 380 are composed of a resin, and each have a volume corresponding to the amount of liquid to be supplied at each time. Three liquid surface sensors 406A to 410A, 406B to 410B, 406C to 410C of an optical or capacitive type are attached to a lateral side of each of the buffer cups 376 to 380. The liquid surface sensors 406A to 410A, 406B to 410B and 406C to 410C are capable of detecting the presence or absence of the liquids at the heights of the liquid surface sensors in the respective buffer cups 376 to 380.

Among the liquid surface sensors 406A to 410A, 406B to 410B and 406C to 410C, the liquid surface sensors 406A to 410A are located at the highest positions, and the liquid surface sensors 406C to 410C are located at the lowest positions. Outputs of the liquid surface sensors 406A to 410A, 406B to 410B and 406C to 410C are inputted to the minor constituent management controller 169.

The buffer cups 376 to 380 respectively have upper covers 376a to 380a, and can virtually be sealed. An accelerator transport pipe 381, a retarder transport pipe 382, a base liquid transport pipe 383, a silver nitrate aqueous solution transport pipe 384 and a sodium thiosulfate aqueous solution transport pipe 385 respectively extend from bottom portions of the accelerator container 371, the retarder container 372, the base liquid container 373, the silver nitrate aqueous solution container 374 and the sodium thiosulfate aqueous solution container 375 to upper portions of the buffer cups 376 to 380.

The accelerator transport pipe 381, the retarder transport pipe 382, the base liquid transport pipe 383, the silver nitrate aqueous solution transport pipe 384 and the sodium thiosulfate aqueous solution transport pipe 385 respectively extend into the buffer cups 376 to 380 through the upper covers 376a to 380a to open into the vicinity of the upper covers 376a to 380a in the buffer cups 376 to 380. Valves 381V to 385V are respectively provided in the accelerator transport pipe 381, the retarder transport pipe 382, the base liquid transport pipe 383, the silver nitrate aqueous solution transport pipe 384 and the sodium thiosulfate aqueous solution transport pipe 385.

An accelerator transport pipe 351, a retarder transport pipe 352, a base liquid transport pipe 353, a silver nitrate aqueous solution transport pipe 354 and a sodium thiosulfate aqueous solution transport pipe 355 respectively extend from the bottoms of the buffer cups 376 to 380 to the upper portion of the analyzing cup 336. Syringe pumps 386 to 390 are respectively provided in the accelerator transport pipe 351, the retarder transport pipe 352, the base liquid transport pipe 353, the silver nitrate aqueous solution transport pipe 354 and the sodium thiosulfate aqueous solution transport pipe 355. The volumes of the syringe pumps 386 to 390 (the amounts of the liquids to be supplied by each suction/discharge operation) differ depending on the type of the reagent to be supplied.

Air inlet/outlet pipes 391 to 395 respectively extend into the buffer cups 376 to 380 through the upper covers 376a to 380a. The air inlet/outlet pipes 391 to 395 respectively open into the vicinity of the upper covers 376a to 380a in the buffer cups 376 to 380. The air inlet/outlet pipes 391 to 395 are connected in communication with a common air inlet/outlet pipe 396, which is connected to the pressure increasing/reducing section 302.

Valves 391V to 395V are respectively provided in the air inlet/outlet pipes 391 to 395. A valve 396V is provided in the common air inlet/outlet pipe 396 at a position closer to the pressure increasing/reducing section 302 than the air inlet/outlet pipes 391 to 395. By opening the valve 396V and one of the valves 391V to 395V with a corresponding one of the buffer cups 376 to 380 being virtually sealed, the internal pressure of the corresponding buffer cup 376 to 380 can be reduced or increased by the pressure increasing/reducing section 302.

One end of a leak pipe 397 is connected to the common air inlet/outlet pipe 396 at a junction D1 with the air inlet/outlet pipe 391. The other end of the leak pipe 397 is open to the atmosphere. A valve 397V is provided in the leak pipe 397. By simultaneously opening the valve 397V and one of the valves 391V to 395V, the internal pressure of a corresponding one of the buffer cups 376 to 380 can be set at the atmospheric pressure.

The buffer cups 376 to 380 each have a funnel-shaped bottom portion, and one end of a drain pipe 401 to 405 is connected to the lowest portion (the center of the bottom portion) of the buffer cup 376 to 380. That is, the bottom portion of each of the buffer cups 376 to 380 is inclined downward toward a drain port (toward the junction with the drain pipe 401 to 405).

The other ends of the drain pipes 401 to 405 are connected in communication with a common drain pipe 398. The common drain pipe 398 is connected to the pressure increasing/reducing section 302. Valves 401V to 405V are respectively provided in the drain pipes 401 to 405. With one of the valves 401V to 405V being open, liquid in a corresponding one of the buffer cups 376 to 380 can be sucked into the pressure increasing/reducing section 302 by the pressure increasing/reducing section 302. Since the bottom portion of each of the buffer cups 376 to 380 is inclined downward toward the drain port (toward the drain pipe 401 to 405), the liquid can virtually completely be drained from the buffer cup 376 to 380.

The accelerator replenishment liquid transport pipe 361 and the retarder replenishment liquid transport pipe 362 respectively extend into the buffer cups 376 and 377 through the upper covers 376a and 377a. The accelerator replenishment liquid transport pipe 361 and the retarder replenishment liquid transport pipe 362 respectively open in the bottom portions of the buffer cups 376 and 377.

The open ends of the accelerator transport pipe 381 and the air inlet/outlet pipe 391 are each located at a higher position than the liquid surface sensor 406A in the buffer cup 376. The open ends of the accelerator transport pipe 351 and the accelerator replenishment liquid transport pipe 361 are each located at a lower position than the liquid surface sensor 406C in the buffer cup 376.

The open ends of the retarder transport pipe 382 and the air inlet/outlet pipe 392 are each located at a higher position than the liquid surface sensor 407A in the buffer cup 377. The open ends of the retarder transport pipe 352 and the retarder replenishment liquid transport pipe 362 are each located at a lower position than the liquid surface sensor 407C in the buffer cup 377.

The open ends of the base liquid transport pipe 383 and the air inlet/outlet pipe 393 are each located at a higher position than the liquid surface sensor 408A in the buffer cup 378. The open end of the base liquid transport pipe 353 is located at a lower position than the liquid surface sensor 408C in the buffer cup 378.

The open ends of the silver nitrate aqueous solution transport pipe 384 and the air inlet/outlet pipe 394 are each located at a higher position than the liquid surface sensor 409A in the buffer cup 379. The open end of the silver nitrate aqueous solution transport pipe 354 is located at a lower position than the liquid surface sensor 409C in the buffer cup 379.

The open ends of the sodium thiosulfate aqueous solution transport pipe 385 and the air inlet/outlet pipe 395 are each located at a higher position than the liquid surface sensor 410A in the buffer cup 380. The open end of the sodium thiosulfate aqueous solution transport pipe 355 is located at a lower position than the liquid surface sensor 410C in the buffer cup 380.

The buffer cup 343 (see FIG. 29) and the buffer cups 376 to 380 have substantially the same construction, and are connected to the respective liquid containers, the analyzing cup 336 or the preparation vessel 335, and the pressure increasing/reducing section 302 in substantially the same manner. An explanation will hereinafter be given to the function of the buffer cup 376 as an example.

When it is judged that the accelerator is not present at the height of the liquid surface sensor 406B in the buffer cup 376, the minor constituent management controller 169 controls the pressure increasing/reducing section 302 and the valve 381V to reduce the internal pressure of the buffer cup 376 until the accelerator is detected by the liquid surface sensor 406A. Since the internal pressure of the accelerator container 371 is kept at the atmospheric pressure, the accelerator is supplied from the accelerator container 371 into the buffer cup 376. Thus, the surface level of the accelerator in the buffer cup 376 rises above the height of the liquid surface sensor 406A.

When the accelerator is detected by the liquid surface sensor 406A, the valve 381V is closed and the valves 397V, 391V are opened under the control of the minor constituent management controller 169, so that the internal pressure of the buffer cup 376 is set at the atmospheric pressure. Thus, the supply of the accelerator from the accelerator container 371 to the buffer cup 376 is stopped.

Where the accelerator is contained in a sufficient amount in the accelerator container 371, the surface level of the accelerator reaches the height of the surface level sensor 406A within a predetermined period. Where the accelerator is contained in an insufficient amount in the accelerator container 371, however, the accelerator cannot be supplied in a required amount to the buffer cup 376, so that the surface level of the accelerator does not reach the height of the liquid surface sensor 406A in the buffer cup 376.

If the liquid surface sensor 406A does not detect the accelerator even after the internal pressure of the buffer cup 376 is reduced for the predetermined period, the minor constituent management controller 169 controls the audible alarm generator 400 and the display 170 (see FIG. 24) to give an audible alarm and to display on the display 170 a message that the accelerator container 371 is empty. In this case, the operator replaces the accelerator container 371 with another accelerator container 371 containing a predetermined amount of the accelerator.

Thus, the accelerator in the accelerator container 371 can be used up, and the accelerator can constantly be contained in not smaller than a predetermined amount in the buffer cup 376. That is, there is virtually no possibility that the surface level of the accelerator in the buffer cup 376 is lowered below the height of the liquid surface sensor 406B. Since the open ends of the accelerator transport pipe 351 and the accelerator replenishment liquid transport pipe 361 are each located at a lower position than the liquid surface sensor 406B in the buffer cup 376, there is no possibility that air is trapped in the accelerator transport pipe 351 and the accelerator replenishment liquid transport pipe 361. Therefore, the accelerator (accelerator replenishment liquid) can be supplied exactly in a required amount into the analyzing cup 336 or the preparation vessel 335 by the syringe pump 386 or the syringe pump 363.

If the surface level of the accelerator in the buffer cup 376 is lowered below the height of the liquid surface sensor 406C, the minor constituent management controller 169 controls the audible alarm generator 400 and the display 170 to give an audible alarm and to display on the display 170 a message that the accelerator in the buffer cup 376 is almost used up. Even if the surface level of the accelerator is lowered to the height of the liquid surface sensor 406C for some reason (e.g., when the accelerator container 371 is left empty), the alarm calls for operator's attention, so that the operator can take proper measures (e.g., replace the accelerator container 371) for prevention of entrapment of air in the accelerator transport pipe 351.

Similarly, the chlorine replenishment liquid, the retarder (retarder replenishment liquid), the base liquid, the silver nitrate aqueous solution and the sodium thiosulfate aqueous solution can be supplied exactly in required amounts into the preparation vessel 335 or the analyzing cup 336 without entrapment of air in the chlorine replenishment liquid transport pipe 345B, the retarder replenishment liquid transport pipe 362, the retarder transport pipe 352, the base liquid transport pipe 353, the silver nitrate aqueous solution transport pipe 354 and the sodium thiosulfate aqueous solution transport pipe 355.

Where the chlorine replenishment liquid, the accelerator, the retarder, the base liquid, the silver nitrate aqueous solution and the sodium thiosulfate aqueous solution in the buffer cups 343 and 376 to 380 are refreshed, the internal pressures of the buffer cups 343 and 376 to 380 are increased and the valves 348V and 401V to 405V are opened under the control of the minor constituent management controller 169. After a lapse of a predetermined period from the non-detection of the liquids in the buffer cups 343 and 376 to 380 by the liquid surface sensors 349C and 406C to 410C, the valves 348V and 401V to 405V are closed under the control of the minor constituent management controller 169, whereby the internal pressures of the buffer cups 343 and 376 to 380 are set at the atmospheric pressure.

Thus, the chlorine replenishment liquid, the accelerator, the retarder, the base liquid, the silver nitrate aqueous solution and the sodium thiosulfate aqueous solution are virtually completely drained from the buffer cups 343 and 376 to 380, and transported to the pressure increasing/reducing section 302.

Figure 31:
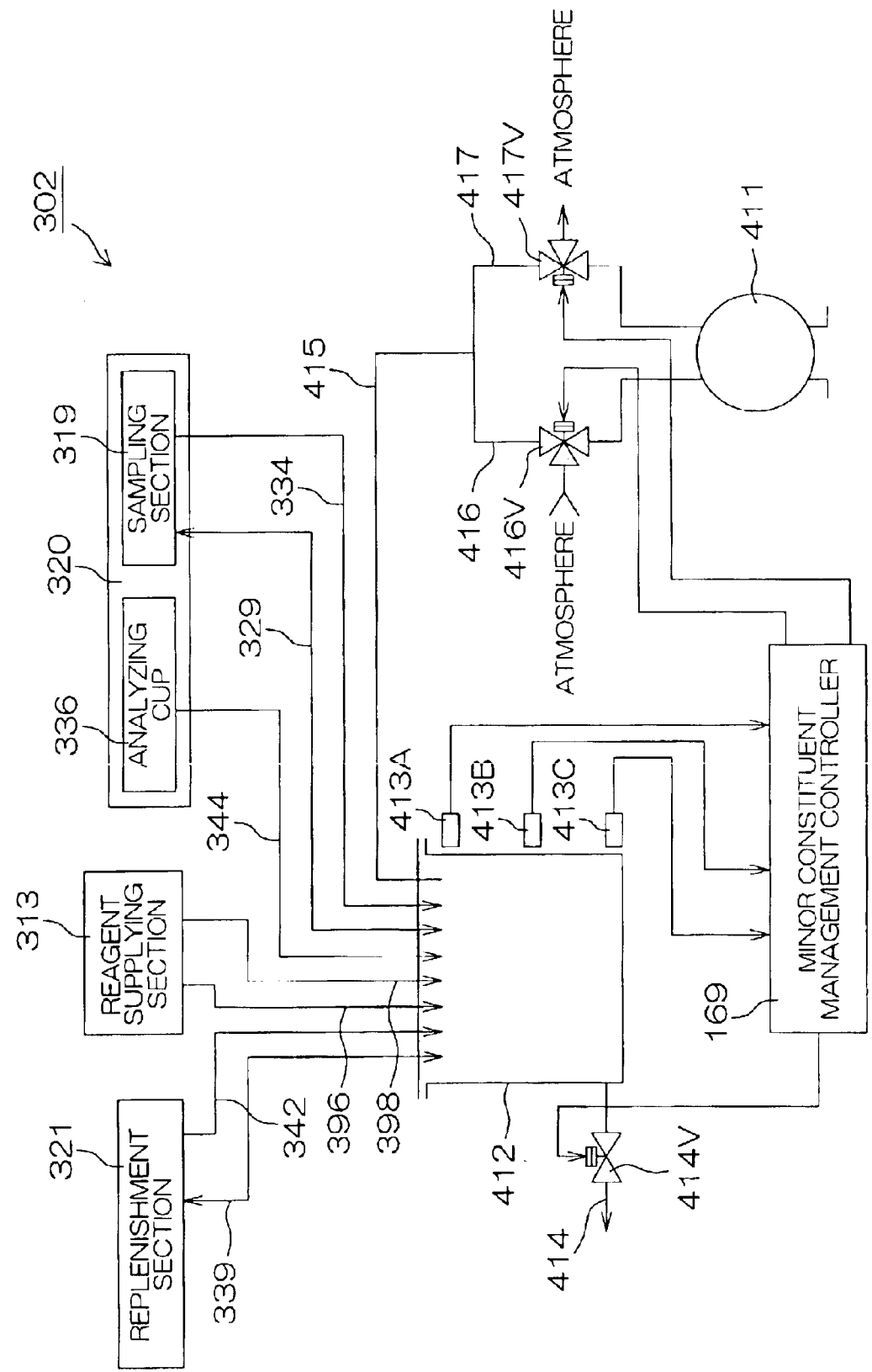
FIG. 31 is a schematic diagram illustrating the construction of a pressure increasing/reducing section.

FIG. 31 is a schematic diagram illustrating the construction of the pressure increasing/reducing section 302. The pressure increasing/reducing section 302 includes a pressure increasing/reducing tank 412 and an air pump 411.

The pressure increasing/reducing tank 412 is sealed, and at least two liquid surface sensors (three liquid surface sensors 413A, 413B, 413C in this embodiment) are attached to a lateral side of the pressure increasing/reducing tank 412. The liquid surface sensors 413A, 413B, 413C are capable of detecting the presence or absence of liquid at the heights of the liquid surface sensors 413A, 413B, 413C in the pressure increasing/reducing tank 412. Among the liquid surface sensors 413A, 413B, 413C, the liquid surface sensor 413A is located at the highest position, and the liquid surface sensor 413C is located at the lowest position. Outputs of the liquid surface sensors 413A, 413B, 413C are inputted to the minor constituent management controller 169.

Pipe introduction ports are provided in the top of the pressure increasing/reducing tank 412. The air inlet/outlet pipe 329 and the drain pipe 334 from the sampling section 319, the drain pipe 344 from the analyzing cup 336, the common air inlet/outlet pipe 396 and the common drain pipe 398 from the reagent supplying section 313, and the air inlet/outlet pipe 339 and the drain pipe 342 from the replenishment section 321 are connected in communication with the pressure increasing/reducing tank 412 through the pipe introduction ports. The open ends of the air inlet/outlet pipes 329, 339, the common air inlet/outlet pipe 396, the drain pipes 334, 342 and the common drain pipe 398 are each located at a higher position than the liquid surface sensor 413A in the pressure increasing/reducing tank 412.

A drain pipe 414 is connected to a side wall of the pressure increasing/reducing tank 412 at a lower position than the liquid surface sensor 413C in communication with the pressure increasing/reducing tank 412. A valve 414V is provided in the drain pipe 414. By opening the valve 414V, the liquid in the pressure increasing/reducing tank 412 can be drained. The drained liquid is discarded.

The pressure increasing/reducing tank 412 is connected in communication with the air pump 411 through an air inlet/outlet pipe 415. The air pump 411 includes an air exhaustion pipe 416 and an air supply pipe 417. The air inlet/outlet pipe 415 is connected in communication with the air exhaustion pipe 416 and the air supply pipe 417. A three-way valve 416V is provided in the air exhaustion pipe 416, while a three-way valve 417V is provided in the air supply pipe 417.

By actuating the air pump 411 with communication being established between the air pump 411 and the atmosphere by the three-way valve 416V and between the air pump 411 and the air inlet/outlet pipe 415 by the three-way valve 417V, air can be supplied into the pressure increasing/reducing tank 412. By actuating the air pump 411 with communication being established between the air pump 411 and the air inlet/outlet pipe 415 by the three-way valve 416V and between the air pump 411 and the atmosphere by the three-way valve 417V, air can be exhausted from the pressure increasing/reducing tank 412.

Thus, the internal pressures of the sampling vessel 305 (see FIG. 27) and the preparation vessel 335 (see FIG. 29) can be increased or reduced, and the internal pressures of the buffer cups 376 to 380 (see FIG. 30) can be reduced via the pressure increasing/reducing tank 412. By reducing the internal pressure of the pressure increasing/reducing tank 412, liquid (waste liquid) can be sucked into the pressure increasing/reducing tank 412 from the sampling vessel 305, the analyzing cup 336 (see FIG. 28), the preparation vessel 335 or the buffer cup 376 to 380 by a difference in internal pressure between the pressure increasing/reducing tank 412 and the sampling vessel 305, the analyzing cup 336, the preparation vessel 335 or the buffer cup 376 to 380 kept at the atmospheric pressure.

The opening and closing of the valve 414V and the three-way valves 416V, 417V are controlled by the minor constituent management controller 169. The valve 414V and the three-way valves 416V, 417V may be air valves.

Figure 32:
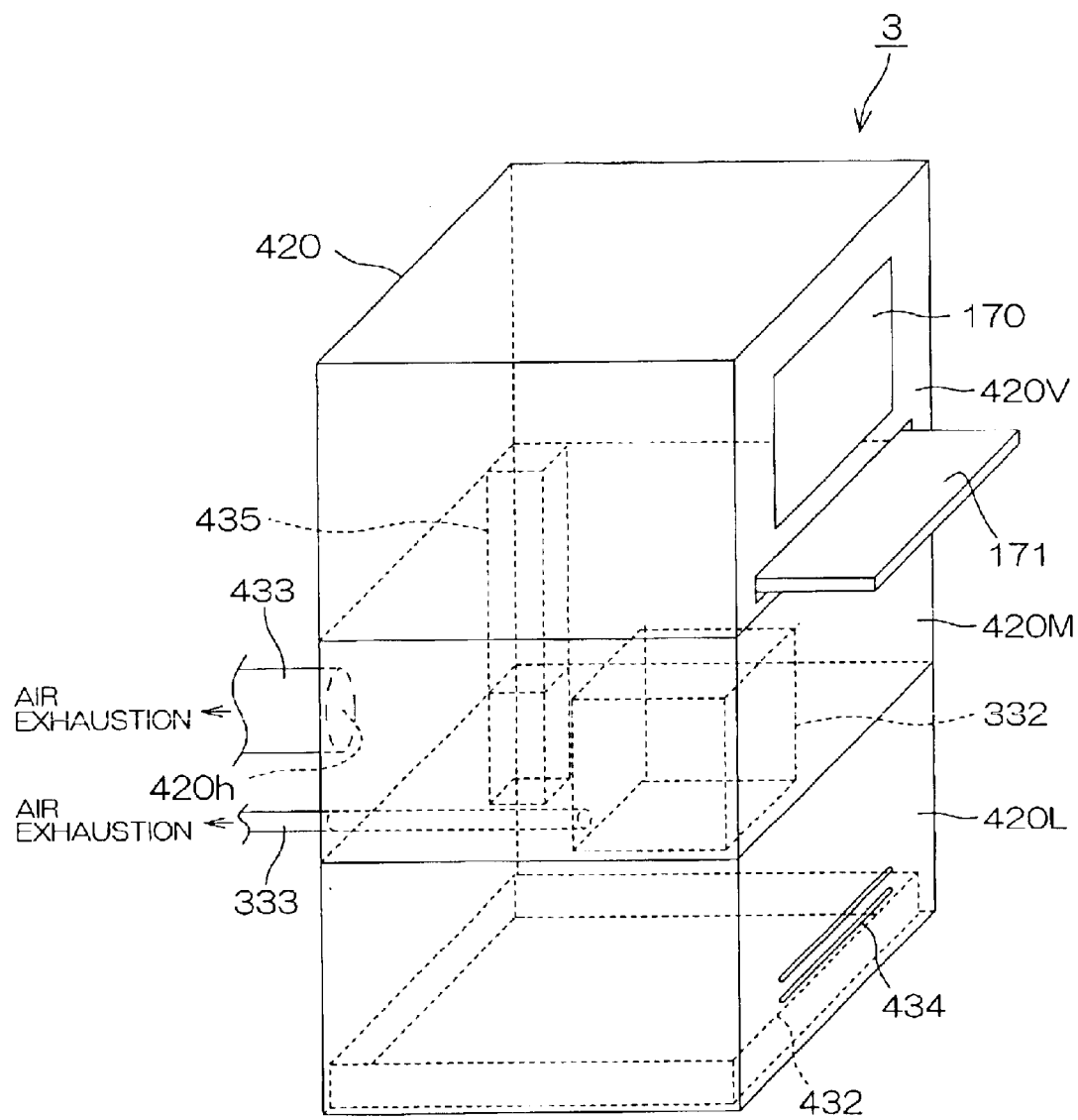
FIG. 32 is a schematic perspective view illustrating the construction of the minor constituent managing section.

FIG. 32 is a schematic perspective view illustrating the construction of the minor constituent managing section 3.

The minor constituent managing section 3 is housed in a minor constituent managing section enclosure 420. The minor constituent managing section enclosure 420 is a rectangular box virtually sealed. The minor constituent managing section enclosure 420 is vertically divided into three portions, i.e., an upper stage 420U, a middle stage 420M and a lower stage 420L, by partition walls. Air communication can be established between the upper stage 420U and the middle stage 420M and between the middle stage 420M and the lower stage 420L.

The upper stage 420U serves as an electrical component housing space in which the minor constituent management controller 169 is housed. The display 170 connected to the minor constituent management controller 169 is attached to a side wall of the minor constituent managing section enclosure 420 on a lateral side of the upper stage 420U, so that the operator can externally check the operation of the minor constituent managing section 3. The display 170 is a liquid crystal display which is capable of color display.

The keyboard 171 is provided below the display 170 in a drawable manner. The operator can input information from the keyboard 171 while viewing the display 170.

The analyzing cup chamber 332 (see FIG. 28) is disposed on the middle stage 420M. The middle stage 420M of the minor constituent managing section enclosure 420 has an air outlet port 420$h$, and an air outlet pipe 433 is connected to the air outlet port 420$h$. Air can be exhausted from the minor constituent managing section enclosure 420 through the air outlet pipe 433. An air outlet pipe 333 for exhausting air from the analyzing cup chamber 332 extends through the middle stage 420M of the minor constituent managing section enclosure 420. The air outlet pipes 333, 433 are connected to the air exhauster system not shown.

A shallow vat 432 is provided on the bottom of the lower stage 420L. The vat 432 has such a size as to cover the entire bottom of the minor constituent managing section enclosure 420. The accelerator container 371, the retarder container 372, the base liquid container 373, the silver nitrate aqueous solution container 374 and the sodium thiosulfate aqueous solution container 375 of the reagent supplying section 313 (see FIG. 30) are disposed in the vat 432. The vat 432 has a volume greater than the total volume of these containers. Even if all the liquids contained in these containers are leaked out, the leaked liquids can be received in the vat 432.

Horizontal slit-like openings 434 are formed in the side wall of the minor constituent managing section enclosure 420 on a lateral side of the lower stage 420L at a higher level than an upper edge of the vat 432. The internal pressure of the minor constituent managing section enclosure 420 is reduced to a negative level by exhausting air through the air outlet pipes 333, 433. Thus, air is introduced into the minor constituent managing section enclosure 420 from the openings 434, so that the minor constituent managing section enclosure 420 is ventilated.

An interconnection duct 435 is provided in a vertical corner portion of the minor constituent managing section enclosure 420 as extending from the upper stage 420U to the lower stage 420L through the middle stage 420M. The signal lines and the conduction lines connected to the minor constituent management controller 169 are routed through the interconnection duct 435 thereby to be protected from the reagents.

Figure 33:
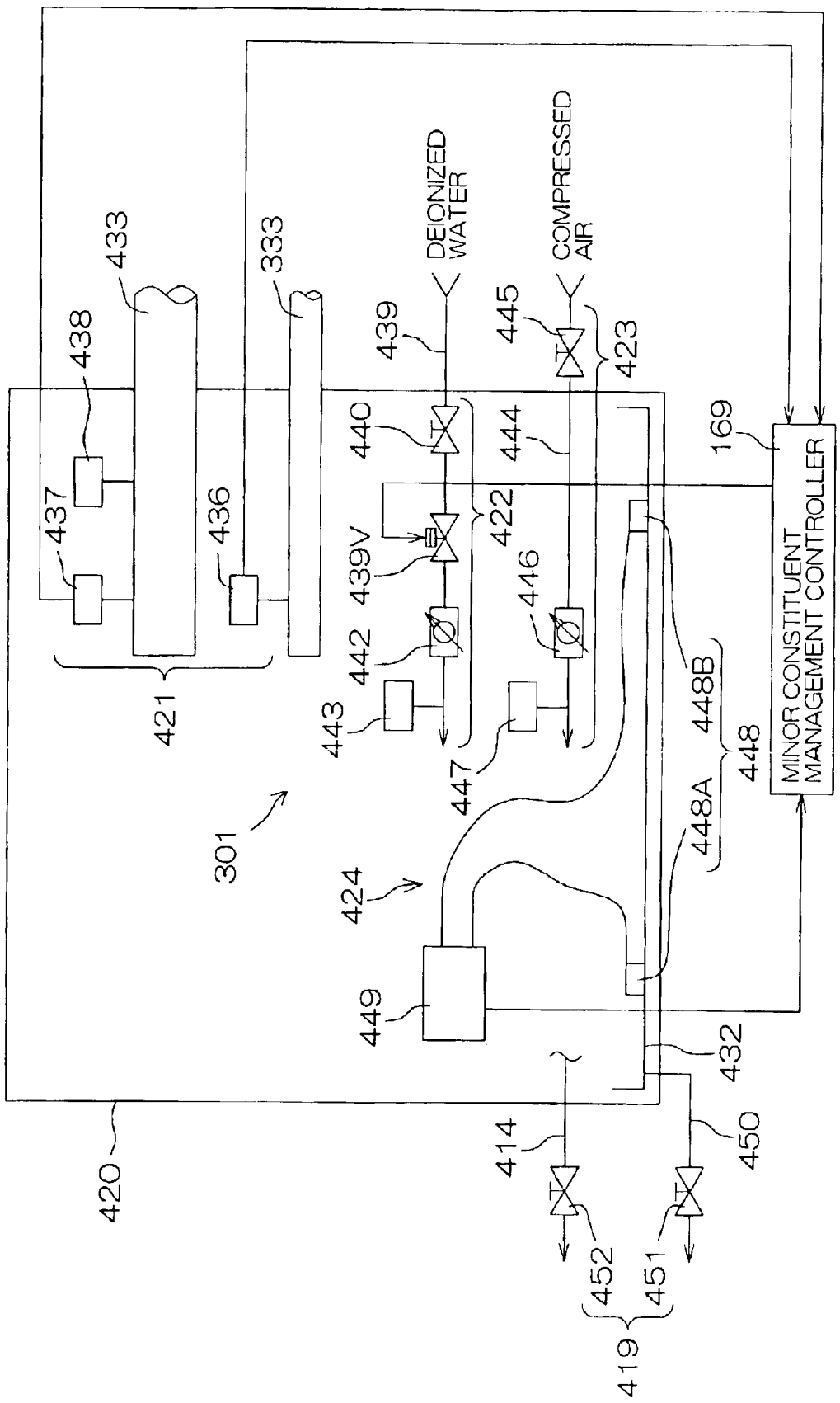
FIG. 33 is a schematic diagram illustrating the construction of a utility section.

FIG. 33 is a schematic diagram illustrating the construction of the utility section 301.

The utility section 301 includes an air exhaustion managing section 421 for managing exhaustion of air from the minor constituent managing section enclosure 420, a deionized water introduction section 422 for managing introduction of deionized water into the minor constituent managing section 3, a compressed air introduction section 423 for managing introduction of compressed air into the minor constituent managing section 3, a leakage detecting section 424 for detecting leakage of the liquid used in the minor constituent managing section 3, and a liquid draining section 419 for draining the waste liquids collected in the minor constituent managing section 3.

The air exhaustion managing section 421 includes an air exhaustion pressure sensor 436 attached to the air outlet pipe 333, an air exhaustion pressure sensor 437 and an air exhaustion pressure indicator 438 attached to the air outlet pipe 433. The air exhaustion pressure sensors 436 and 437 are capable of measuring the air exhaustion pressures of the air outlet pipes 333 and 433, respectively. Output signals of the air exhaustion pressure sensors 436, 437 are inputted to the minor constituent management controller 169. The air exhaustion pressure indicator 438 is capable of indicating the air exhaustion pressure of the air outlet pipe 433. The air exhaustion pressure sensors 436, 437 and the air exhaustion pressure indicator 438 are disposed within the minor constituent managing section enclosure 420.

A deionized water pipe 439 for introducing deionized water for use in the minor constituent managing section 3 extends into the utility section 301 through the minor constituent managing section enclosure 420. The deionized water introduction section 422 includes a manual valve 440, an air valve 439V, a regulator 442 and a pressure meter 443 which are provided in the deionized water pipe 439 in this order from the upstream side to the downstream side. The manual valve 440, the air valve 439V, the regulator 442 and the pressure meter 443 are disposed in the minor constituent managing section enclosure 420. The air valve 439V is controlled by the minor constituent management controller 169.

The operator can open and close the flow channel of the deionized water pipe 439 by means of the manual valve 440. The opening and closing of the air valve 439V is controlled by the minor constituent management controller 169. The operator can adjust the secondary pressure of the deionized water pipe 439 (a pressure on the downstream side of the regulator 442) by means of the regulator 442, and confirm the secondary pressure by means of the pressure meter 443. The deionized water pipe 439 is branched into the deionized water pipes 327, 356, 365 downstream of the pressure meter 443 (see FIG. 26).

A compressed air pipe 444 for introducing compressed air for use in the minor constituent managing section 3 extends into the utility section 301 through the minor constituent managing section enclosure 420. The compressed air is used for driving the air valves. The compressed air introduction section 423 includes a manual valve 445, a regulator 446 and a pressure meter 447, which are provided in the compressed air pipe 444 in this order from the upstream side to the downstream side. The manual valve 445 is disposed outside the minor constituent managing section enclosure 420, while the regulator 446 and the pressure meter 447 are disposed in the minor constituent managing section enclosure 420.

The operator can open and close the flow channel of the compressed air pipe 444 by means of the manual valve 445. The operator can adjust the secondary pressure of the compressed air pipe 444 (a pressure on the downstream side of the regulator 446) by means of the regulator 446, and confirm the secondary pressure by means of the pressure meter 447.

The leakage detecting section 424 includes a leakage detection sensor 448 provided in the vat 432, and a leakage detection amplifier 449 connected to the leakage detection sensor 448. The leakage detection sensor 448 includes a pair of electrodes 448A, 448B disposed in spaced relation on the bottom of the vat 432. The electrode 448A and the electrode 448B are usually electrically isolated from each other, but when liquid is leaked out of any of the containers disposed in the vat 432, electrical conduction is established between the electrode 448A and the electrode 448B.

The leakage detection amplifier 449 outputs an ON/OFF signal indicative of electrical conduction or non-conduction between the electrode 448A and the electrode 448B to the minor constituent management controller 169. Thus, the minor constituent management controller 169 can detect the leakage of the liquid in the vat 432. Where deionized water supplied through the deionized water pipe 327,356 or 365 or the plating liquid sampled through the sampling pipe 322 or 323 is leaked out of the corresponding flow channel, the leaked deionized water or plating liquid is also received in the vat 432. Even in this case, the leakage is detected by the leakage detection sensor 448.

A leaked liquid drain pipe 450 is connected to the bottom of the vat 432. The leaked liquid drain pipe 450 extends out of the utility section 301 through the bottom of the minor constituent managing section enclosure 420.

The liquid draining section 419 includes a manual valve 451 provided in the leaked liquid drain pipe 450, and a manual valve 452 provided in the drain pipe 414. The manual valves 451, 452 are disposed outside the minor constituent managing section enclosure 420. The operator can drain the liquid leaked in the vat 432 by opening the manual valve 451. Further, the operator can drain the liquid collected in the pressure increasing/reducing tank 412 by simultaneously opening the valve 414V and the manual valve 452 (see FIG. 31).

Figure 34:
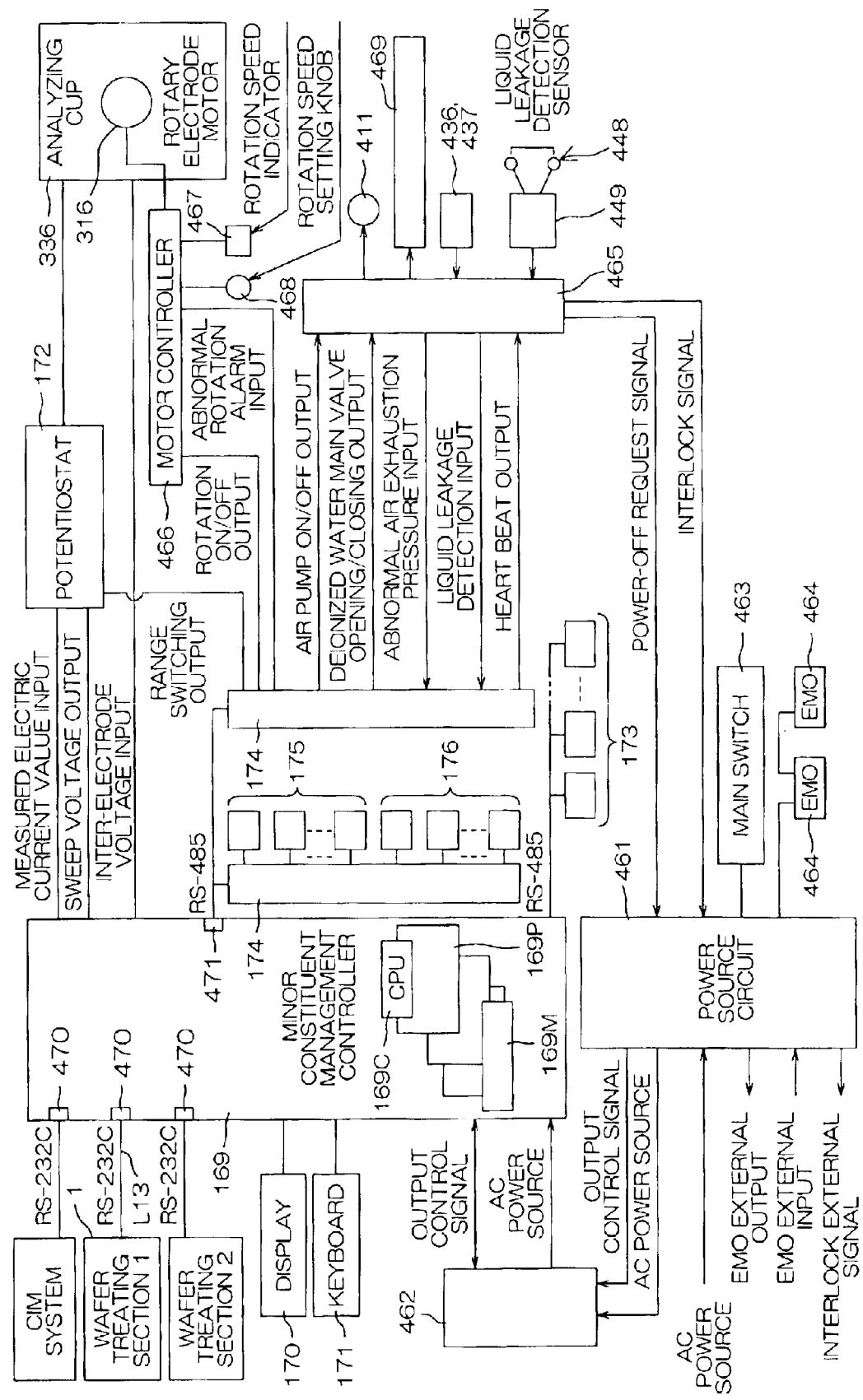
FIG. 34 is a block diagram illustrating the construction of the control system for the minor constituent managing section.

FIG. 34 is a block diagram illustrating the construction of the control system for the minor constituent managing section 3.

The minor constituent management controller 169 controls the entire minor constituent managing section 3. Hardware of the minor constituent management controller 169 includes a central processing unit (CPU) 169C, a storage device 169M including a semiconductor memory and a magnetic memory, RS-232C compatible serial ports 470, RS-485 compatible serial ports 471, and a plurality of printed circuit boards 169P. The magnetic memory may be, for example, a hard disk (HD) incorporated in a hard disk drive (HDD), or a flexible disk (FD) to be inserted into a flexible disk drive (FDD).

Software employed in the minor constituent management controller 169 includes an operating system, and application programs which are at least partly described in a high-level language. These programs are stored in the storage device 169M. The application programs include recipes for analyzing the minor constituents of the plating liquid and the like.

Parameters for the CVS (CPVS) analysis, the titrimetric analysis and the cleaning of the analyzing cup 336 can be inputted from the keyboard 171 connected to the minor constituent management controller 169.

The minor constituent management controller 169 is connected to the wafer treating section 1 (system controller 155) and a computer integrated manufacturing (CIM) system for centrally controlling the entire plant by a host computer via the RS-232C compatible serial ports 470 by cables. Where the minor constituent managing section 3 is further connected to the plating section 12S provided in the second wafer treating section (see FIG. 25), the minor constituent management controller 169 is connected a system controller of the second wafer treating section (of the second plating apparatus) via the RS-232C compatible serial port 470 by a cable.

Electric power is supplied to the minor constituent management controller 169 via a power source circuit 461 and an uninterruptible power source 462. A main switch 463, an emergency open (EMO) switch 464 and an interlock circuit 465 are connected to the power source circuit 461. The minor constituent managing section 3 is usually powered on and off by the main switch 463, but in an emergency, powered off by the emergency open switch 464. Further, the minor constituent managing section 3 is powered off when a power-off request signal outputted from the interlock circuit 465 is inputted to the power source circuit 461 in a certain event.

Even after power supply through the power source circuit 461 is stopped, the uninterruptible power source 462 can supply electric power to the minor constituent management controller 169 for a predetermined period. Thus, even if the power supply is stopped by the emergency open switch 464, the minor constituent management controller 169 can store data in the magnetic memory in the storage device 169M.

The output signals of the air exhaustion pressure sensors 436, 437 and the leakage detection sensor 448 are inputted to the minor constituent management controller 169 via the interlock circuit 465 and the serial/parallel converter 174. An opening/closing signal of the air valve 439 (see FIG. 33) serving as a deionized water main valve is inputted to the interlock circuit 465 from the minor constituent management controller 169 through the serial/parallel converter 174, and an electromagnetic valve 469 for opening and closing the air valve 439V is controlled by the interlock circuit 465.

The interlock circuit 465 is capable of sampling signals in parallel from specific sensors. If a signal indicative of a risky state of the apparatus is inputted from any of these sensors, the interlock circuit 465 controls a relay circuit to remove the cause of the risky state. This control operation is directly performed by the interlock circuit 465 not via the minor constituent management controller 169.

When a signal (an ON signal) indicative of the detection of liquid leakage is inputted from the liquid leakage detection amplifier 449, for example, there is a possibility that leakage of deionized water may occur. Therefore, the deionized water main valve (air valve 439V) is closed under the control of the interlock circuit 465. Further, when a signal indicative of an abnormal air exhaustion pressure is inputted to the interlock circuit 465 from the air exhaustion pressure sensor 436 or the air exhaustion pressure sensor 437, the interlock circuit 465 outputs a power-off request signal to the power source circuit 461 to stop the power supply.

The motor 316 for rotating the rotary electrode 308 is controlled by the minor constituent management controller 169 via the serial/parallel converter 174 and a motor controller 466. A rotation speed indicator 467 and a rotation speed setting knob 468 are connected to the motor controller 466. The motor 316 is turned on and off on the basis of a signal from the minor constituent management controller 169. If an abnormality occurs in the motor controller 466, an alarm is outputted from the motor controller 466 to the minor constituent management controller 169.

The minor constituent management controller 169 is connected in series to a controller for the syringe pumps 173 (the large volume syringe pump 340A, the small volume syringe pump 340B, the syringe pumps 346, 363, 364 and 386 to 390) via the RS-485 compatible port 471. That is, the plurality of syringe pumps are controlled via a single serial bus.

The analysis of the plating liquid and the addition of the replenishment liquids to the plating liquid based on the results of the analysis are automatically carried out under the control of the minor constituent management controller 169. An explanation will hereinafter be given to how to analyze the plating liquid being used in the plating section 12 by the analyzing section 320. In this embodiment, the retarder, the accelerator and chlorine are analyzed in this order. However, the minor constituent managing section 3 may perform one or more of the analysis of the retarder, the analysis of the accelerator and the analysis of chlorine in any order. The accelerator and the retarder are analyzed through the CPVS analysis.

First, the valve 322V is opened with the other valves in the analyzing section 320 kept closed under the control of the minor constituent management controller 169 (see FIG. 27). Then, the minor constituent management controller 169 controls the pressure increasing/reducing section 302 to reduce the internal pressure of the sampling vessel 305 (to lower than the atmospheric pressure). Since the internal pressure of the plating liquid container 55 is set at the atmospheric pressure, the plating liquid is supplied (sampled) from the plating liquid container 55 into the sampling vessel 305 by the pressure difference.

When the surface level of the plating liquid in the sampling vessel 305 rises to reach the level of the liquid surface sensor 307B or 307A by the supply of the plating liquid, the valve 322V is closed under the control of the minor constituent management controller 169 to stop the supply of the plating liquid into the sampling vessel 305. The open ends of the sampling pipes 322, 323, the deionized water pipe 327, the reference plating liquid transport pipe 304 and the air inlet/outlet pipe 329 are each located at a higher position than the liquid surface sensor 307A and, hence, are not submerged in the plating liquid.

In turn, the minor constituent management controller 169 controls the pressure increasing/reducing section 302 to increase the internal pressure of the sampling vessel 305 (to higher than the atmospheric pressure). Thereafter, the valve 322V is opened under the control of the minor constituent management controller 169. Since the internal pressure of the sampling vessel 305 is higher than the internal pressure of the plating liquid container 55, the plating liquid remaining in the sampling pipe 322 is forced back into the plating liquid container 55.

At this time, the open end of the sampling pipe 322 is not submerged in the plating liquid in the sampling vessel 305. Therefore, the plating liquid sampled into the sampling vessel 305 does not flow back through the sampling pipe 322. This operation is continued for a proper period, whereby the plating liquid finally becomes absent from the sampling pipe 322.

Therefore, the plating liquid previously sampled for the analysis is not present in the sampling pipe 322, 323, when the plating liquid is next sampled for the analysis. Therefore, the plating liquid supplied from the plating liquid container 55 or 55S can be analyzed as it is. Unlike the prior-art plating apparatus, there is no need for discarding a certain amount of the plating liquid initially sampled in the analyzing section 320 (plating apparatus 10), so that the amount of the waste plating liquid can be reduced.

Thereafter, the valve 322V is closed under the control of the minor constituent management controller 169, whereby the pressure increasing/reducing section 302 stops increasing the internal pressure of the sampling vessel 305. Further, the valves 328V, 329V are opened under the control of the minor constituent management controller 169 to set the internal pressure of the sampling vessel 305 at the atmospheric pressure.

Subsequently, the analysis of the retarder in the plating liquid contained in the sampling vessel 305 (hereinafter referred to as "analysis plating liquid") is started. First, the minor constituent management controller 169 controls the syringe pump 388 of the reagent supplying section 313 to supply 100 ml of the base liquid into the analyzing cup 336. Then, the minor constituent management controller 169 controls the motor controller 466 to rotate the rotary electrode 308 at 2500 rpm.

Further, the minor constituent management controller 169 controls the potentiostat 172 to control the electric current flowing between the counter electrode 309 and the rotary electrode 308 so that the voltage between the rotary electrode 308 (action electrode) and the reference electrode 310 is equalized with a sweep voltage specified by the minor constituent management controller 169. The sweep voltage is set as cyclically fluctuating stepwise within a predetermined potential range.

Thus, the deposition and removal (stripping) of copper with respect to the rotary electrode 308 cyclically occur. The integral of the electric current flowing through the rotary electrode 308 when copper deposited on the rotary electrode 308 by the plating is stripped (stripping electric charge) has a certain correlation with the concentration of the accelerator or the retarder in the plating liquid. Therefore, the concentration of the accelerator or the retarder can be determined by monitoring the electric current flowing through the rotary electrode 308.

The sweeping (the cyclic fluctuation of the sweep voltage) is repeated five times. Thus, the stripping electric charge is stabilized. A stripping electric charge AR observed at the fifth sweeping is stored in the storage device 169M. The stripping electric charge AR represents a stripping electric charge for the base liquid, i.e., a plating liquid containing neither the accelerator nor the retarder.

In turn, the minor constituent management controller 169 controls the small volume syringe pump 340B to supply 150 $\mu$l of the analysis plating liquid additionally to the base liquid in the analyzing cup 336. As the analysis plating liquid containing the retarder is added to the base liquid, the stripping electric charge is reduced.

Then, the sweep voltage is applied again to the potentiostat 172, and a stripping electric charge $AR_1$ observed at the second sweeping is stored in the storage device 169M. The additional supply of the analysis plating liquid and the measurement and storage of stripping electric charges ARn (An=1, 2, 3, ...) are repeated in the aforesaid manner under the control of the minor constituent management controller 169, until an ARn/AR ratio satisfies ARn/AR<0.3. If the increase in the concentration of the retarder is slow, i.e., if the ARn/AR ratio reduces at a lower rate, the amount of the analysis plating liquid to be additionally supplied at each time may be increased greater than 150 $\mu$l.

Subsequently, a program stored in the storage device 169M is executed to determine the amount $V_{end}$ of the analysis plating liquid to be added to provide an ARn/AR ratio of ARn/AR=0.5 by linear approximation on the basis of data obtained when the ARn/AR ratio is about 0.5. The retarder concentration $C_{leveler}$ of the analysis plating liquid is calculated from an expression $C_{leveler}=CF(V_A+V_{end})/V_{end}$ by the minor constituent management controller 169, and stored in the storage device 169M in relation to the date and time of the analysis.

In the aforesaid expression, VA is the volume of the base liquid, and CF is a calibration factor for matching a retarder concentration $C_{leveler}$ obtained on the basis of the retarder concentration calculation expression by actually analyzing the reference plating liquid contained in the reference plating liquid container 303 (see FIG. 27) with the known retarder concentration of the reference plating liquid.

The level of the stripping electric charge varies depending on the accelerator concentration as well as the retarder concentration. In the aforesaid method, the influence of the accelerator is nullified by diluting the analysis plating liquid with the base liquid, whereby the retarder concentration can accurately be determined.

After the completion of the analysis, the rotation of the rotary electrode 308 is stopped and the valve 344V is opened under the control of the minor constituent management controller 169. Then, the plating liquid is drained from the analyzing cup 336 by the suction of the pressure increasing/reducing section 302. The drained plating liquid is transported into the pressure increasing/reducing tank 412 through the drain pipe 344.

Subsequently, the analyzing cup 336 is cleaned. First, the valve 356V is opened under the control of the minor constituent management controller 169 to supply deionized water to a predetermined level (e.g., to the level of the liquid surface sensor 331A) in the analyzing cup 336. The minor constituent management controller 169 controls the motor controller 466 to rotate the rotary electrode 308 (rod 308a) for a predetermined period to stir the deionized water in the analyzing cup 336.

Thereafter, the valve 344V is opened under the control of the minor constituent management controller 169 to drain the deionized water from the analyzing cup 336 by the suction of the pressure increasing/reducing section 302. The drained deionized water is transported into the pressure increasing/reducing tank 412 through the drain pipe 344. The supply of deionized water to the analyzing cup 336 and the stirring and draining of the deionized water are repeated twice. Thus, the cleaning of the analyzing cup 336 is completed.

Subsequently, the analysis of the accelerator is started. First, the minor constituent management controller 169 controls the syringe pump 388 of the reagent supplying section 313 to supply 100 ml of the base liquid into the analyzing cup 336. Then, the minor constituent management controller 169 controls the motor controller 466 to rotate the rotary electrode 308 at 2500 rpm.

Further, the minor constituent management controller 169 controls the potentiostat 172 to control the electric current flowing between the counter electrode 309 and the rotary electrode 308 so that the voltage between the rotary electrode 308 (action electrode) and the reference electrode 310 is equalized with a sweep voltage specified by the minor constituent management controller 169. The sweep voltage is set as cyclically fluctuating stepwise within a predetermined potential range. The sweeping is repeated until a stripping electric charge is stabilized. Thus, the surface state of the rotary electrode 308 is stabilized. After the rotation of the rotary electrode 308 is stopped, the minor constituent management controller 169 controls the pressure increasing/reducing section 302 and the valve 344V to drain the base liquid from the analyzing cup 336.

Then, the minor constituent management controller 169 controls the syringes 388, 387 of the reagent supplying section 313 to supply 95 ml of the base liquid and 5 ml of the retarder into the analyzing cup 336. Then, the minor constituent management controller 169 controls the motor controller 466 to rotate the rotary electrode 308, for example, at 2500 rpm.

In turn, the sweeping at a predetermined potential is repeated five times under the control of the minor constituent management controller 169. This stabilizes the stripping electric charge. A stripping electric charge ARi observed at the fifth sweeping is stored in the storage device 169M. After the rotation of the rotary electrode 308 is stopped, the minor constituent management controller 169 controls the pressure increasing/reducing section 302 and the valve 344V to drain the base liquid containing the retarder from the analyzing cup 336.

Then, the minor constituent management controller 169 controls the large volume syringe pump 340A in the sampling section 319 and the syringe pump 387 in the reagent supplying section 313 to supply 95 ml of the analysis plating liquid and 5 ml of the retarder into the analyzing cup 336. The minor constituent management controller 169 controls the motor controller 466 to rotate the rotary electrode 308, for example, at 2500 rpm.

In turn, the sweeping at a predetermined potential is repeated five times under the control of the minor constituent management controller 169. Thus, the stripping electric charge is stabilized. A stripping electric charge ARs observed at the fifth sweeping is stored in the storage device 169M.

Then, the minor constituent management controller 169 controls the syringe pump 386 to supply 100 µl of the accelerator additionally to the analysis plating liquid in the analyzing cup 336. The sweeping at a predetermined potential is repeated five times under the control of the minor constituent management controller 169. Thus, the stripping electric charge is stabilized. A stripping electric charge $AR_1$ observed at the fifth sweeping is stored in the storage device 169M.

Further, the minor constituent management controller 169 controls the syringe pump 386 to supply 100 µl of the accelerator additionally to the analysis plating liquid in the analyzing cup 336. The sweeping at a predetermined potential is repeated five times under the control of the minor constituent management controller 169. Thus, the stripping electric charge is stabilized. A stripping electric charge $AR_2$ observed at the fifth sweeping is stored in the storage device 169M.

Subsequently, a program stored in the storage device 169M is executed so that an accelerator concentration $C_x$ of the analysis plating liquid is calculated from an expression $C_x=(ARs-ARi)/(AR_2-ARs)$ by the minor constituent management controller 169 and stored in the storage device 169M in relation to the date and time of the analysis. The level of the stripping electric charge varies depending on the retarder concentration as well as the accelerator concentration. In the aforesaid method, the retarder concentration is sufficiently increased to saturate the influence of the retarder by adding the retarder to the base liquid and the analysis plating liquid, whereby the accelerator concentration can accurately be determined.

Where the measurement is normally performed, the stripping electric charges ARs, $AR_1$, $AR_2$ and the accelerator concentrations in measurement are plotted in a linear relationship. Therefore, whether or not the measurement is normally performed can be judged by checking the relationship.

After the completion of the analysis, the rotation of the rotary electrode 308 is stopped and the valve 344V is opened under the control of the minor constituent management controller 169, and the plating liquid is drained from the analyzing cup 336 by the suction of the pressure increasing/reducing section 302.

Subsequently, the analyzing cup 336 is cleaned. First, the valve 356V is opened under the control of the minor constituent management controller 169 to supply deionized water to a predetermined level (e.g., to the level of the liquid surface sensor 331A) in the analyzing cup 336. Then, the minor constituent management controller 169 controls the motor controller 466 to rotate the rotary electrode 308 (rod 308a) for a predetermined period to stir the deionized water in the analyzing cup 336.

Thereafter, the valve 344V is opened under the control of the minor constituent management controller 169 to drain the deionized water from the analyzing cup 336 by the suction of the pressure increasing/reducing section 302. The supply of deionized water to the analyzing cup 336 and the stirring and draining of the deionized water are repeated twice. Thus, the cleaning of the analyzing cup 336 is completed.

Subsequently, the titrimetric analysis of chlorine is performed. First, the minor constituent management controller 169 controls the large volume syringe pump 340A in the sampling section 319 to supply 100 ml of the analysis plating liquid into the analyzing cup 336. Then, the minor constituent management controller 169 controls the motor controller 466 to rotate the rotary electrode 308 (rod 308a) to stir the analysis plating liquid contained in the analyzing cup 336.

In this state, the minor constituent management controller 169 controls the syringe pump 389 in the reagent supplying section 313 to add 0.2 ml of the 0.01 N silver nitrate aqueous solution dropwise to the analyzing cup 336. A potential difference between the reference electrode 310 and the silver/silver chloride electrode 311 after the dropwise addition is stored in the storage device 169M. The dropwise addition of the silver nitrate aqueous solution and the storage of the potential difference are repeated a predetermined number of times.

Figure 35:
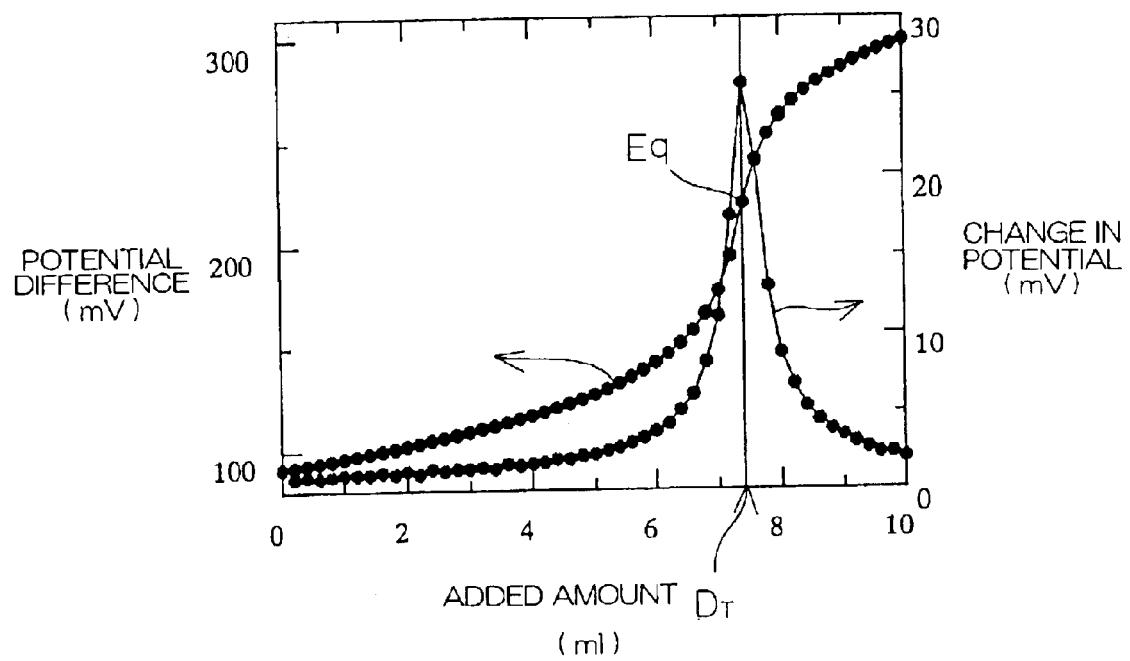
FIG. 35 is a diagram illustrating a relationship of the amount of an added silver nitrate aqueous solution versus a potential difference between a reference electrode and a silver/silver chloride electrode.

FIG. 35 is a diagram illustrating a relationship of the amount of the added silver nitrate aqueous solution versus the potential difference between the reference electrode 310 and the silver/silver chloride electrode 311. This diagram can be displayed on the display 170 (see FIG. 32) provided on the minor constituent managing section enclosure 420 during the titrimetric analysis. Thus, the operator can check the progress of the titrimetric analysis.

A program stored in the storage device 169M is executed so that the minor constituent management controller 169 determines a point (equivalent point) Eq at which a change in the potential difference between the reference electrode 310 and the silver/silver chloride electrode 311 during each addition of the silver nitrate aqueous solution is maximized, and calculates the total amount $D_T$ of the silver nitrate aqueous solution added until the equivalent point Eq is reached. Then, the chlorine concentration of the analysis plating liquid is calculated as a chloride ion concentration (mg/l) from an expression $D_T \times 7.09$ wherein $D_T$ is the total amount (ml) of the added silver nitrate aqueous solution. The chlorine concentration is stored in the storage device 169M in relation to the date and time of the analysis.

In turn, the rotation of the rotary electrode 308 (rod 308a) is stopped and the valve 344V is opened under the control of the minor constituent management controller 169, and the plating liquid is drained from the analyzing cup 336 by the suction of the pressure increasing/reducing section 302. In this state, precipitate of silver chloride occurring during the titrimetric analysis of chlorine is present in the analyzing cup 336. Then, the inside of the analyzing cup 336 is cleaned.

First, the minor constituent management controller 169 controls the vertical mechanism 326 (see FIG. 28) so that the silver/silver chloride electrode 311 is moved up to be retracted out of the analyzing cup 336. Then, the minor constituent management controller 169 controls the syringe pump 390 in the reagent supplying section 313 to supply 100 ml of the sodium thiosulfate aqueous solution into the analyzing cup 336.

In turn, the minor constituent management controller 169 controls the motor controller 466 to rotate the rotary electrode 308 (rod 308a) for a predetermined period to stir the sodium thiosulfate aqueous solution in the analyzing cup 336. Thus, the silver chloride precipitate is dissolved in the sodium thiosulfate aqueous solution in the analyzing cup 336. Since the silver/silver chloride electrode 311 is retracted above the analyzing cup 336, the silver/silver chloride electrode 311 is not dissolved in the sodium thiosulfate aqueous solution.

Thereafter, the valve 344V is opened under the control of the minor constituent management controller 169 to drain the sodium thiosulfate aqueous solution from the analyzing cup 336 by the suction of the pressure increasing/reducing section 302. The drained sodium thiosulfate aqueous solution is transported into the pressure increasing/reducing tank 412 through the drain pipe 344.

In turn, the minor constituent management controller 169 controls the vertical mechanism 326 to move down the silver/silver chloride electrode 311 into the analyzing cup 336. Subsequently, the valve 356V is opened under the control of the minor constituent management controller 169 to supply deionized water to a predetermined level (e.g., to the level of the liquid surface sensor 331A) in the analyzing cup 336. Then, the minor constituent management controller 169 controls the motor controller 466 to rotate the rotary electrode 308 (rod 308a) for a predetermined period to stir the deionized water in the analyzing cup 336. Thereafter, the valve 344V is opened under the control of the minor constituent management controller 169 to drain the deionized water from the analyzing cup 336 by the suction of the pressure increasing/reducing section 302.

The supply of the deionized water to the analyzing cup 336 and the stirring and draining of the deionized water are repeated twice. Thus, the cleaning of the analyzing cup 336 is completed.

Subsequently, the inside of the sampling vessel 305 (see FIG. 27) is cleaned. First, the valve 334V is opened under the control of the minor constituent management controller 169 to drain the plating liquid from the sampling vessel 305 by the suction of the pressure increasing/reducing section 302. Then, the valve 327V is opened under the control of the minor constituent management controller 169 to supply deionized water to a predetermined level (e.g., to the level of the liquid surface sensor 307A) in the sampling vessel 305.

Thereafter, the valve 334V is opened under the control of the minor constituent management controller 169 to drain the deionized water from the sampling vessel 305 by the suction of the pressure increasing/reducing section 302. Thus, the cleaning of the sampling vessel 305 is completed.

Where the plating liquid being used in the second plating section 12S is analyzed, the valve 323V is opened and closed with the valve 322V being closed to sample the plating liquid from the plating liquid container 55S through the sampling pipe 323. Then, the sampled plating liquid is analyzed in the same manner as described above. Thus, the plating liquid can be sampled from either of the plating sections 12 and 12S by opening and closing the valves 322V, 323V for selection of the corresponding one of the sampling pipes 322, 323.

After the completion of the analysis of the plating liquid in the plating section 12 or the plating section 12S, the plating liquid is present neither in the sampling vessel 305 nor in the analyzing cup 336. Therefore, there is no possibility that the plating liquids in the plating sections 12, 12S are mixed. Accordingly, the quantitative analysis of the plating liquid can accurately be achieved.

In response to a command inputted from the keyboard 171 by the operator, the minor constituent management controller 169 is capable of displaying any of the accelerator concentration, the retarder concentration and the chlorine concentration stored in the storage section 169M in the form of a list or a graph in the chronological order on the display 170. This permits the operator to estimate the consumption rates of the minor constituents. When the concentration of any of these minor constituents is reduced below a predetermined concentration level, the operator can prepare a replenishment liquid for replenishing the plating liquid with the minor constituent.

Next, an explanation will be given to how to adjust the concentrations of the accelerator, the retarder and chlorine in the plating liquid in the plating section 12.

First, a program stored in the storage device 169M is executed to acquire information on the amount of the plating liquid in the plating section 12 from the system controller 155 via the signal line (serial line) L13. The system controller 155 calculates the amount of the plating liquid in the plating section 12 on the basis of information on the volumes of the plating cups 56a to 56d and the surface level of the plating liquid in the plating liquid container 55 based on the output signal of the ultrasonic level meter 72 (see FIG. 7).

The minor constituent management controller 169 calculates the amounts of the accelerator replenishment liquid, the retarder replenishment liquid and the chlorine replenishment liquid to be added to the plating liquid on the basis of the data of the accelerator, retarder and chlorine concentrations of the plating liquid and the data of the amount of the plating liquid in the plating section 12 stored in the storage device 169M so as to allow the plating liquid in the plating section 2 to have the predetermined accelerator, retarder and chlorine concentration levels.

In turn, the valve 324V is opened and the other valves in the replenishment section 321 are closed under the control of the minor constituent management controller 169. Then, the minor constituent management controller 169 controls the pressure increasing/reducing section 302 to exhaust air from the preparation vessel 335 for reduction of the internal pressure of the preparation vessel 335. Since the plating liquid container 55 is set at the atmospheric pressure, the plating liquid is supplied into the preparation vessel 335 through the replenishment pipe 324 by the pressure difference.

The surface level of the plating liquid in the preparation vessel 335 rises as the plating liquid is supplied into the preparation vessel 335 and, when a predetermined level (e.g., the level of the liquid surface sensor 338A) is reached, the valve 324V is closed under the control of the minor constituent management controller 169. Thus, the supply of the plating liquid into the preparation vessel 335 is stopped. The open ends of the air inlet/outlet pipe 339, the chlorine replenishment liquid transport pipe 345B, the accelerator replenishment liquid transport pipe 361, the retarder replenishment liquid transport pipe 362 and the deionized water pipe 365 are each located at a higher level than the liquid surface sensor 338A in the preparation vessel 335 and, hence, are not submerged in the plating liquid in the preparation vessel 335. Thereafter, the valves 339V1, 341V are opened under the control of the minor constituent management controller 169 to set the internal pressure of the preparation vessel 335 at the atmospheric pressure.

In turn, the minor constituent management controller 169 controls the syringe pumps 363, 364, 346 to supply the accelerator replenishment liquid, the retarder replenishment liquid and the chlorine replenishment liquid into the preparation vessel 335 in replenishment amounts determined by the minor constituent management controller 169. If any of the accelerator concentration, the retarder concentration and the chlorine concentration is kept at the predetermined concentration level (within the predetermined concentration range), there is no need to supply the corresponding minor constituent replenishment liquid into the preparation vessel 335.

Subsequently, the minor constituent management controller 169 controls the pressure increasing/reducing section 302 to increase the internal pressure of the preparation vessel 335, and the valve 324V is opened. Since the internal pressure of the preparation vessel 335 is higher than the internal pressure of the plating liquid container 55 at this time, the plating liquid in the preparation vessel 335 and the replenishment pipe 324 is transported into the plating liquid container 55. The plating liquid in the preparation vessel 335 can mostly be transported into the plating liquid container 55, because the replenishment pipe 324 extends to the vicinity of the bottom of the preparation vessel 335. The transportation operation is continued for a sufficient period to transport the plating liquid from the replenishment pipe 324 into the plating liquid container 55.

Where the plating liquid remains in the preparation vessel 335 at this time, the accelerator replenishment liquid, the retarder replenishment liquid and the chlorine replenishment liquid cannot be supplied exactly in the required amounts to the plating liquid in the plating liquid container 55. This is because the accelerator replenishment liquid, the retarder replenishment liquid and the chlorine replenishment liquid intended to be supplied to the plating liquid in the plating liquid container 55 are partly present in the plating liquid remaining in the preparation vessel 335. Therefore, the amounts of the accelerator replenishment liquid, the retarder replenishment liquid and the chlorine replenishment liquid supplied into the plating liquid container 55 are smaller than the required amounts. In this case, the plating liquid in the plating section 12 does not have the predetermined accelerator, retarder and chlorine concentrations.

Therefore, the plating liquid is once transported from the plating liquid container 55 into the preparation vessel 335, and then transported from the preparation vessel 335 into the plating liquid container 55. Thus, the accelerator replenishment liquid, the retarder replenishment liquid and the chlorine replenishment liquid contained in the plating liquid initially remaining in the preparation vessel 335 can mostly be transported into the plating liquid container 55. As required, the transportation of the plating liquid from the plating liquid container 55 to the preparation vessel 335 and from the preparation vessel 335 to the plating liquid container 55 may be repeated.

Thus, the accelerator replenishment liquid, the retarder replenishment liquid and the chlorine replenishment liquid can be supplied substantially in the required amounts to the plating liquid in the plating section 12. After the completion of the final transportation of the plating liquid into the plating liquid container 55, the plating liquid is discharged so as not to remain in the replenishment pipe 324.

After the completion of the transportation of the plating liquid from the preparation vessel 335 into the plating liquid container 55, the valve 324V is closed and the valves 339V1, 341V are opened under the control of the minor constituent management controller 169, whereby the internal pressure of the preparation vessel 335 is set at the atmospheric pressure. Thus, the addition of the accelerator replenishment liquid, the retarder replenishment liquid and the chlorine replenishment liquid to the plating liquid in the plating section 12 is completed.

Subsequently, the inside of the preparation vessel 335 is cleaned. First, the valve 342V is opened under the control of the minor constituent management controller 169 to drain the plating liquid from the preparation vessel 335 by the suction of the pressure increasing/reducing section 302. The drained plating liquid is transported into the pressure increasing/reducing tank 412 through the drain pipe 342. With the valves 365V, 342V being open, deionized water is supplied and drained from the preparation vessel 335 by the suction of the pressure increasing/reducing section 302 under the control of the minor constituent management controller 169.

Addition of the accelerator replenishment liquid, the retarder replenishment liquid and the chlorine replenishment liquid to the plating liquid being used in the second plating section 12S can be achieved in substantially the same manner as described above, except that the replenishment pipe 325 and the valve 325V are operated instead of the replenishment pipe 324 and the valve 324V. Thus, the accelerator replenishment liquid, the retarder replenishment liquid and the chlorine replenishment liquid can be added to either of the plating liquids in the plating sections 12, 12S by opening and closing the valves 324V, 325V for selection of the corresponding one of the replenishment pipes 324, 325.

Since the plating liquid is not present in the preparation vessel 335 after the completion of the addition of the accelerator replenishment liquid, the retarder replenishment liquid and the chlorine replenishment liquid to the plating section 12 or 12S, there is no possibility that the plating liquids in the plating sections 12, 12S are mixed.

In the aforesaid manner, the plating liquids can be kept in the predetermined composition. With the use of the plating liquids, the plating sections 12, 12S can each properly perform the plating process to plate the semiconductor substrate with copper with the fine holes (e.g., via-holes) and grooves (trenches) thereof filled with copper.

The accelerator replenishment liquid, the retarder replenishment liquid and the chlorine replenishment liquid are preliminarily mixed with the plating liquid in the preparation vessel 335 before being transported into the plating liquid container 55, 55S. Therefore, even if any of these replenishment liquids is less soluble (or dispersible) in the plating liquid, dissolution (or dispersion) of the replenishment liquid in the plating liquid in the plating section 12, 12S can be achieved in a short time.

The preparation vessel 335 is located in the vicinity of the accelerator container 371 (buffer cup 376), the retarder container 372 (buffer cup 377) and the chlorine replenishment liquid container 337 (buffer cup 343) in the common minor constituent managing section enclosure 420. Therefore, the accelerator replenishment liquid transport pipe 361, the retarder replenishment liquid transport pipe 362 and the chlorine replenishment liquid transport pipe 345B each have a reduced length.

Therefore, even if the accelerator replenishment liquid, the retarder replenishment liquid and the chlorine replenishment liquid are required to be added in small amounts to the plating liquid, the syringe pumps 363, 364, 346 can supply the required amounts of the accelerator replenishment liquid, the retarder replenishment liquid and the chlorine replenishment liquid with a higher level of accuracy. Since there is virtually no temperature difference between the preparation vessel 335 and the replenishment section 321 disposed adjacent each other, the accuracies of the replenishment amounts are not adversely affected by the thermal expansion or contraction of the accelerator replenishment liquid transport pipe 361, the retarder replenishment liquid transport pipe 362 and the chlorine replenishment liquid transport pipe 345B, and the accelerator replenishment liquid, the retarder replenishment liquid and the chlorine replenishment liquid transported through these pipes.

While the embodiment of the present invention has thus been described, the invention may be embodied in any other ways. For example, the concentrations of the accelerator and/or the retarder may be determined by the CVS analysis. In this case, the voltage applied between the rotary electrode 308 (action electrode) and the reference electrode 310 is continuously changed unlike in the case of the CPVS analysis.

Figure 36:
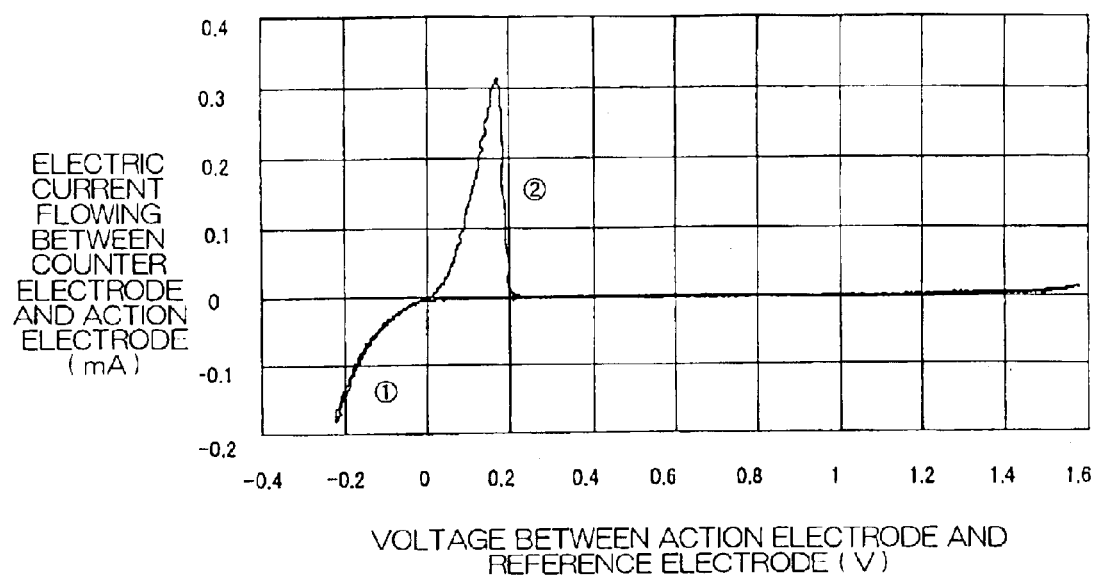
FIG. 36 is a diagram illustrating a relationship of a voltage between an action electrode and a reference electrode versus an electric current flowing between a counter electrode and the action electrode in a CVS analysis.

FIG. 36 is a diagram illustrating a relationship of the voltage between the rotary electrode 308 and the reference electrode 310 versus the electric current flowing between the counter electrode 309 and the action electrode 310 in the CVS analysis. The abscissa represents the potential of the rotary electrode 308 with respect to the reference electrode 310, and the ordinate represents the electric current flowing out of the rotary electrode 308 with a positive sign.

FIG. 36 illustrates sweep voltage characteristics obtained when the sweep voltage fluctuates in one cycle. The sweep voltage is increased from a starting level of about 0.5 V to about 1.6 V, then reduced to about −0.2 V, and increased to the starting level. The sweep rate is about 100 mV/sec.

In a negative voltage range (indicated by a reference character ① in FIG. 36), the electric current educes (in a negative range), as the voltage reduces. In this voltage range, copper is deposited on the rotary electrode 308 by the plating. In a voltage range of 0 to 0.2 V (indicated by a reference character ② in FIG. 36), the electric current has a peak projecting on a positive side. In this voltage range, a copper film formed by the plating is stripped from the rotary electrode 308. The concentrations of the accelerator and the retarder in the plating liquid can be determined on the basis of a stripping electric charge calculated as the integral of the electric current.

The apparatus may be constructed so that the single minor constituent managing section 3 is shared by three or more wafer treating sections. In this case, it is merely necessary to additionally provide sampling pipes and replenishment pipes for selectively transporting plating liquids between the respective wafer treating sections and the minor constituent managing section 3. The number of the wafer treating sections which share the minor constituent managing section 3 influences neither the accuracy of the analysis nor the accuracies of the replenishment amounts of the replenishment liquids.

Any number of the constituents can be analyzed and any number and types of the replenishment liquids can be supplied by modifying the construction of the analyzing section 320 and the replenishment section 321. That is, the analyzing section 320 and the replenishment section 321 may be adapted to quantitatively analyze minor constituents other than the accelerator, the retarder and chlorine, and additionally supply these minor constituents in required amounts to the wafer treating section.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2002-368581 filed with the Japanese Patent Office on Dec. 19, 2002, the disclosure of which is incorporated herein by reference.

What is claimed is:

1. A plating apparatus for plating a substrate, the apparatus comprising:

a cassette stage for receiving thereon a cassette which is capable of accommodating a substrate to be treated;

a plating unit comprising a cathode ring having a cathode to be brought into contact with the substrate and rotatable together with the substrate kept in contact with the cathode, and a plating cup having an anode disposed therein and capable of containing a plating liquid which contains a plating accelerating additive, a plating retarding additive and chlorine as minor constituents thereof;

a cleaning unit for cleaning the substrate;

a substrate transport mechanism for transporting the substrate between the cassette placed on the cassette stage, the plating unit and the cleaning unit;

a post-treatment agent supplying section for supplying a post-treatment agent to the cleaning unit;

a minor constituent managing section comprising an analyzing section for quantitatively analyzing the plating accelerating additive, the plating retarding additive and chlorine in the plating liquid being used in the plating unit, and a minor constituent management controller for controlling the minor constituent managing section, the analyzing section comprising an analyzing cup capable of containing a part of the plating liquid to be analyzed, a plurality of reagent supply nozzles for supplying analytic liquid reagents into the analyzing cup, a reference electrode and a silver/silver chloride electrode for a titrimetric analysis, and a rotary electrode, a counter electrode and a reference electrode for a CVS analysis or a CPVS analysis;

an enclosure which houses therein a substrate treating section including the plating unit, the cleaning unit and the substrate transport mechanism; and a system controller for controlling the entire apparatus;

wherein the analyzing section comprises;

a reagent container which contains each of the analytic reagents;

a buffer cup adapted to be virtually sealed;

a liquid surface sensor connected to the minor constituent management controller for providing information on a liquid surface level in the buffer cup;

a first liquid transport pipe extending from the vicinity of a bottom of the reagent container to the buffer cup;

a second liquid transport pipe extending from the vicinity of a bottom of the buffer cup to the analyzing cup; and an air exhaustion mechanism for exhausting air from the buffer cup;

wherein the minor constituent management controller controls the air exhaustion mechanism to exhaust air from the buffer cup in response to a judgment made on the basis of an output signal of the liquid surface sensor that liquid is not present at a first level higher than an open end of the second liquid transport pipe in the buffer cup.

2. A plating apparatus as set forth in claim 1, further comprising a vertical mechanism for moving up and down the silver/silver chloride electrode between the inside and the outside of the analyzing cup.

3. A plating apparatus as set forth in claim 1, wherein the analyzing cup has a drain port provided in a bottom thereof, wherein the bottom of the analyzing cup is inclined downward toward the drain port.

4. A plating apparatus as set froth in claim 1, wherein at least one of the plural reagent supply nozzles has an opening having an open diameter of not greater than 1 mm.

5. A plating apparatus as set forth in claim 1, wherein the analyzing section further comprises a plurality of syringe pumps for supplying the plating liquid and the analytic reagents into the analyzing cup, wherein the syringe pumps are each controlled via a serial bus connected to the minor constituent management controller.

6. A plating apparatus as set forth in claim 1, wherein an audible alarm generator and a display are connected to the minor constituent management controller, wherein the liquid surface sensor comprises a lower limit sensor for detecting the presence or absence of the liquid at the first level in the buffer cup, and an upper limit sensor for detecting the presence or absence of the liquid at a second level higher than the first level in the buffer cup, wherein, if the liquid is not detected at the second level in the buffer cup by the upper limit sensor after air is exhausted from the buffer cup for a predetermined period by the air exhaustion mechanism, the minor constituent management controller controls the audible alarm generator to give an audible alarm, and controls the display to display a message that the reagent container is empty.

7. A plating apparatus as set forth in claim 1, wherein the minor constituent management controller comprises a storage device, wherein the minor constituent management controller is connected to a display and an input device which allows an operator to input information, wherein the minor constituent management controller is adapted to store concentration levels of the plating retarding additive, the plating accelerating additive and chlorine in the plating liquid analyzed by the analyzing section in relation to the date and time of the analysis in the storage device, and controls the display so that the concentration levels of the plating retarding additive, the plating accelerating additive and chlorine stored in the storage device are displayed on the display in a chronological order in response to a command inputted via the input device by the operator.

8. A plating apparatus as set forth in claim 1, wherein the minor constituent management controller is connected to a display, wherein the minor constituent management controller is adapted to display a graph indicative of a relationship of an amount of a reagent supplied dropwise into the analyzing cup for the titrimetric analysis versus a potential difference between the reference electrode and the silver/silver chloride electrode on the display.

9. A plating apparatus for plating a substrate, the apparatus comprising:

a cassette stage for receiving thereon a cassette which is capable of accommodating a substrate to be treated;

a plating unit comprising a cathode ring having a cathode to be brought into contact with the substrate and rotatable together with the substrate kept in contact with the cathode, and a plating cup having an anode disposed therein and capable of containing a plating liquid which contains a plating accelerating additive, a plating retarding additive and chlorine as minor constituents thereof;

a cleaning unit for cleaning the substrate;

a substrate transport mechanism for transporting the substrate between the cassette placed on the cassette stage, the plating unit and the cleaning unit;

a post-treatment agent supplying section for supplying a post-treatment agent to the cleaning unit;

a minor constituent managing section comprising an analyzing section for quantitatively analyzing the plating accelerating additive, the plating retarding additive and chlorine in the plating liquid being used in the plating unit, and a minor constituent management controller for controlling the minor constituent managing section, the analyzing section comprising an analyzing cup capable of containing a part of the plating liquid to be analyzed a plurality of reagent supply nozzles for supplying analytic liquid reagents into the analyzing cup, a reference electrode and a silver/silver chloride electrode for a titrimetric analysis, and a rotary electrode, a counter electrode and a reference electrode for a CVS analysis or a CPVS analysis;

an enclosure which houses therein a substrate treating section including the plating unit, the cleaning unit and the substrate transport mechanism; and a system controller for controlling the entire apparatus;

wherein the analyzing section comprises:

a sampling vessel provided in the vicinity of the analyzing cup and adapted to be virtually sealed;

a sampling pipe extending between the substrate treating section and the sampling vessel;

a plating liquid transport pipe extending between the sampling vessel and the analyzing cup; and an air exhaustion mechanism connected in communication with the sampling vessel for exhausting air from the sampling vessel.

10. A plating apparatus as set forth in claim 9, wherein the sampling pipe opens into an upper portion of the sampling vessel, wherein the minor constituent managing section further comprises an air supply mechanism for supplying air into the sampling vessel.

11. A plating apparatus as set forth in claim 9, further comprising a vertical mechanism for moving up and down the silver/silver chloride electrode between the inside and the outside of the analyzing cup.

12. A plating apparatus as set forth in claim 9, wherein the analyzing cup has a drain port provided in a bottom thereof, wherein the bottom of the analyzing cup is inclined downward toward the drain port.

13. A plating apparatus as set forth in claim 9, wherein at least one of the plural reagent supply nozzles has an opening having an open diameter of not greater than 1 mm.

14. A plating apparatus as set forth in claim 9, wherein the analyzing section further comprises a plurality of syringe pumps for supplying the plating liquid and the analytic reagents into the analyzing cup, wherein the syringe pumps are each controlled via a serial bus connected to the minor constituent management controller.

15. A plating apparatus as set forth in claim 9, wherein the minor constituent management controller comprises a storage device, wherein the minor constituent management controller is connected to a display and an input device which allows an operator to input information, wherein the minor constituent management controller is adapted to store concentration levels of the plating retarding additive, the plating accelerating additive and chlorine in the plating liquid analyzed by the analyzing section in relation to the date and time of the analysis in the storage device, and controls the display so that the concentration levels of the plating retarding additive, the plating accelerating additive and chlorine stored in the storage device are displayed on the display in a chronological order in response to a command inputted via the input device by the operator.

16. A plating apparatus as set forth in claim 9, wherein the minor constituent management controller is connected to a display, wherein the minor constituent management controller is adapted to display a graph indicative of a relationship of an amount of a reagent supplied dropwise into the analyzing cup for the titrimetric analysis versus a potential difference between the reference electrode and the silver/silver chloride electrode on the display.

17. A plating apparatus for plating a substrate, the apparatus comprising:

a cassette stage for receiving thereon a cassette which is capable of accommodating a substrate to be treated;

a plating unit comprising a cathode ring having a cathode to be brought into contact with the substrate and rotatable together with the substrate kept in contact with the cathode, and a plating cup having an anode disposed therein and capable of containing a plating liquid which contains a plating accelerating additive, a plating retarding additive and chlorine as minor constituents thereof;

a cleaning unit for cleaning the substrate;

a substrate transport mechanism for transporting the substrate between the cassette placed on the cassette stage, the plating unit and the cleaning unit;

a post-treatment agent supplying section for supplying a post-treatment agent to the cleaning unit;

a minor constituent managing section comprising an analyzing section for quantitatively analyzing the plating accelerating additive, the plating retarding additive and chlorine in the plating liquid being used in the plating unit, and a minor constituent management controller for controlling the minor constituent managing section, the analyzing section comprising an analyzing cup capable of containing a part of the plating liquid to be analyzed, a plurality of reagent supply nozzles for supplying analytic liquid reagents into the analyzing cup, a reference electrode and a silver/silver chloride electrode for a titrimetric analysis, and a rotary electrode, a counter electrode and a reference electrode for a CVS analysis or a CPVS analysis;

an enclosure which houses therein a substrate treating section including the plating unit, the cleaning unit and the substrate transport mechanism; and a system controller for controlling the entire apparatus;

wherein the minor constituent management controller and the system controller are connected to each other via a serial line, wherein the system controller is adapted to acquire information on the total amount of the plating liquid being used in the substrate treating section, wherein the minor constituent management controller is adapted to acquire the information on the total amount of the plating liquid from the system controller via the serial line, and further adapted to determine amounts of a replenishment liquid containing the plating retarding additive, a replenishment liquid containing the plating accelerating additive and a replenishment liquid containing chlorine to be added to the plating liquid on the basis of the information on the total amount of the plating liquid and the concentration levels of the plating retarding additive, the plating accelerating additive and chlorine determined through the analysis by the analyzing section, so that the concentrations of the plating retarding additive, the plating accelerating additive and chlorine in the plating liquid in the substrate treating section are adjusted to predetermined concentration levels; and wherein the minor constituent managing section further comprises a replenishment section comprising:

a preparation vessel adapted to be virtually sealed;

a replenishment pipe extending from the vicinity of a bottom of the preparation vessel to the substrate treating section;

a pressure increasing/reducing mechanism for increasing and reducing an internal pressure of the preparation vessel; and a replenishment liquid supply mechanism for supplying the plating accelerating additive replenishment liquid, the plating retarding additive replenishment liquid and the chlorine replenishment liquid into the preparation vessel in replenishment amounts determined by the minor constituent management controller.

18. A plating apparatus for plating a substrate, the apparatus comprising:

a cassette stage for receiving thereon a cassette which is capable of accommodating a substrate to be treated;

a plating unit comprising a cathode ring having a cathode to be brought into contact with the substrate and rotatable together with the substrate kept in contact with the cathode, and a plating cup having an anode disposed therein and capable of containing a plating liquid which contains a plating accelerating additive, a plating retarding additive and chlorine as minor constituents thereof;

a cleaning unit for cleaning the substrate;

a substrate transport mechanism for transporting the substrate between the cassette placed on the cassette stage, the plating unit and the cleaning unit;

a post-treatment agent supplying section for supplying a post-treatment agent to the cleaning unit;

a minor constituent managing section comprising an analyzing section for quantitatively analyzing the plating accelerating additive, the plating retarding additive and chlorine in the plating liquid being used in the plating unit, and a minor constituent management controller for controlling the minor constituent managing section, the analyzing section comprising an analyzing cup capable of containing a part of the plating liquid to be analyzed, a plurality of reagent supply nozzles for supplying analytic liquid reagents into the analyzing cup, a reference electrode and a silver/silver chloride electrode for a titrimetric analysis, and a rotary electrode, a counter electrode and a reference electrode for a CVS analysis or a CPVS analysis;

an enclosure which houses therein a substrate treating section including the plating unit, the cleaning unit and the substrate transport mechanism; and a system controller for controlling the entire apparatus;

wherein the minor constituent managing section is housed in a minor constituent managing section enclosure having an air outlet port, wherein an air outlet pipe for exhausting air from the minor constituent managing section enclosure is connectable to the air outlet port, wherein the minor constituent managing section further comprises an air exhaustion pressure sensor attached to the air outlet pipe for measuring an air exhaustion pressure.

19. A plating apparatus as set forth in claim 18, further comprising a vertical mechanism for moving up and down the silver/silver chloride electrode between the inside and the outside of the analyzing cup.

20. A plating apparatus as set forth in claim 18, wherein the analyzing cup has a drain port provided in a bottom thereof, wherein the bottom of the analyzing cup is inclined downward toward the drain port.

21. A plating apparatus as set forth in claim 18, wherein at least one of the plural reagent supply nozzles has an opening having an open diameter of not greater than 1 mm.

22. A plating apparatus as set forth in claim 18, wherein the analyzing section further comprises a plurality of syringe pumps for supplying the plating liquid and the analytic reagents into the analyzing cup, wherein the syringe pumps are each controlled via a serial bus connected to the minor constituent management controller.

23. A plating apparatus for performing a plating process on a surface of a generally round semiconductor wafer having a plurality of fine holes or grooves formed in the surface thereof and a barrier layer and a seed layer sequentially provided on the surface as covering the holes or grooves, the apparatus comprising:

a cassette stage for receiving thereon a cassette which is capable of accommodating a semiconductor wafer to be treated;

a plating unit comprising a cathode ring having a cathode to be brought into contact with the semiconductor wafer and rotatable together with the semiconductor wafer kept in contact with the cathode, and a plating cup having an anode disposed therein and capable of containing a plating liquid which comprises sulfuric acid as a supporting electrolyte, copper sulfate as a metal salt containing a target metal, and a plating accelerating additive, a plating retarding additive and chlorine as minor constituents thereof;

a cleaning unit comprising a cup for cleaning the semiconductor wafer therein, the cup having a drain port, a wafer holding mechanism provided in the cup for holding the semiconductor wafer, a wafer rotating mechanism for rotating the semiconductor wafer held by the wafer holding mechanism, and a deionized water supply nozzle for supplying deionized water to opposite sides of the semiconductor wafer held by the wafer holding mechanism, the cleaning unit being connected to an air exhaustion mechanism for exhausting air from the cup;

a wafer transport mechanism for transporting the semiconductor wafer, the wafer transport mechanism comprising an extendible arm for holding the semiconductor wafer generally horizontally, a vertical movement mechanism for moving up and down the arm, and a horizontal rotation mechanism for rotating the semiconductor wafer held by the arm within a generally horizontal plane;

a post-treatment agent supplying section comprising a post-treatment agent tank which contains a post-treatment agent to be used in the cleaning unit, and a tank enclosure which houses the post-treatment agent tank therein;

a minor constituent managing section comprising an analyzing section for quantitatively analyzing the plating liquid being used in the plating unit, a minor constituent managing section enclosure which houses the analyzing section, and a minor constituent management controller for controlling the entire minor constituent managing section;

an enclosure which houses a wafer treating section including the plating unit, the cleaning unit and the wafer transport mechanism therein, the enclosure comprising a barrier wall for isolating the inside thereof from an external environment, a frame which supports the wafer treating section, and a filter provided in an upper portion thereof, the enclosure having a loading/unloading port for loading and unloading the semiconductor wafer or the cassette capable of accommodating the semiconductor wafer, a deionized water pipe introduction port through which a deionized water pipe is introduced, a compressed air pipe introduction port through which a compressed air pipe is introduced, an air outlet opening provided in a bottom of the enclosure for exhausting air from the enclosure, and an air outlet pipe connection port to which an air outlet pipe is connected for exhausting air from the enclosure; and a system controller for controlling the entire plating apparatus, the system controller comprising a plurality of printed circuit boards, a central processing unit, a storage device having a semiconductor memory and a magnetic memory and storing therein a plating apparatus control program at least partly described in a high-level language, and a serial port, the system controller being connected to a keyboard having alphanumeric keys and to a display;

wherein the minor constituent management controller of the minor constituent managing section comprises a plurality of printed circuit boards, a central processing unit, a semiconductor memory storing therein a minor constituent analyzing program at least partly described in a high-level language for analyzing the minor constituents of the plating liquid, and a serial port, and is connected to a keyboard having alphanumeric keys and to a display;

wherein the analyzing section comprises an analyzing cup for containing a part of the plating liquid to be analyzed, a plurality of reagent containers which respectively contain analytic reagents, a plurality of syringe pumps for quantitatively dispensing the reagents from the respective reagent containers, a plurality of reagent supply nozzles for supplying the regents quantitatively dispensed by the respective syringe pumps into the analyzing cup, a reference electrode and a counter electrode adapted to be located in the analyzing cup, a rotary electrode of platinum supported at a distal end of an insulative support rod rotatable about an axis thereof and adapted to be located in the analyzing cup, and a potentiostat for controlling an electric current flowing between the counter electrode and the rotary electrode so that a voltage between the reference electrode and the rotary electrode is equalized with a sweep voltage specified by the minor constituent management controller;

wherein the minor constituent managing section enclosure has an air outlet port to which an air outlet pipe is attached for exhausting air from the minor constituent managing section enclosure, and a vat for receiving the reagents being used in the minor constituent managing section is provided in the minor constituent managing section enclosure.

\* \* \* \* \*